US008576629B2

(12) United States Patent
Choe et al.

(10) Patent No.: US 8,576,629 B2
(45) Date of Patent: Nov. 5, 2013

(54) OPERATING METHOD OF NONVOLATILE MEMORY DEVICE

(75) Inventors: Byeong-In Choe, Yongin-si (KR); Sunil Shim, Seoul (KR); Woonkyung Lee, Seongnam-si (KR); Jaehoon Jang, Seongnam-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 159 days.

(21) Appl. No.: 13/315,523

(22) Filed: Dec. 9, 2011

(65) Prior Publication Data

US 2012/0195125 A1 Aug. 2, 2012

(30) Foreign Application Priority Data

Jan. 31, 2011 (KR) ........................ 10-2011-0009659

(51) Int. Cl.
*G11C 11/34* (2006.01)

(52) U.S. Cl.
USPC ............ 365/185.18; 365/185.14; 365/185.15; 365/195

(58) Field of Classification Search
USPC ................... 365/185.18, 185.14, 185.15, 195
See application file for complete search history.

(56) References Cited

U.S. PATENT DOCUMENTS

| | | | | |
|---|---|---|---|---|
| 7,499,325 | B2 * | 3/2009 | Doyle et al. | 365/185.14 |
| 7,539,066 | B2 * | 5/2009 | Aritome | 365/185.29 |
| 7,633,803 | B2 * | 12/2009 | Lee | 365/185.19 |
| 7,843,733 | B2 * | 11/2010 | Kim et al. | 365/185.11 |
| 2009/0027967 | A1 | 1/2009 | Lee | |
| 2010/0172182 | A1 | 7/2010 | Seol et al. | |
| 2010/0214838 | A1 | 8/2010 | Hishida et al. | |

FOREIGN PATENT DOCUMENTS

| | | |
|---|---|---|
| JP | 2009-026447 | 2/2009 |
| JP | 2010-199235 | 9/2010 |
| KR | 1020060120889 | 11/2006 |
| KR | 1020090010481 | 1/2009 |
| KR | 1020100081559 | 7/2010 |
| KR | 1020100097044 | 9/2010 |

* cited by examiner

*Primary Examiner* — Son Dinh
(74) *Attorney, Agent, or Firm* — F. Chau & Associates, LLC

(57) ABSTRACT

Disclosed is an operating method of a nonvolatile memory device, which includes programming the first selection transistors of the plurality of cell strings and programming the plurality of memory cells of the plurality of cell strings. The programming the first selection transistors comprises supplying a first voltage to a first bit line connected with a first selection transistor to be programmed and a different second voltage to a second bit line connected to a first selection transistor to be program inhibited; turning on the second selection transistors of the plurality of cell strings, and supplying a first program voltage to a selected first selection line among a plurality of first selection lines connected with the first selection transistors and a third voltage to an unselected first selection line among the plurality of first selection lines.

20 Claims, 54 Drawing Sheets

| | |
|---|---|
| Selected BL (BL1) | VSS |
| Unselected BL (BL2) | VBL1 |
| Selected SSL (SSL1) | Vpgm1 |
| Unselected SSL (SSL2) | VSS |
| WL | Voff1 |
| GSL | Voff2 |
| CSL | Float |

| | CS11 | CS12 | CS21 | CS22 |
|---|---|---|---|---|
| BL | VSS | VBL1 | VSS | VBL1 |
| SSL | Vpgm1 | | VSS | |
| SST Channel | VSS | VBL1 | Off | |
| Tunneling | Yes | No | | |

Fig. 12

| | |
|---|---|
| Selected BL (BL1) | VSS |
| Unselected BL (BL2) | VBL2 |
| Selected SSL (SSL1) | Von1 |
| Unselected SSL (SSL2) | Voff3 |
| WL | Von2 |
| GSL | Vpgm2 |
| CSL | Float |

Fig. 14

| | CS11 | CS12 | CS21 | CS22 |
|---|---|---|---|---|
| BL | VSS | VBL2 | VSS | VBL2 |
| SSL | On | | Off | |
| MC Channel | VSS | VBL2 | VF1 | VF2 |
| GSL | Vpgm2 | | | |
| GST Channel | VSS | VBL2 | VF1 | VF2 |
| Tunneling | Yes | No | | |

Fig. 16

| | |
|---|---|
| Selected BL (BL1) | VSS |
| Unselected BL (BL2) | VBL3 |
| Selected SSL (SSL1) | Von3 |
| Unselected SSL (SSL2) | Von3 |
| WL | Von4 |
| Selected GSL (GSL1) | Vpgm3 |
| Unselected GSL (GSL2) | VSS |
| CSL | Float |

Fig. 18

| | CS11 | CS12 | CS21 | CS22 |
|---|---|---|---|---|
| BL | VSS | VBL3 | VSS | VBL2 |
| SSL | On | | | |
| MC Channel | VSS | VBL3 | VSS | VBL3 |
| GSL | Vpgm3 | | VSS | |
| GST Channel | VSS | VBL3 | Off | |
| Tunneling | Yes | No | | |

Fig. 21

| | |
|---|---|
| Selected BL (BL1) | VSS |
| Unselected BL (BL2) | VBL4 |
| Selected SSL (SSL1) | Voff4 → Vpgm4 |
| Unselected SSL (SSL2) | VSS |
| WL | Von5 |
| GSL | Voff5 |
| CSL | Float |

| | CS11 | CS12 | CS21 | CS22 |
|---|---|---|---|---|
| BL | VSS | VBL4 | VSS | VBL4 |
| SSL | Voff4→Vpgm4 | | VSS | |
| MC Channel | VF3 | | | |
| HCI | Yes | No | | |

Fig. 24

| | |
|---|---|
| Selected BL (BL1) | Float |
| Unselected BL (BL2) | VSS |
| Selected SSL (SSL1) | Von6 |
| Unselected SSL (SSL2) | Voff6 |
| WL | Von7 |
| Selected GSL (GSL1) | Voff7→Vpgm5 |
| Unselected GSL (GSL2) | VSS |
| CSL | VSS |

Fig. 26

| | CS11 | CS12 | CS21 | CS22 |
|---|---|---|---|---|
| BL | Float | VSS | Float | VSS |
| SSL | Von6 | | Voff6 | |
| MC Channel | VF4 | VSS | VF5 | |
| GSL | Voff7→Vpgm5 | | VSS | |
| CSL | VSS | | | |
| HCI | Yes | No | | |

Fig. 27

| | |
|---|---|
| BL | VCC |
| Selected SSL (SSL1) | Vvfy1 |
| Unselected SSL (SSL2) | Voff8 |
| WL | Von8 |
| GSL | Von8 |
| CSL | VSS |

Fig. 29

| | |
|---|---|
| BL | VCC |
| Selected SSL (SSL1) | Von9 |
| Unselected SSL (SSL2) | Voff9 |
| WL/DWL | Von9 |
| GSL | Vvfy2 |
| CSL | VSS |

OPERATING METHOD OF NONVOLATILE MEMORY DEVICE

CROSS-REFERENCE TO RELATED APPLICATIONS

This application claims the benefits, under 35 U.S.C §119, of Korean Patent Application No. 10-2011-0009659 filed Jan. 31, 2011, the entirety of which is incorporated by reference herein.

BACKGROUND

Exemplary embodiments relate to semiconductor memory devices, and more particularly, relate to an operating method of a nonvolatile memory device.

A semiconductor memory device is a memory device which is fabricated using semiconductors, such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include static RAMs (SRAMs), dynamic RAMs (DRAMs), synchronous DRAMs (SDRAMs), and the like. The nonvolatile memory devices may retain stored contents even when power is lost. The nonvolatile memory devices include read only memories (ROMs), programmable ROMs (PROMs), electrically programmable ROMs (EPROMs), electrically erasable and programmable ROMs (EEPROMs), flash memory devices, phase-change RAMs (PRAMs), magnetic RAMs (MRAMs), resistive RAMs (RRAMs), ferroelectric RAMs (FRAMs), and the like. The flash memory devices include NOR types and NAND types.

Semiconductor memory devices with a three-dimensional array structure provide an increased degree of integration.

SUMMARY

An embodiment of the inventive concept provides an operating method of a nonvolatile memory device which includes a plurality of cell strings, each cell string including a first selection transistor, a plurality of memory cells, and a second selection transistor stacked in a direction perpendicular to a substrate, the operating method comprising programming the first selection transistors of the plurality of cell strings, and programming the plurality of memory cells of the plurality of cell strings, wherein programming the first selection transistors comprises supplying a first voltage to a first bit line connected with a first selection transistor to be programmed and a second voltage to a second bit line connected to a different first selection transistor to be program inhibited, turning on the second selection transistors of the plurality of cell strings, and supplying a first program voltage to a selected first selection line among a plurality of first selection lines connected with the first selection transistors and a third voltage to an unselected first selection line among the plurality of first selection lines.

According to an embodiment, the first and third voltages each are a ground voltage and the first program voltage is a high voltage.

According to an embodiment, the second voltage is a power supply voltage or a variable voltage lower than about 5V.

According to an embodiment, the first program voltage is higher than the second voltage and a difference between the first program voltage and the second voltage is below about 12V.

According to an embodiment, at least one of the first selection transistors causes Fowler-Nordheim tunneling according to the first program voltage and the first voltage.

According to an embodiment, programming the first selection transistors further comprises turning off the plurality of memory cells of the plurality of cell strings.

According to an embodiment, programming the second selection transistors is performed before the programming the plurality of memory cells of the plurality of cell strings, and programming the second selection transistors comprises supplying a fourth voltage to a first bit line connected with a second selection transistor to be programmed and a fifth voltage to a second bit line connected with a different second selection transistor to be program inhibited, supplying a turn-on voltage to a selected first selection line among the plurality of first selection lines and a turn-off voltage to an unselected first selection line among the plurality of first selection lines, turning on the plurality of memory cells of the plurality of cell strings, and supplying a second program voltage to a second selection line connected in common with the second selection transistors.

According to an embodiment, the fourth voltage is a ground voltage, the fifth voltage is a power supply voltage, and the second program voltage is a high voltage.

According to an embodiment, at least one of the second selection transistors causes Fowler-Nordheim tunneling according to the second program voltage and the fourth voltage.

According to an embodiment, programming the second selection transistors is performed before programming the plurality of memory cells of the plurality of cell strings, and the programming the second selection transistors comprises supplying a sixth voltage to a first bit line connected with a second selection transistor to be programmed and a seventh voltage to a second bit line connected with a different second selection transistor to be program inhibited, supplying a turn-on voltage to the plurality of first selection lines, turning on the plurality of memory cells of the plurality of cell strings, and supplying a third program voltage to a selected second selection line among a plurality of second selection lines connected with the second selection transistors and an eighth voltage to an unselected second selection line among the second selection lines.

According to an embodiment, the sixth and eighth voltages each are a ground voltage, the seventh voltage is a power supply voltage, and the third program voltage is a high voltage.

According to an embodiment, programming the second selection transistors is performed before programming the plurality of memory cells of the plurality of cell strings, and wherein programming the second selection transistors comprises floating a first bit line connected with a second selection transistor to be programmed and a ninth voltage to a second bit line connected with a different second selection transistor to be program inhibited, supplying a turn-on voltage to a selected first selection line among the plurality of first selection lines and a turn-off voltage to an unselected first selection line among the plurality of first selection lines, supplying a turn-on voltage to a plurality of word lines connected with the plurality of memory cells of the plurality of cell strings, supplying a tenth voltage to a common source line connected with the plurality of cell strings via the second selection transistors, and supplying a fourth program voltage to a selected second selection line among the second selection lines connected with the second selection transistors and an eleventh voltage to an unselected second selection line among the second selection lines.

According to an embodiment, the ninth, tenth, and eleventh voltages each are a ground voltage, and the fourth program voltage is a high voltage.

According to an embodiment, a second selection transistor, which corresponds to the selected second selection line and the selected bit line, is progammed by hot carrier injection.

According to an embodiment, the fourth program voltage is supplied to the selected second selection line when voltages of the plurality of word lines and the plurality of bit lines reach respective target voltages.

An embodiment of the inventive concept is directed to provide an operating method of a nonvolatile memory device which includes a plurality of cell strings, each cell string including a first selection transistor, a plurality of memory cells, and a second selection transistor stacked in a direction perpendicular to a substrate. The operating method comprises programming the first selection transistors of the plurality of cell strings, and programming the plurality of memory cells of the plurality of cell strings, wherein programming the first selection transistors comprises supplying a first voltage to a first bit line connected with a first selection transistor to be programmed and a second voltage to a second bit line connected to a different first selection transistor to be program inhibited, turning off the second selection transistors of the plurality of cell strings, supplying a turn-on voltage to a plurality of word lines connected with a plurality of memory cells of the plurality of cell strings, and supplying a program voltage to a selected first selection line among a plurality of first selection lines connected with the first selection lines and a third voltage to an unselected first selection line among the plurality of first selection lines. The program voltage is supplied to the selected first selection line after a turn-off voltage is supplied to the selected one of the plurality of first selection lines connected with the first selection lines.

According to an embodiment, the first and second voltages each are a ground voltage, and the second voltage is a power supply voltage or a variable voltage lower than about 5V.

According to an embodiment, the program voltage is supplied to the selected first selection line when voltages of the plurality of word lines and the plurality of bit lines reach respective target voltages.

According to an embodiment, a first selection transistor corresponding to the selected first selection line and the selected bit line is programmed by hot carrier injection.

According to an embodiment, the operating method further comprises programming the second selection transistors before programming a plurality of memory cells of the plurality of cell strings, and the plurality of second selection transistors is programmed by the Fowler-Nordheim Tunneling or the Hot Carrier Injection.

An embodiment of the inventive concept provides a method of programming a nonvolatile memory device which includes a plurality of cell strings, each cell string including a first selection transistor, a plurality of memory cells, and a second selection transistor, the method comprising programming the first selection transistors of the plurality of cell strings, programming the second selection transistors of the plurality of cell strings, and programming the plurality of memory cells of the plurality of cell strings, wherein the operating method is performed in an order of programming the first selection transistors, programming the second selection transistors, and programming the plurality of memory cells, wherein programming the first selection transistors comprises supplying a first voltage to a first bit line connected with a first selection transistor to be programmed and a second voltage to a second bit line connected to a different first selection transistor, supplying a turn-off voltage to the second selection transistors of the plurality of cell strings, and supplying a turn-on voltage to a plurality of word lines connected with the plurality of memory cells of the plurality of cell strings, sequentially supplying a turn-off voltage and a program voltage to a selected first selection line among a plurality of first selection lines connected with the first selection transistors, and supplying a third voltage to an unselected first selection line among the plurality of first selection lines.

According to an embodiment, the first voltage is a voltage that causes Fowler-Nordheim tunneling when in combination with the program voltage.

According to an embodiment, the third voltage is a voltage that does not cause Fowler-Nordheim when in combination with the second voltage.

BRIEF DESCRIPTION OF THE FIGURES

The embodiments will become apparent from the following description with reference to the following figures, wherein

FIG. 12 is a table illustrating voltage conditions for programming of ground selection transistors according to an exemplary embodiment of the inventive concept.

FIG. 14 is a table illustrating programming conditions for ground selection transistors of the equivalent circuit in FIG. 13.

FIG. 16 is a table illustrating voltage conditions for programming of ground selection transistors according to an exemplary embodiment of the inventive concept.

FIG. 18 is a table illustrating programming conditions for ground selection transistors of the equivalent circuit in FIG. 17.

FIG. 21 is a table illustrating voltage conditions for programming of string selection transistors according to an exemplary embodiment of the inventive concept.

FIG. 24 is a table illustrating voltage conditions for programming of ground selection transistors according to an exemplary embodiment of the inventive concept.

FIG. 26 is a table illustrating programming conditions for ground selection transistors of the equivalent circuit in FIG. 25.

FIG. 27 is a table illustrating voltage conditions for a verification operation of string selection transistors.

FIG. 29 is a table illustrating voltage conditions for a verification operation of ground selection transistors.

DETAILED DESCRIPTION

Figure 1:
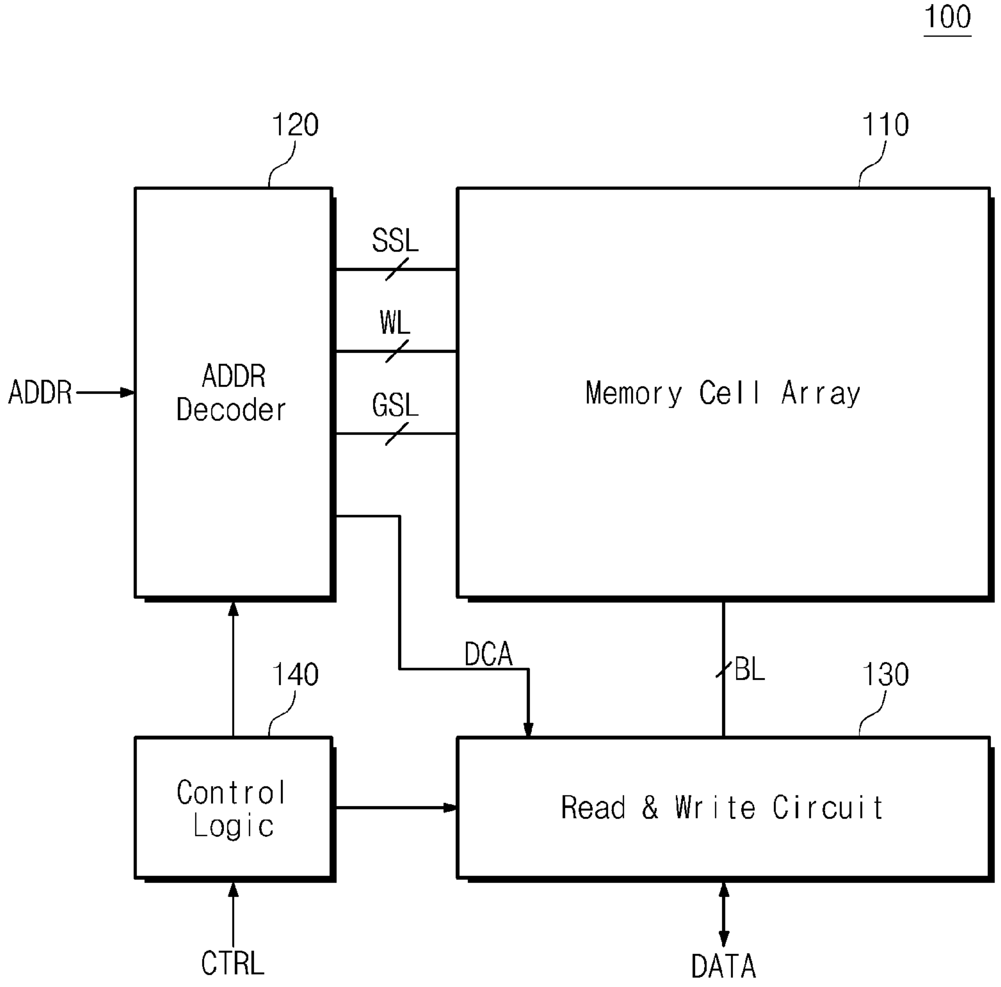
FIG. 1 is a block diagram illustrating a nonvolatile memory device according to an exemplary embodiment of the inventive concept.

The inventive concept is described more fully hereinafter with reference to the accompanying drawings, in which embodiments of the inventive concept are shown. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers may refer to like or similar elements throughout the drawings and the specification.

It will be understood that when an element or layer is referred to as being "on", "connected to", "coupled to", or "adjacent to" another element or layer, it can be directly on, connected, coupled, or adjacent to the other element or layer, or intervening elements or layers may be present.

The term "selected bit line" or "selected bit lines" may be used to indicate a bit line or bit lines, connected with a cell transistor to be programmed or read, among a plurality of bit lines. The term "unselected bit line" or "unselected bit lines"

may be used to indicate a bit line or bit lines, connected with a cell transistor to be program-inhibited or read-inhibited, among a plurality of bit lines.

The term "selected string selection line" may be used to indicate a string selection line connected with a cell string, which includes a cell transistor to be programmed or read, among a plurality of string selection lines. The term "unselected string selection line" or "unselected string selection lines" may be used to indicate a remaining string selection line or remaining string selection lines other than the selected string selection line among a plurality of string selection lines. The term "selected string selection transistors" may be used to indicate string selection transistors connected with a selected string selection line. The term "unselected string selection transistors" may be used to indicate string selection transistors connected with an unselected string selection line or unselected string selection lines.

The term "selected ground selection line" may be used to indicate a ground selection line connected with a cell string, which includes a cell transistor to be programmed or read, among a plurality of ground selection lines. The term "unselected ground selection line" may be used to indicate a remaining ground selection line or remaining ground selection lines other than the selected ground selection line among a plurality of ground selection lines. The term "selected ground selection transistors" may be used to indicate ground selection transistors connected with a selected ground selection line. The term "unselected ground selection transistors" may be used to indicate ground selection transistors connected with an unselected ground selection line or unselected ground selection lines.

The term "unselected word line" may be used to indicate a word line, connected with a cell transistor to be programmed or read, among a plurality of word lines. The term "unselected word line" or "unselected word lines" may be used to indicate a remaining word lines or remaining word lines other than a selected word line among a plurality of word lines.

The term "selected memory cell" or "selected memory cells" may be used to designate memory cells to be programmed or read among a plurality of memory cells. The term "unselected memory cell" or "unselected memory cells" may be used to indicate a remaining memory cell or remaining memory cells other than a selected memory cell or selected memory cells among a plurality of memory cells.

FIG. 1 is a block diagram illustrating a nonvolatile memory device according to an exemplary embodiment of the inventive concept. Referring to FIG. 1, a nonvolatile memory device 100 may include a memory cell array 110, an address decoder 120, a read/write circuit 130, and a control logic 140.

The memory cell array 110 may include a plurality of memory cell groups. For example, the memory cell array 110 may include a plurality of cell strings which are arranged on a substrate along row and column directions. Each cell string may include a plurality of memory cells stacked along a direction perpendicular to the substrate. The memory cells may be provided on the substrate along rows and columns and may be stacked in a direction perpendicular to the substrate to form a three-dimensional structure. According to an embodiment, each memory cell of the memory cell array 110 may store one or more bits of data.

The address decoder 120 may be coupled with the memory cell array 110 via word lines WL, string selection lines SSL, and ground selection lines GSL. The address decoder 120 may be configured to operate responsive to the control of the control logic 140. The address decoder 120 may receive an address ADDR from an external device.

The address decoder 120 may be configured to decode a row address of the input address ADDR. The address decoder 120 may be configured to select a word line corresponding to a decoded row address of the word lines WL. The address decoder 120 may be configured to select a string selection line SSL and a ground selection line GSL corresponding to the decoded row address of the string selection lines SSL and the ground selection lines GSL.

The address decoder 120 may be configured to decode a column address of the input address ADDR. The address decoder 120 may provide the decoded column address DCA to the read/write circuit 130.

According to an embodiment, the address decoder 120 may include a row decoder configured to decode a row address, a column decoder configured to decode a column address, and an address buffer storing the input address ADDR.

The read/write circuit 130 may be coupled with the memory cell array 110 via bit lines BL. The read/write circuit 130 may be configured to exchange data with an external device. The read/write circuit 130 may operate responsive to the control of the control logic 140. The read/write circuit 130 may select bit lines BL in response to the decoded column address DCA provided from the address decoder 120.

According to an embodiment, the read/write circuit 130 may receive data from an external device and may write the received data in the memory cell array 110. The read/write circuit 130 may read data from the memory cell array 110 and may output read data to the external device. The read/write circuit 130 may read data from a first storage area of the memory cell array 110 and may write the read data in a second storage area of the memory cell array 110. For example, the read/write circuit 130 may perform a copy-back operation.

According to an embodiment, the read/write circuit 130 may include a page buffer (or, a page register), a column selecting circuit, a data buffer, and the like. According to an exemplary embodiment, the read/write circuit 130 may include a sense amplifier, a write driver, a column selecting circuit, a data buffer, and the like.

The control logic 140 may be coupled with the address decoder 120 and the read/write circuit 130. The control logic 140 may be configured to control an overall operation of the nonvolatile memory device 100.

Figure 2:
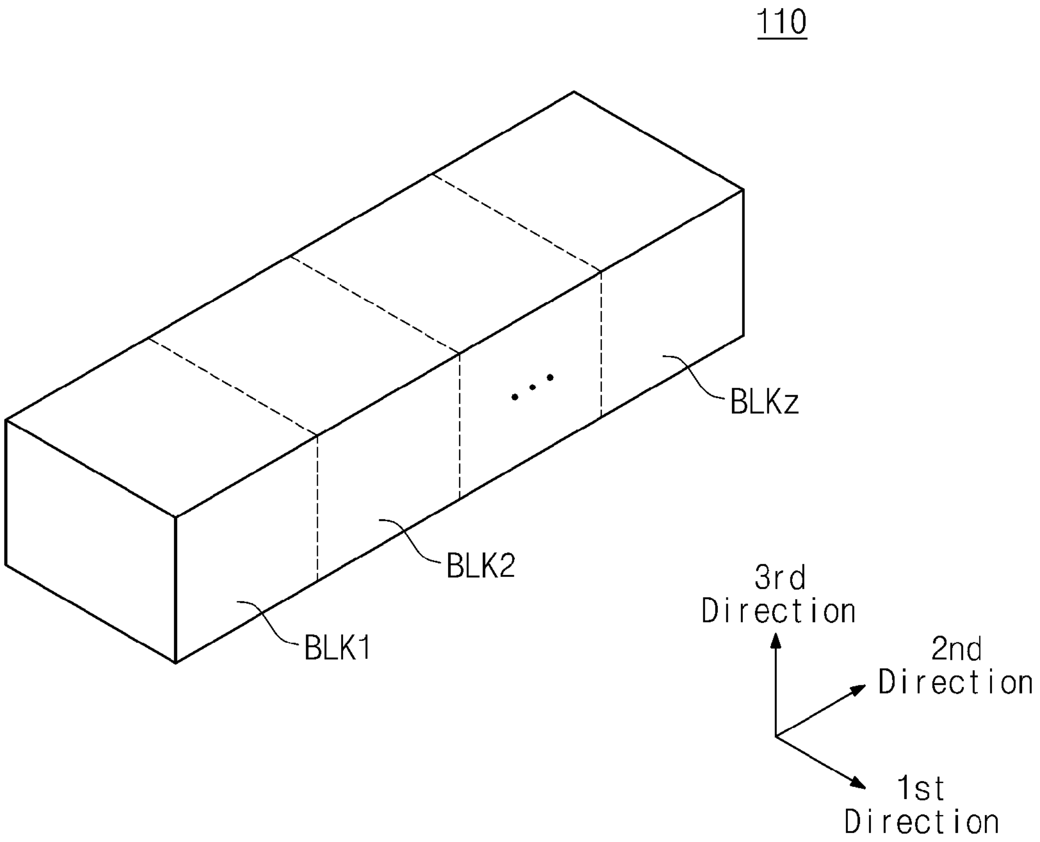
FIG. 2 is a diagram illustrating a memory cell array in FIG. 1 according to an exemplary embodiment of the inventive concept.

FIG. 2 is a diagram illustrating a memory cell array in FIG. 1 according to an exemplary embodiment of the inventive concept. Referring to FIGS. 1 and 2, a memory cell array 110 may include a plurality of memory blocks BLK1 to BLKz, each of which is formed to have a three-dimensional structure (or, a vertical structure). For example, each of the memory blocks BLK1 to BLKz may include structures extending along the first to third directions. Although not shown in FIG. 2, each of the memory blocks BLK1 to BLKz may include a plurality of cell strings extending along the second direction. Although not shown in FIG. 2, a plurality of cell strings may be spaced apart from one another along the first and third directions.

Cell strings within one memory block may be coupled with a plurality of bit lines BL, a plurality of string selection lines SSL, a plurality of word lines WL, a ground selection line GSL, and a common source line (not shown). Cell strings in the plurality of memory blocks BLK1 to BLKz may share a plurality of bit lines. For example, the plurality of bit lines may extend along the second direction to be shared by the plurality of memory blocks BLK1 to BLKz.

The plurality of memory blocks BLK1 to BLKz may be selected by the address decoder 120 in FIG. 1. For example, the address decoder 120 may be configured to select a memory block corresponding to an input address ADDR among the plurality of memory blocks BLK1 to BLKz. Erasing, programming, and reading may be performed at a selected memory block. The plurality of memory blocks BLK1 to BLKz will be more fully described below with reference to FIGS. 3 to 6.

Figure 3:
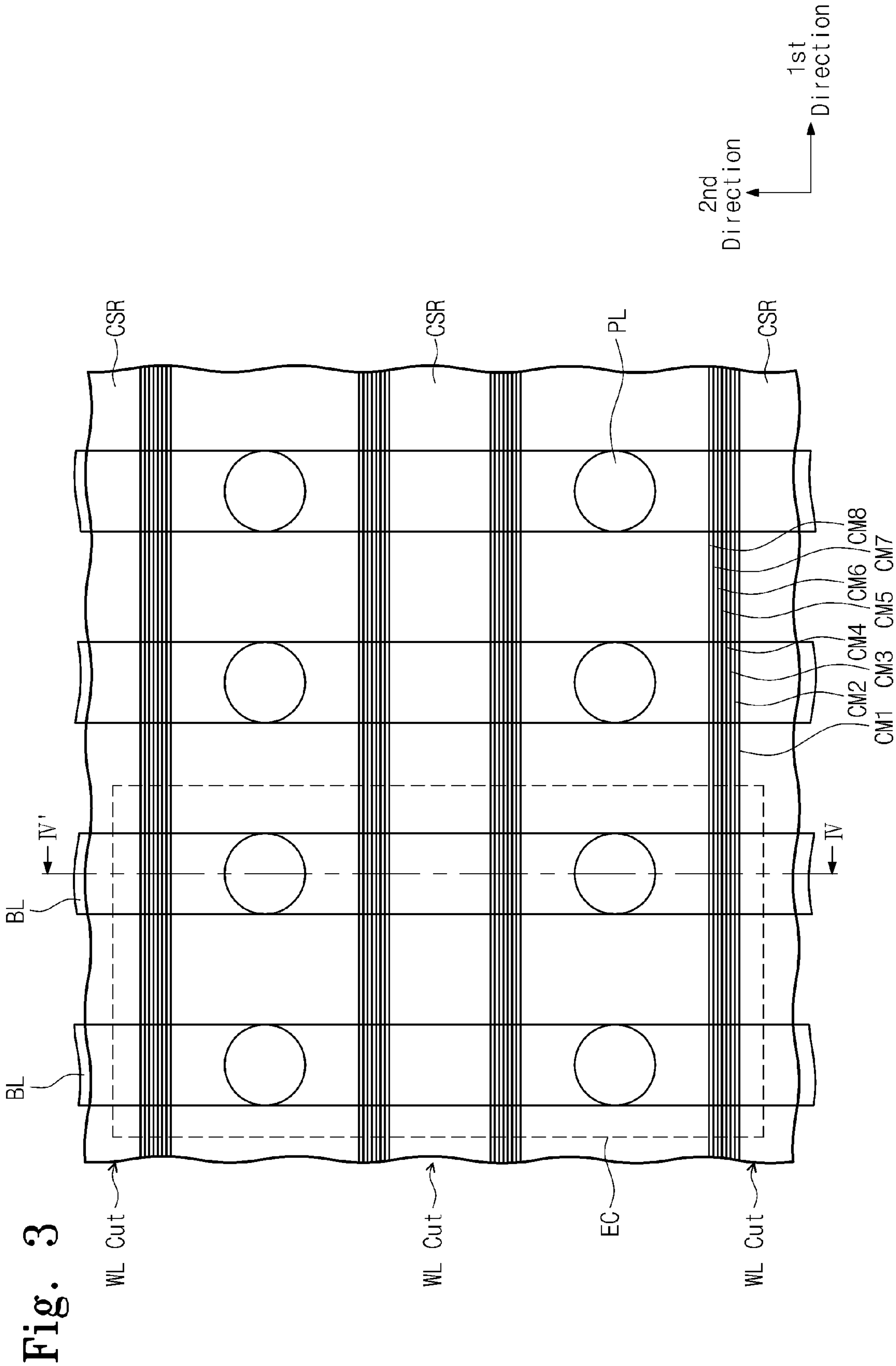
FIG. 3 is a plan diagram of one of the memory blocks in FIG. 2 according to an exemplary embodiment of the inventive concept.
Figure 4:
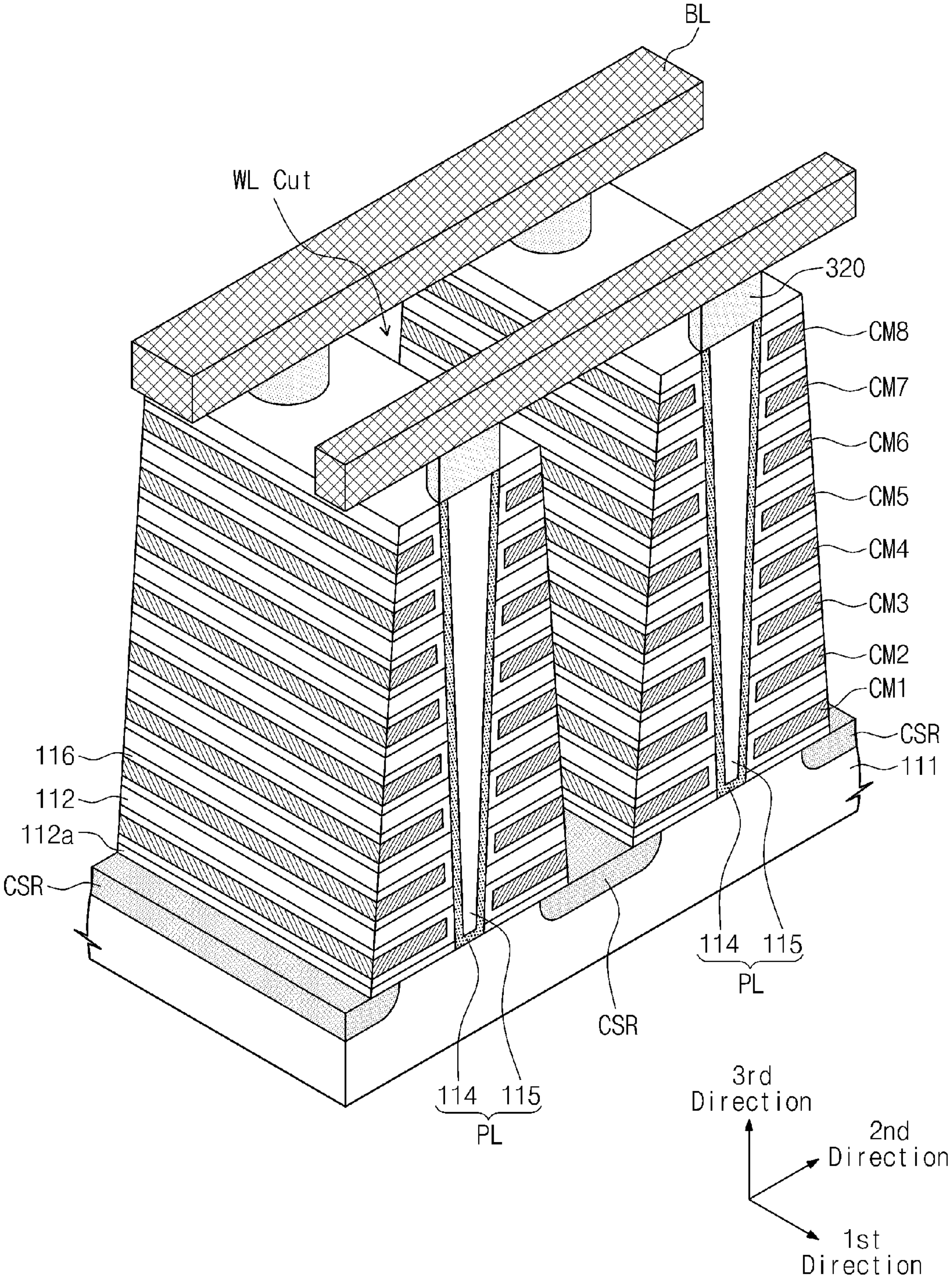
FIG. 4 is a perspective view taken along a line IV-IV' in FIG. 3 according to an exemplary embodiment of the inventive concept.
Figure 5:
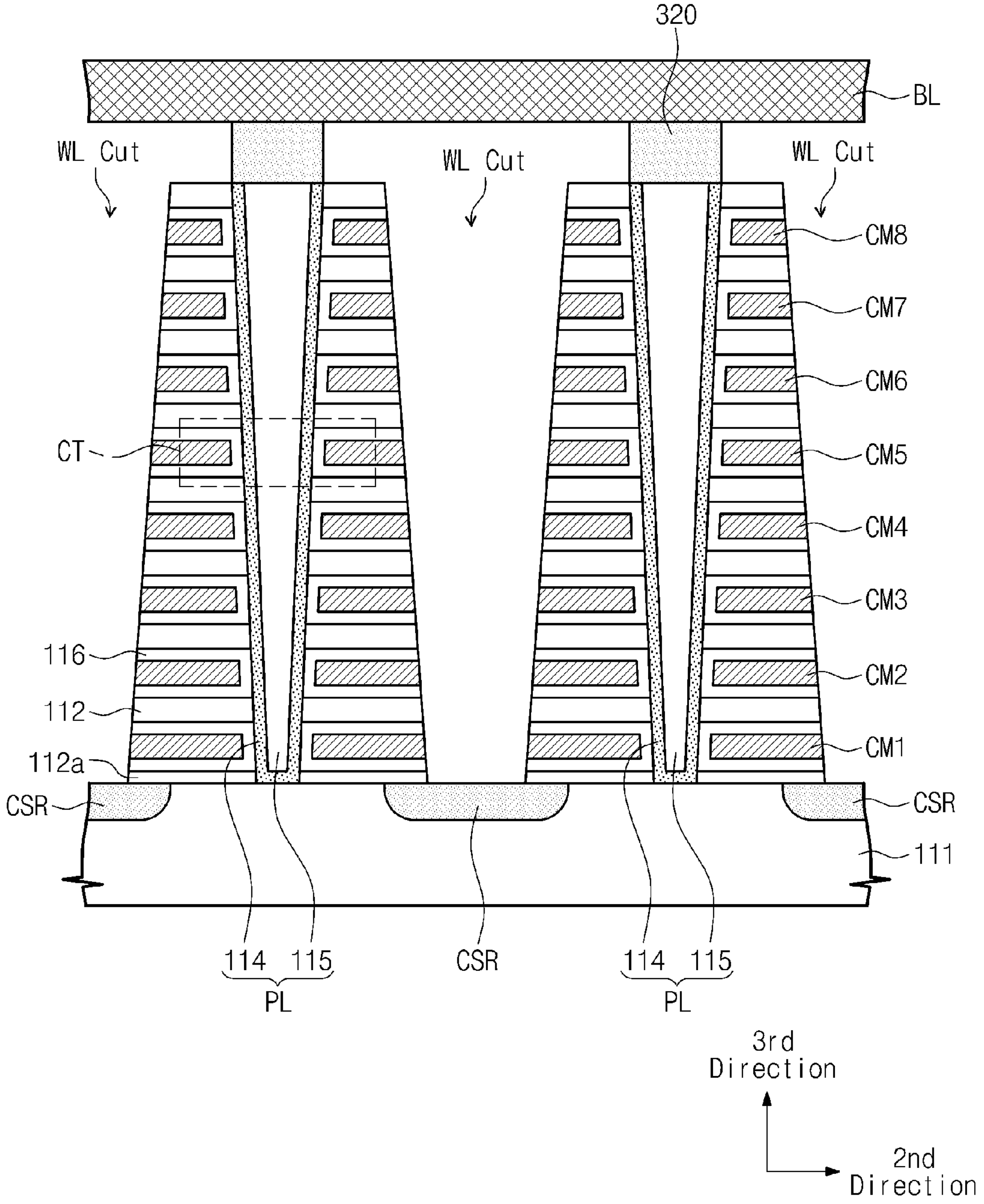
FIG. 5 is a cross-sectional view taken along the line IV-IV' in FIG. 3 according to an exemplary embodiment of the inventive concept.

FIG. 3 is a plan diagram of one of the memory blocks in FIG. 2 according to an exemplary embodiment of the inventive concept. FIG. 4 is a perspective view taken along a line IV-IV' in FIG. 3 according to an exemplary embodiment of the inventive concept. FIG. 5 is a cross-sectional view taken along the line IV-IV' in FIG. 3 according to an exemplary embodiment of the inventive concept.

Referring to FIGS. 3 to 5, three-dimensional structures extending along the first to third directions may be provided.

A substrate 111 is provided. For example, the substrate 111 may be a well having a first conductivity type. The substrate 111 may be a p-well in which a Group III element, such as boron, is injected. The substrate 111 may be a pocket p-well which is provided within an n-well. For purposes of illustration, the substrate 111 is a p-well (or, a pocket p-well). However, the substrate 111 is not limited to the p-type.

A plurality of common source regions CSR extending along the first direction may be provided in the substrate 111. The common source regions CSR may be spaced apart from one another along the second direction. The common source regions CSR may be connected in common with one another to form a common source line.

The common source regions CSR may have a second conductivity type different from a conductivity type of the substrate 111. For example, the common source regions CSR may be of an n-type. For purposes of illustration, the common source regions CSR are of the n-type. However, the common source regions CSR are not limited to the n-type.

Between two adjacent regions of the common source regions CSR are sequentially provided a plurality of insulation materials 112 and 112*a* on the substrate 111 along the third direction (i.e., a direction perpendicular to the substrate 111). The insulation materials 112 and 112*a* may be spaced apart along the third direction. The insulation materials 112 and 112*a* may extend along the first direction. For example, the insulation materials 112 and 112*a* may include an insulation material, such as a semiconductor oxide film. A thickness of the insulation material 112*a* contacting the substrate 111 may be less than thicknesses of other insulation materials 112.

Between two adjacent regions of the common source regions CSR are sequentially arranged a plurality of pillars PL along the first direction while penetrating the plurality of insulation materials 112 and 112*a* along the third direction. For example, the pillars PL may contact the substrate 111 while passing through the insulation materials 112 and 112*a*.

According to an embodiment, the pillars PL between two adjacent common source regions may be spaced apart along the first direction. The pillars PL may be disposed in line along the first direction.

According to an embodiment, the pillars PL may be formed of a plurality of materials, respectively. Each of the pillars PL may include a channel film 114 and an inner material 115 within the channel film 114.

The channel films 114 may include a semiconductor material (e.g., silicon) having the first conductivity type. For example, the channel films 114 may include a semiconductor material (e.g., silicon) having the same conductivity type as the substrate 111. The channel films 114 can include intrinsic semiconductor being a nonconductor.

The inner materials 115 may include an insulation material. For example, the inner materials 115 may include an insulation material, such as silicon oxide. Alternatively, the inner materials 115 may include an air gap.

Between two adjacent regions of the common source regions CSR are provided information storage films 116 on exposed surfaces of the insulation materials 112 and 112*a* and the pillars PL. The information storage films 116 may store information by trapping or discharging electric charges.

Between two adjacent common source regions and between the insulation materials 112 and 112*a* are provided conductive materials CM1 to CM8 on exposed surfaces of the information storage films 116. The conductive materials CM1 to CM8 may extend along the first direction. The conductive materials CM1 to CM8 on the common source regions CSR may be separated by word line cuts. The common source regions CSR may be exposed by the word line cuts. The word line cuts may extend along the first direction.

According to an embodiment, the conductive materials CM1 to CM8 may include a metallic conductive material. The conductive materials CM1 to CM8 may include a nonmetallic conductive material, such as polysilicon.

According to an exemplary embodiment, information storage films 116 can be removed, which are provided on upper surfaces of uppermost insulation materials among the insulation materials 112 and 112*a*. According to an embodiment, information storage films provided at sides of the insulation materials 112 and 112*a*, which are opposite to the pillars PL, can be removed.

A plurality of drains 320 may be provided on the plurality of pillars PL, respectively. For example, the drains 320 may include a semiconductor material (e.g., silicon) having the second conductivity type. The drains 320 may include an n-type semiconductor material (e.g., silicon). For purposes of illustration, the drains 320 include n-type silicon. However, the embodiments of the present inventive concept are not limited thereto. The drains 320 can be extended to upper portions of the channel films 114 of the pillars PL.

Bit lines BL extending in the second direction may be provided on the drains 320. The bit lines BL are spaced apart from one another along the first direction. The bit lines BL may be coupled with the drains 320. According to an embodiment, the drains 320 and the bit lines BL may be connected via contact plugs (not shown). The bit lines BL may include a metallic conductive material. Alternatively, the bit lines BL may include a nonmetallic conductive material, such as polysilicon.

The conductive materials CM1 to CM8, respectively, may have first height to eighth heights from the substrate 111.

The plurality of pillars PL may form a plurality of cell strings together with the information storage films 116 and the plurality of conductive materials CM1 to CM8. Each of the pillars PL may form a cell string together with information storage films 116 and adjacent conductive materials CMi (where, i is one of 1 to 8) of the information storage films 116.

The pillars PL may be provided on the substrate 111 along row and column directions. The eighth conductive materials CM8 may constitute rows. Pillars connected with the same eighth conductive material CM8 may constitute one row. The bit lines BL may constitute columns. Pillars connected with the same bit line BL may constitute a column. The pillars PL may constitute a plurality of strings, which are arranged along row and column directions, together with the information storage films 116 and the plurality of conductive materials CM1 to CM8. Each cell string may include a plurality of cell transistors CT stacked in a direction perpendicular to the substrate 111.

Figure 6:
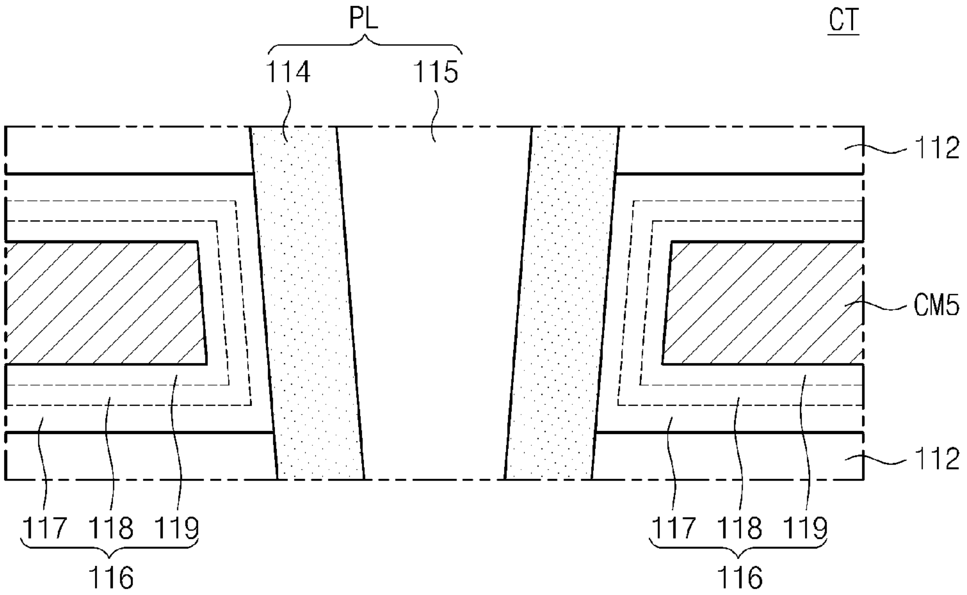
FIG. 6 is a diagram illustrating one of the cell transistors in FIG. 5.

FIG. 6 is a diagram illustrating one of the cell transistors shown in FIG. 5. Referring to FIGS. 3 to 6, cell transistors CT may be formed of conductive materials CM1 to CM8, pillars PL, and information storage films 116 provided between the conductive materials CM1 to CM8 and the pillars PL.

The information storage films 116 may extend along upper surfaces and lower surfaces of the conductive materials CM1 to CM8 from regions between the conductive materials CM1 to CM8 and the pillars PL. Each of the information storage films 116 may include first to third sub insulation films 117, 118, and 119.

In the cell transistors CT, the channel films 114 of the pillars PL may include the same p-type silicon as the substrate 111. The channel films 114 may act as bodies of cell transistors CT. According to an embodiment, the channel films 114 may be formed in a direction perpendicular to the substrate 111. The channel films 114 of the pillars PL may act as vertical bodies. Vertical channels may be formed at the channel films 114.

The first sub insulation films 117 adjacent to the pillars PL may act as tunneling insulation films of the cell transistors CT. For example, the first sub insulation films 117 each may include a thermal oxide film. The first sub insulation films 117 each may include a silicon oxide film.

The second sub insulation films 118 may act as charge storage films of the cell transistors CT. For example, the second sub insulation films 118 each may act as a charge trap film. For example, the second sub insulation films 118 each may include a nitride film or a metal oxide film.

The third sub insulation films 119 adjacent to the conductive materials CM1 to CM8 may act as blocking insulation films of the cell transistors CT. According to an embodiment, the third sub insulation films 119 each may be formed of a single layer or multiple layers. The third sub insulation films 119 each may include a high dielectric film (e.g., an aluminum oxide film, a hafnium oxide film, etc.) having a dielectric constant larger than dielectric constants of the first and second sub insulation films 117 and 118. The third sub insulation films each 119 may include a silicon oxide film.

According to an embodiment, the first to third sub insulation films 117 to 119 may include an ONA (oxide-nitride-aluminum-oxide) structure or ONO (oxide-nitride-oxide) structure.

The plurality of conductive materials CM1 to CM8 each may act as a gate (or, a control gate).

The plurality of conductive materials CM1 to CM8 acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute cell transistors CT stacked in a direction perpendicular to the substrate 111. For example, the cell transistors CT may be charge trap type cell transistors.

The cell transistors CT can be used for different purposes according to a height from the substrate 111. For example, among the cell transistors CT, cell transistors having at least one height from the substrate 111 and placed at upper portions of the memory cell strings may be used as string selection transistors. String selection transistors may be configured to perform switching operations between cell strings and bit lines. Among the cell transistors CT, cell transistors having at least one height from the substrate 111 and placed at lower portions of the memory cell strings may be used as ground selection transistors. Ground selection transistors may be configured to perform switching operations between cell strings and a common source line formed of common source regions CSR. Cell transistors between the string and ground selection transistors may be used as memory cells and dummy memory cells.

The conductive materials CM1 to CM8 may extend along the first direction and may be connected with the plurality of pillars PL. The conductive materials CM1 to CM8 may constitute conductive lines interconnecting cell transistors CT of the pillars PL. According to an embodiment, the conductive materials CM1 to CM8 may be used as string selection lines, ground selection lines, word lines, or dummy word lines according to the height from the substrate 111.

Conductive lines interconnecting cell transistors used as string selection transistors may be used as string selection lines. Conductive lines interconnecting cell transistors used as ground selection transistors may be used as ground selection lines. Conductive lines interconnecting cell transistors used as memory cells may be used as word lines. Conductive lines interconnecting cell transistors used as dummy memory cells may be used as dummy word lines.

Figure 7:
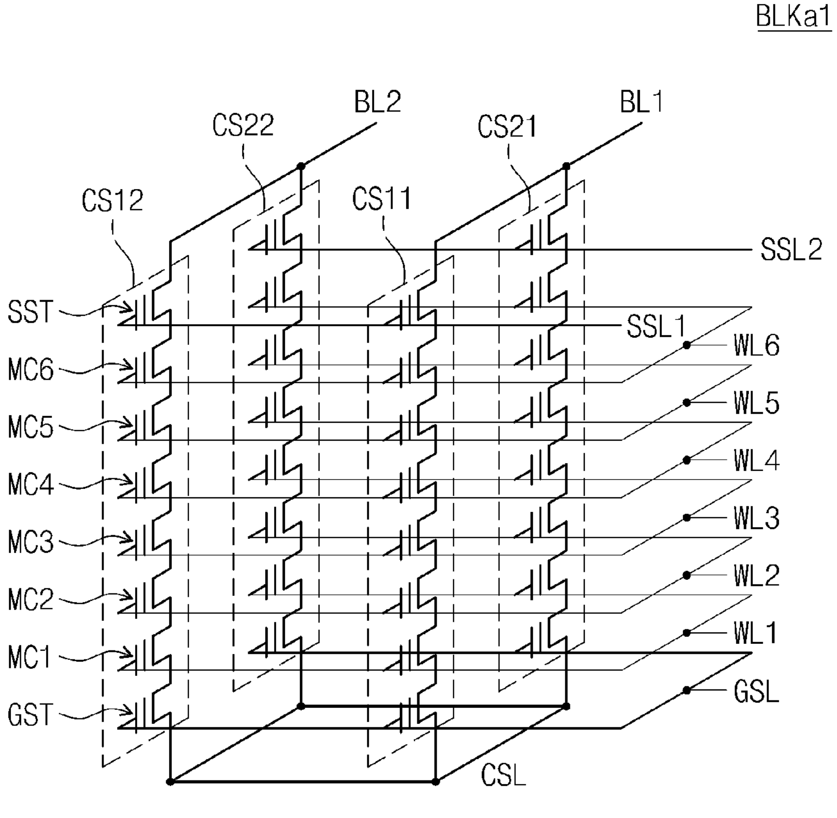
FIG. 7 is a circuit diagram illustrating an equivalent circuit of a part EC of FIG. 3 according to an exemplary embodiment of the inventive concept.

FIG. 7 is a circuit diagram illustrating an equivalent circuit of a part EC of FIG. 3 according to an exemplary embodiment of the inventive concept. Referring to FIGS. 3 to 7, cell strings CS11, CS12, CS21, and CS22 may be provided between bit lines BL1 and BL2 and a common source line CSL. Cell strings CS11 and CS21 may be connected between the first bit line BL1 and the common source line CSL, and cell strings CS12 and CS22 may be connected between the second bit line BL2 and the common source line CSL.

Common source regions CSR may be connected in common with one another to form a common source line CSL.

The cell strings CS11, CS12, CS21, and CS22 may correspond to four pillars of a part EC of FIG. 3. The four pillars may constitute four cell strings CS11, CS12, CS21, and CS22 together with conductive materials CM1 to CM8 and information storage films 116.

According to an embodiment, the first conductive materials CM1 may constitute ground selection transistors GST with the information storage films 116 and the pillars PL. The first conductive materials CM1 may form a ground selection line GSL. The first conductive materials CM1 may be interconnected to form a ground selection line GSL.

The second to seventh conductive materials CM2 to CM7 may constitute the first to sixth memory cells MC1 to MC6 with the information storage films 116 and the pillars PL. The second to seventh conductive materials CM2 to CM7 may be used as the second to sixth word lines WL2 to WL6.

The second conductive materials CM2 may be interconnected to form the first word line WL1. The third conductive materials CM3 may be interconnected to form the second word line WL2. The fourth conductive materials CM4 may be interconnected to form the third word line WL3. The fifth conductive materials CM5 may be interconnected to form the fourth word line WL4. The sixth conductive materials CM6 may be interconnected to form the fifth word line WL5. The seventh conductive materials CM7 may be interconnected to form the sixth word line WL6.

The eighth conductive materials CM8 may constitute string selection transistors SST with the information storage films 116 and the pillars PL. The eighth conductive materials CM8 may form string selection lines SSL1 and SSL2.

Memory cells of the same height from the substrate 111 may be connected in common with one word line. Accordingly, when applied to a word line of a predetermined height from the substrate 111, a voltage may be applied to all of the cell strings CS11, CS12, CS21, and CS22.

Cell strings in different rows may be connected with different string selection lines SSL1 and SSL2. The rows of the cell strings CS11, CS12, CS21, and CS22 may be selected or unselected by selecting or unselecting the string selection lines SSL1 and SSL2. For example, cell strings (CS11 and CS12) or (CS21 and CS22) connected with an unselected string selection line SSL1 or SSL2 may be electrically separated from the bit lines BL1 and BL2. Cell strings (CS21 and CS22) or (CS11 and CS12) connected with a selected string selection line SSL2 or SSL1 may be electrically connected with the bit lines BL1 and BL2.

The columns of the cell strings CS11, CS12, CS21, and CS22 may be connected with the bit lines BL1 and BL2. The cell strings CS11 and CS21 may be connected with the bit line BL1, and the cell strings CS12 and CS22 may be connected with the bit line BL2. The columns of the cell strings CS11, CS12, CS21, and CS22 may be selected and unselected by selecting and unselecting the bit lines BL1 and BL2.

Figures 8, 9:
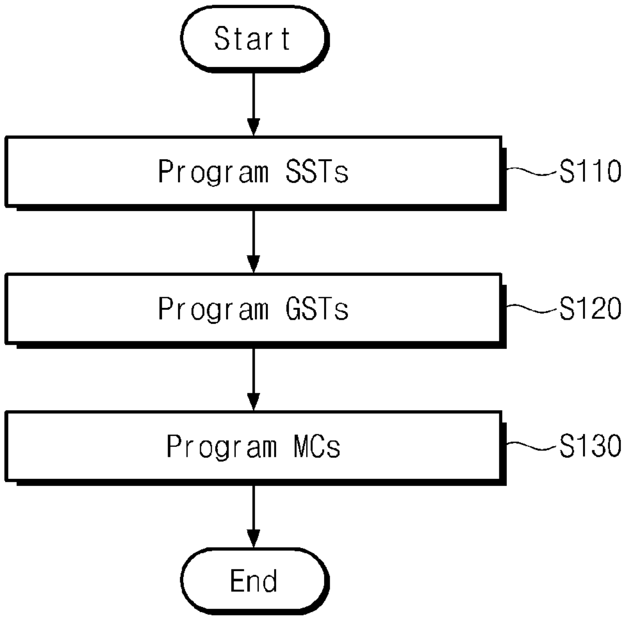
FIG. 8 is a flowchart illustrating an operating method of a nonvolatile memory device according to an exemplary embodiment of the inventive concept.
FIG. 9 is a table illustrating voltage conditions for programming of string selection transistors according to an exemplary embodiment of the inventive concept.

FIG. 8 is a flowchart illustrating an operating method of a nonvolatile memory device according to an exemplary embodiment of the inventive concept. Referring to FIGS. 7 and 8, in operation S110, string selection transistors SST may be programmed. The string selection transistors SST may be programmed to have a threshold voltage higher than a predetermined voltage. The string selection transistors SST may be programmed to have a distribution smaller than a predetermined value. The string selection transistors SST may be programmed by the Fowler-Nordheim (F-N) Tunneling mechanism or the Hot Carrier Injection mechanism.

In operation S120, ground selection transistors GST may be programmed. The ground selection transistors GST may be programmed to have a threshold voltage higher than a predetermined voltage. The ground selection transistors GST may be programmed to have a distribution smaller than a predetermined value. The ground selection transistors SST may be programmed by the Fowler-Nordheim (F-N) Tunneling mechanism or the Hot Carrier Injection mechanism.

In operation 5130, programming, reading, and erasing may be performed with respect to memory cells MC1 to MC6. Threshold voltages of the string selection transistors SST may be over a predetermined voltage and have a distribution smaller than a predetermined value. Threshold voltages of the ground selection transistors GST may be over a predetermined voltage and have a distribution smaller than a predetermined value. Since the threshold voltages of the string and ground selection transistors SST and GST become stable, programming, reading, and erasing may be more reliably performed on memory cells MC1 to MC6.

Figures 10, 11:
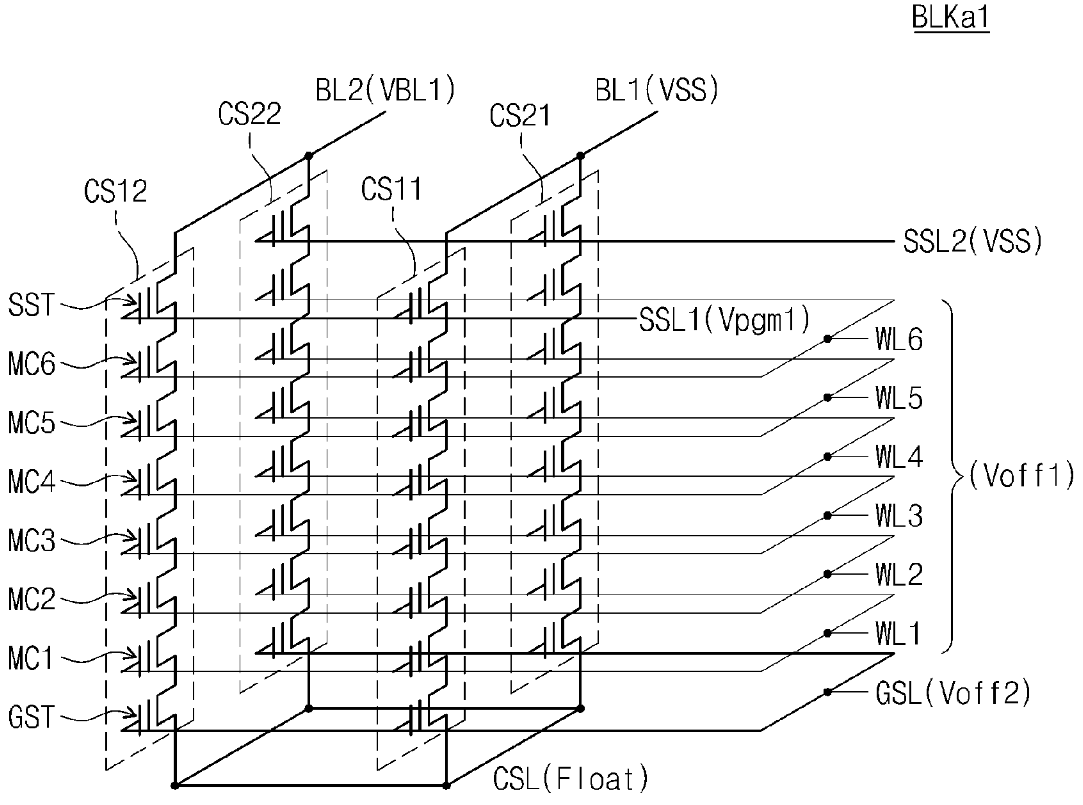
FIG. 10 is a circuit diagram illustrating an equivalent circuit to which the voltage conditions in FIG. 9 are applied.
FIG. 11 is a table illustrating programming conditions for string selection transistors of the equivalent circuit in FIG. 10.

FIG. 9 is a table illustrating voltage conditions for programming of string selection transistors according to an exemplary embodiment of the inventive concept. FIG. 10 is a circuit diagram illustrating an equivalent circuit to which the voltage conditions in FIG. 9 are applied. FIG. 11 is a table illustrating programming conditions for string selection transistors of the equivalent circuit in FIG. 10.

Referring to FIGS. 9 to 11, a ground voltage VSS may be supplied to a selected bit line (e.g., a first bit line BL1). A first bit line voltage VBL1 may be supplied to an unselected bit line (e.g., a second bit line BL2). A first program voltage Vpgm1 may be supplied to a selected string selection line (e.g., a first string selection line SSL1). The first program voltage Vpgm1 may be a high voltage. The ground voltage VSS may be supplied to an unselected string selection line (e.g., a second string selection line SSL2).

A first turn-off voltage Voff1 may be supplied to word lines WL1 to WL6. The first turn-off voltage Voff1 may be a voltage sufficient to turn off memory cells MC1 to MC6. The first turn-off voltage Voff1 may be the ground voltage VSS. A second turn-off voltage Voff2 may be supplied to a ground selection line GSL. The second turn-off voltage Voff2 may be a voltage sufficient to turn off ground selection transistors GST. The second turn-off voltage Voff2 may be the ground voltage VSS. The first and second turn-off voltages Voff1 and Voff2 may inhibit channels from being formed at the ground selection transistors GST and the memory cells MC1 to MC6.

When the first program voltage Vpgm1 is supplied to the selected string selection line SSL1, string selection transistors connected with the selected string selection line SSL1 may be turned on. For example, channels may be formed at the selected string selection transistors.

Cell strings CS11 and CS12 connected with the selected string selection line SSL1 may be connected with the first and second bit lines BL1 and BL2, respectively. The ground voltage VSS supplied to the first bit line BL1 may be supplied to a channel of a string selection transistor of the cell string CS11. A gate voltage of the string selection transistor of the cell string CS11 may be the first program voltage Vpgm1, and a channel voltage may be the ground voltage VSS. The first program voltage Vpgm1 may have a level sufficient to generate F-N tunneling. For example, a string selection transistor of the cell string CS11 connected with the selected string selection line SSL1 and the selected bit line BL1 may be programmed by the F-N tunneling mechanism.

The first bit line voltage VBL1 supplied to the second bit line BL2 may be supplied to a channel of a string selection transistor of the cell string CS12. A gate voltage of the string selection transistor of the cell string CS12 may be the first program voltage Vpgm1, and a channel voltage may be the first bit line voltage VBL1. The first bit line voltage VBL1 may have a level sufficient to inhibit the F-N tunneling together with the first program voltage Vpgm1. For example, a string selection transistor of the cell string CS12 connected with the selected string selection line SSL1 and the unselected bit line BL2 may be inhibited from being programmed.

The ground voltage VSS may be supplied to the unselected string selection line SSL2. Accordingly, the cell strings CS21 and CS22 connected with the unselected string selection line SSL2 may be inhibited from being programmed.

According to an embodiment, a difference between the first program voltage Vpgm1 and the first bit line VBL1 may be below about 12V. A difference between the first program voltage Vpgm1 and the first bit line VBL1 may have a value between about 8V and about 12V.

A voltage different in level from the ground voltage VSS may be supplied to the selected bit line BL1. A positive voltage or a negative voltage may be supplied to the selected bit line BL1. A voltage supplied to the selected bit line BL1 may have a level sufficient to generate F-N tunneling together with the first program voltage Vpgm1.

A voltage different in level from the ground voltage VSS may be supplied to the unselected string selection line SSL2. A positive voltage or a negative voltage may be supplied to the unselected string selection line SSL2. A voltage supplied to the unselected string selection line SSL2 may have the ground voltage VSS or a level sufficient to inhibit F-N tunneling together with the first bit line voltage VBL1.

A voltage different in level from a turn-off voltage may be supplied to at least one of the word lines WL1 to WL6 and the ground selection line GSL. A turn-on voltage may be supplied to at least one of the word lines WL1 to WL6 and the ground selection line GSL.

A common source line CSL may not be floated. A predetermined voltage may be supplied to the common source line CSL.

Figure 13:
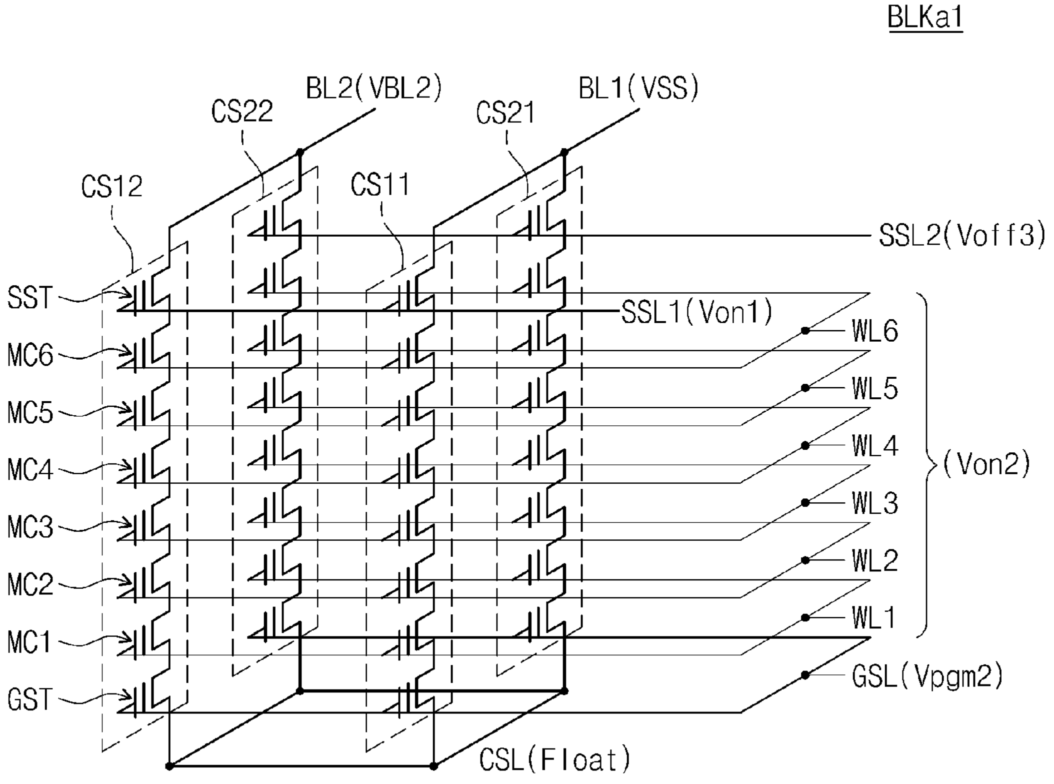
FIG. 13 is a circuit diagram illustrating an equivalent circuit to which the voltage conditions in FIG. 12 are applied.

FIG. 12 is a table illustrating voltage conditions for programming of ground selection transistors according to an exemplary embodiment of the inventive concept. FIG. 13 is a circuit diagram illustrating an equivalent circuit to which the voltage conditions in FIG. 12 are applied. FIG. 14 is a table illustrating programming conditions of ground selection transistors of the equivalent circuit in FIG. 13.

Referring to FIGS. 12 to 14, a ground voltage VSS may be supplied to a selected bit line (e.g., a first bit line BL1). A second bit line voltage VBL2 may be supplied to an unselected bit line (e.g., a second bit line BL2).

A first turn-on voltage Von1 may be supplied to a selected string selection line (e.g., a first string selection line SSL1). The first turn-on voltage Von1 may be a voltage sufficient to turn on selected string selection transistors. The first turn-on voltage Von1 may be a power supply voltage VCC, a non-selection read voltage Vread, or a pass voltage Vpass.

A third turn-off voltage Voff3 may be supplied to an unselected string selection line (e.g., a second string selection line SSL2). The third turn-off voltage Voff3 may be a voltage sufficient to turn off unselected string selection transistors. The third turn-off voltage Voff3 may be the ground voltage VSS.

A second turn-on voltage Von2 may be supplied to word lines WL1 to WL6. The second turn-on voltage Von2 may be a voltage sufficient to turn on memory cells MC1 to MC6. The second turn-on voltage Von2 may be the power supply voltage VCC, the non-selection read voltage Vread, or the pass voltage Vpass.

A second program voltage Vpgm2 may be supplied to a ground selection line GSL. The second program voltage Vpgm2 may be a high voltage. When the second program voltage Vpgm2 is supplied, ground selection transistors GST may be turned on. Channels of the ground selection transistors GST may be formed.

Cell strings CS11 and CS12 connected with the selected string selection line SSL1 may be connected with the first and second bit lines BL1 and BL2, respectively. The selected string selection transistors and the memory cells MC1 to MC6 may be turned on. Accordingly, the ground voltage VSS supplied to the selected first bit line BL1 may be supplied to a channel of a ground selection transistor of the cell string CS11. A gate voltage of the ground selection transistor of the cell string CS11 may be the second program voltage Vpgm2, and a channel voltage may be the ground voltage VSS. The second program voltage Vpgm2 may have a level sufficient to generate the F-N tunneling. A string selection transistor of the cell string CS11 connected with the selected string selection line SSL1 and the selected bit line BL1 may be programmed by the F-N tunneling mechanism.

The second bit line voltage VBL2 supplied to the second bit line BL2 may be supplied to a channel of a ground selection transistor of the cell string CS12. A gate voltage of the ground selection transistor of the cell string CS12 may be the second program voltage Vpgm2, and a channel voltage may be the second bit line voltage VBL2. The second bit line voltage VBL2 may have a level sufficient to inhibit the F-N tunneling together with the second program voltage Vpgm2. A ground selection transistor of the cell string CS12 connected with the selected string selection line SSL1 and the unselected bit line BL2, a ground selection transistor may be inhibited from being programmed.

Unselected string selection transistors may be turned off. When a second turn-on voltage Von2 is supplied to the word lines WL1 to WL6, channels of the memory cells MC1 to MC6 may be floated. Accordingly, voltages of the channels of the memory cells MC1 to MC6 may be increased by the coupling with the word lines WL1 to WL6. For example, in a cell string CS21 connected with the selected bit line BL1 and the unselected string selection line SSL2, channel voltages of memory cells may be increased to a first floating voltage VF1. The first floating voltage VF1 may be supplied to a channel of a ground selection transistor of the cell string CS21. A gate voltage of the ground selection transistor of the cell string CS21 may be the second program voltage Vpgm2, and a channel voltage may be the first floating voltage VF1. A difference between the second program voltage Vpgm2 and the first floating voltage VF1 may not cause the F-N tunneling. Accordingly, in the cell string CS21 connected with the selected bit line BL1 and the unselected string selection line SSL2, a ground selection transistor may be inhibited from being programmed.

In the cell string CS22 connected with the unselected bit line BL2 and the unselected string selection line SSL2, channel voltages of memory cells may be increased to a second floating voltage VF2. The second floating voltage VF2 may be supplied to a channel of a ground selection transistor of the cell string CS22. A gate voltage of the ground selection transistor of the cell string CS22 may be the second program voltage Vpgm2, and a channel voltage may be the second floating voltage VF2. A difference between the second program voltage Vpgm2 and the second floating voltage VF2 may not cause the F-N tunneling. Accordingly, a ground selection transistor of the cell string CS22 connected with the unselected bit line BL2 and the unselected string selection line SSL2 may be inhibited from being programmed.

According to an embodiment, a difference between the second program voltage Vpgm2 and the second bit line voltage VBL2 may be below about 12V. A difference between the second program voltage Vpgm2 and the second bit line voltage VBL2 may have a value between about 8V and about 12V. The second program voltage Vpgm2 may be identical in level to the first program voltage Vpgm1. The second bit line voltage VBL2 may be identical in level to the first bit line voltage VBL1.

A voltage different in level from the ground voltage VSS may be supplied to the selected bit line BL1. A positive voltage or a negative voltage may be supplied to the selected bit line BL1. A voltage supplied to the selected bit line BL1 may have a level sufficient to generate the F-N tunneling together with the second program voltage Vpgm2.

Figure 15:
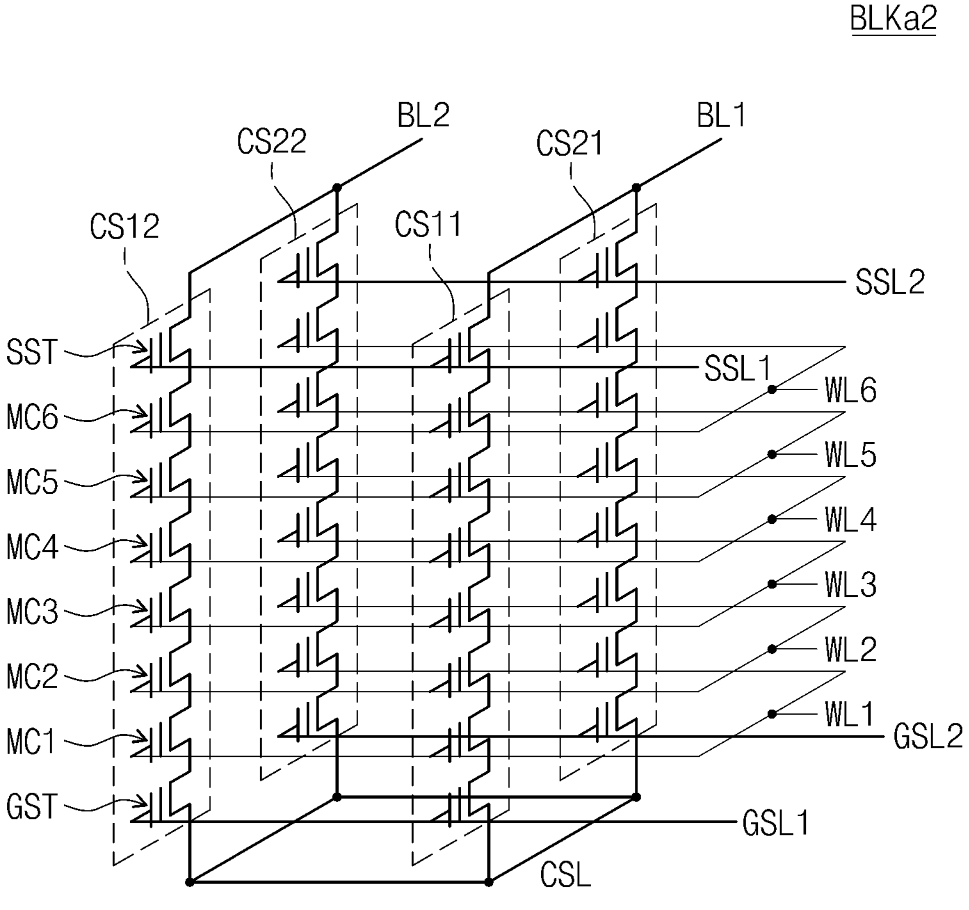
FIG. 15 is a circuit diagram illustrating an equivalent circuit of the part EC of FIG. 3 according to an exemplary embodiment of the inventive concept.

FIG. 15 is a circuit diagram illustrating an equivalent circuit of a part EC of FIG. 3 according to an exemplary embodiment of the inventive concept. As compared with the equivalent circuit BLKa1 illustrated in FIG. 7, ground selection transistors GST may be connected with first and second ground selection lines GSL1 and GSL2. Referring to FIGS. 3 to 6 and 15, first conductive materials CM1 may constitute the first and second ground selection lines GSL1 and GSL2.

String selection transistors SST may be programmed by the same method as described with reference to FIGS. 9 to 11. When the string selection transistors SST are programmed, the same voltage may be supplied to the first and second ground selection lines GSL1 and GSL2. A second turn-off voltage Voff2 may be supplied to the first and second ground selection lines GSL1 and GSL2.

Ground selection transistors GST may be programmed by the same method as described with reference to FIGS. 12 to 14. When the ground selection transistors GST are programmed, the same voltage may be supplied to the first and second ground selection lines GSL1 and GSL2. A second program voltage Vpgm2 may be supplied to the first and second ground selection lines GSL1 and GSL2.

Figure 17:
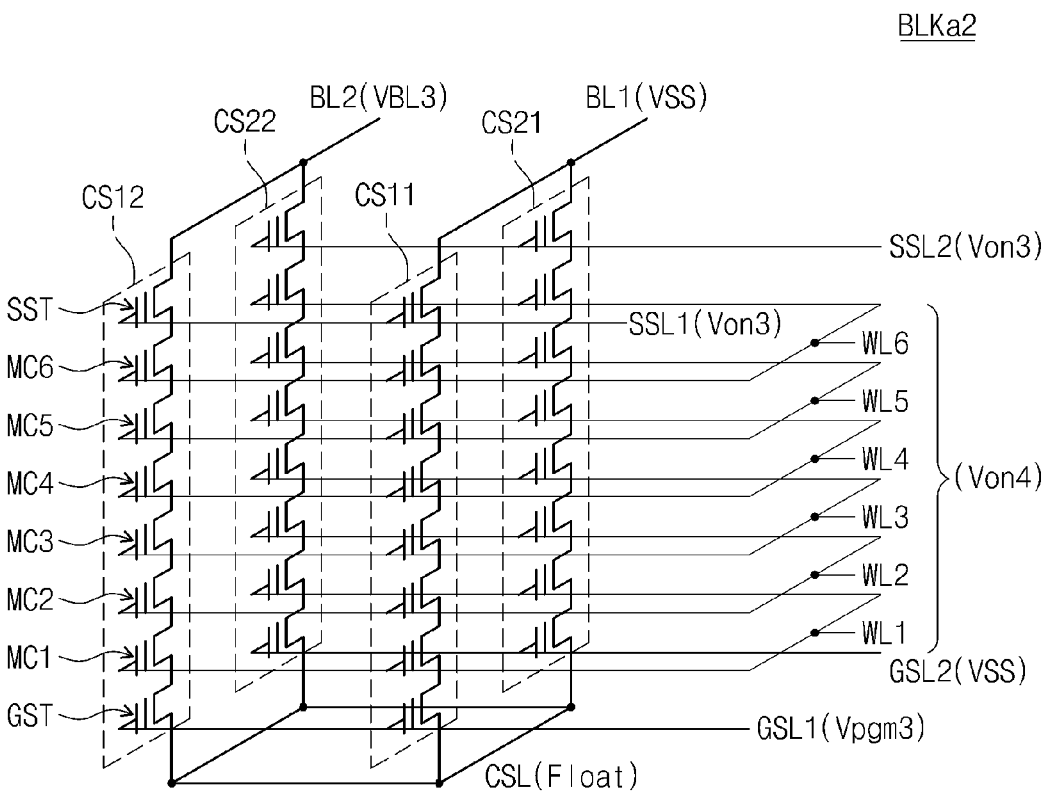
FIG. 17 is a circuit diagram illustrating an equivalent circuit to which the voltage conditions in FIG. 16 are applied.

FIG. 16 is a table illustrating voltage conditions for programming of ground selection transistors according to an exemplary embodiment of the inventive concept. FIG. 17 is a circuit diagram illustrating an equivalent circuit to which the voltage conditions in FIG. 16 are applied. FIG. 18 is a table illustrating programming conditions of ground selection transistors of the equivalent circuit in FIG. 17.

Referring to FIGS. 16 to 18, a ground voltage VSS may be supplied to a selected bit line (e.g., a first bit line BL1). A third bit line voltage VBL3 may be supplied to an unselected bit line (e.g., a second bit line BL2).

A third turn-on voltage Von3 may be supplied to a selected string selection line (e.g., a first string selection line SSL1) and an unselected string selection line (e.g., a second string selection line SSL2). The third turn-on voltage Von3 may be a voltage sufficient to turn on string selection transistors. The third turn-on voltage Von3 may be a power supply voltage VCC, a non-selection read voltage Vread, or a pass voltage Vpass.

A fourth turn-on voltage Von4 may be supplied to word lines WL1 to WL6. The fourth turn-on voltage Von4 may be a voltage sufficient to turn on memory cells MC1 to MC6. The fourth turn-on voltage Von4 may be the power supply voltage VCC, the non-selection read voltage Vread, or the pass voltage Vpass.

A third program voltage Vpgm3 may be supplied to a ground selection line GSL. The third program voltage Vpgm3 may be a high voltage. When the third program voltage Vpgm3 is supplied, selected ground selection transistors may be turned on. Channels of the selected ground selection transistors may be formed.

The ground voltage VSS may be supplied to an unselected ground selection line (e.g., a second ground selection line GSL2).

Cell strings CS11 and CS12 connected with the selected ground selection line GSL1 may be connected with the first and second bit lines BL1 and BL2, respectively. Selected ground selection transistors and memory cells MC1 to MC6 may be turned on. Accordingly, the ground voltage VSS supplied to the selected first bit line BL1 may be supplied to a channel of a ground selection transistor of the cell string CS11. A gate voltage of the ground selection transistor of the cell string CS11 may be the third program voltage Vpgm3, and a channel voltage may be the ground voltage VSS. The third program voltage Vpgm3 may have a level sufficient to generate the F-N tunneling. In the cell string CS11 connected with the selected ground selection line GSL1 and the selected bit line BL1, a ground selection transistor may be programmed by the F-N tunneling mechanism.

The third bit line voltage VBL3 supplied to the second bit line BL2 may be supplied to a channel of a ground selection transistor of the cell string CS12. A gate voltage of the ground selection transistor of the cell string CS12 may be the third program voltage Vpgm3, and a channel voltage may be the third bit line voltage VBL3. The third bit line voltage VBL3 may have a level sufficient to inhibit the F-N tunneling together with the third program voltage Vpgm3. In the cell string CS12 connected with the selected ground selection line GSL1 and the unselected bit line BL2, a ground selection transistor may be inhibited from being programmed.

The ground voltage VSS may be supplied to the unselected ground selection line GSL2. Accordingly, unselected ground selection transistors may be inhibited from being programmed.

According to an embodiment, a difference between the third program voltage Vpgm3 and the third bit line voltage VBL3 may be below about 12V. A difference between the third program voltage Vpgm3 and the third bit line voltage VBL3 may have a value between about 8V and about 12V. The third program voltage Vpgm3 may be identical in level to the first or the second program voltage Vpgm1 or Vpgm2. The third bit line voltage VBL3 may be identical in level to the first or the second bit line voltage VBL1 or VBL2.

A voltage different in level from the ground voltage VSS may be supplied to the selected bit line BL1. A positive voltage or a negative voltage may be supplied to the selected bit line BL1. A voltage supplied to the selected bit line BL1 may have a level sufficient to generate the F-N tunneling together with the third program voltage Vpgm3.

A voltage different in level from the ground voltage VSS may be supplied to the unselected ground selection line GSL2. A positive voltage or a negative voltage may be supplied to the unselected ground selection line GSL2. A voltage supplied to the unselected ground selection line GSL2 may be the ground voltage VSS or have a level sufficient to inhibit the F-N tunneling together with the third bit line voltage VBL3.

According to an embodiment, the programming method described in relation to FIGS. 12 to 14 and the programming method described in relation to FIGS. 16 to 18 may be combined. For example, in the programming method described in relation to FIGS. 16 to 18, the voltages supplied to the string selection lines SSL1 and SSL2 may be used as the voltages described in relation to FIGS. 12 to 14.

Figure 19:
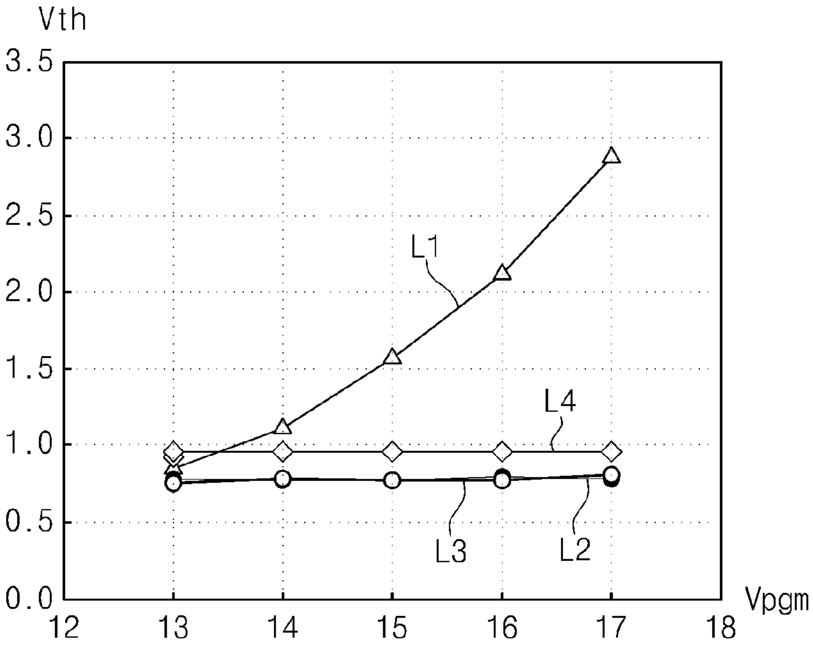
FIGS. 19 and 20 are graphs illustrating variations of threshold voltages of selection transistors programmed according to an operating method according to an embodiment of the inventive concept.
Figure 20:
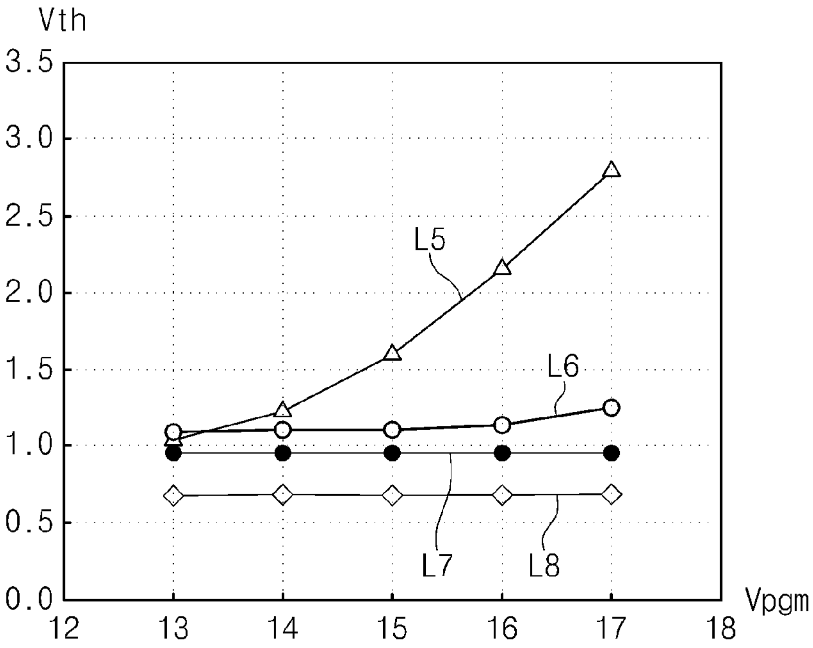

FIGS. 19 and 20 are graphs illustrating variations of threshold voltages of selection transistors programmed according to an operating method according to an embodiment of the inventive concept. In FIGS. 19 and 20, a horizontal axis indicates program voltages, and a vertical axis indicates threshold voltages of selection transistors. According to an embodiment, variations of threshold voltages of selection transistors according to the programming method described in relation to FIGS. 9 to 11 are illustrated in FIGS. 19 and 20.

Referring to FIGS. 9 to 11 and 19, a first bit line voltage VBL1 may be about 5V. A first line L1 may indicate a threshold voltage variation of a string selection transistor of a cell string CS11 connected with a selected string selection line SSL1 and a selected bit line BL1. As a first program voltage Vpgm1 increases to about 17V from about 13V, a threshold voltage of a string selection transistor of the cell string CS11 may increase.

A second line L2 may indicate a threshold voltage variation of a string selection transistor of a cell string CS12 connected with the selected string selection line SSL1 and an unselected bit line BL2. Although the first program voltage Vpgm1 increases to about 17V from about 13V, a threshold voltage of a string selection transistor of the cell string CS12 may not increase.

A third line L3 may indicate a threshold voltage variation of a string selection transistor of a cell string CS21 connected with an unselected string selection line SSL2 and the selected bit line BL1. A fourth line L4 may indicate a threshold voltage variation of a string selection transistor of a cell string CS22 connected with the unselected string selection line SSL2 and the unselected bit line BL2. Although the first program voltage Vpgm1 increases to about 17V from about 13V, threshold voltages of string selection transistors of the cell strings CS21 and CS22 may not increase.

Referring to FIGS. 9 to 11 and 20, the first bit line voltage VBL1 may be between about 3V and about 5V. A fifth line L5 may indicate a threshold voltage variation of a string selection transistor of the cell string CS11 connected with the selected string selection line SSL1 and the selected bit line BL1. As the first program voltage Vpgm1 increases to about 17V from about 13V, a threshold voltage of a string selection transistor of the cell string CS11 may increase.

A sixth line L6 may indicate a threshold voltage variation of a string selection transistor of the cell string CS12 connected with the selected string selection line SSL1 and the unselected bit line BL2. When the first program voltage Vpgm1 is higher than about 16V, a string selection transistor of the cell string CS12 may be programmed lightly. Accordingly, a voltage difference between the first program voltage Vpgm1 and the first bit line VBL1 may be set to be below about 12V.

A seventh line L7 may indicate a threshold voltage variation of a string selection transistor of the cell string CS21 connected with the unselected string selection line SSL2 and the selected bit line BL1. An eighth line L8 may indicate a threshold voltage variation of a string selection transistor of the cell string CS22 connected with the unselected string selection line SSL2 and the unselected bit line BL2. Although the first program voltage Vpgm1 increases to about 17V from about 13V, threshold voltages of string selection transistors of the cell strings CS21 and CS22 may not increase.

Figures 22, 23:
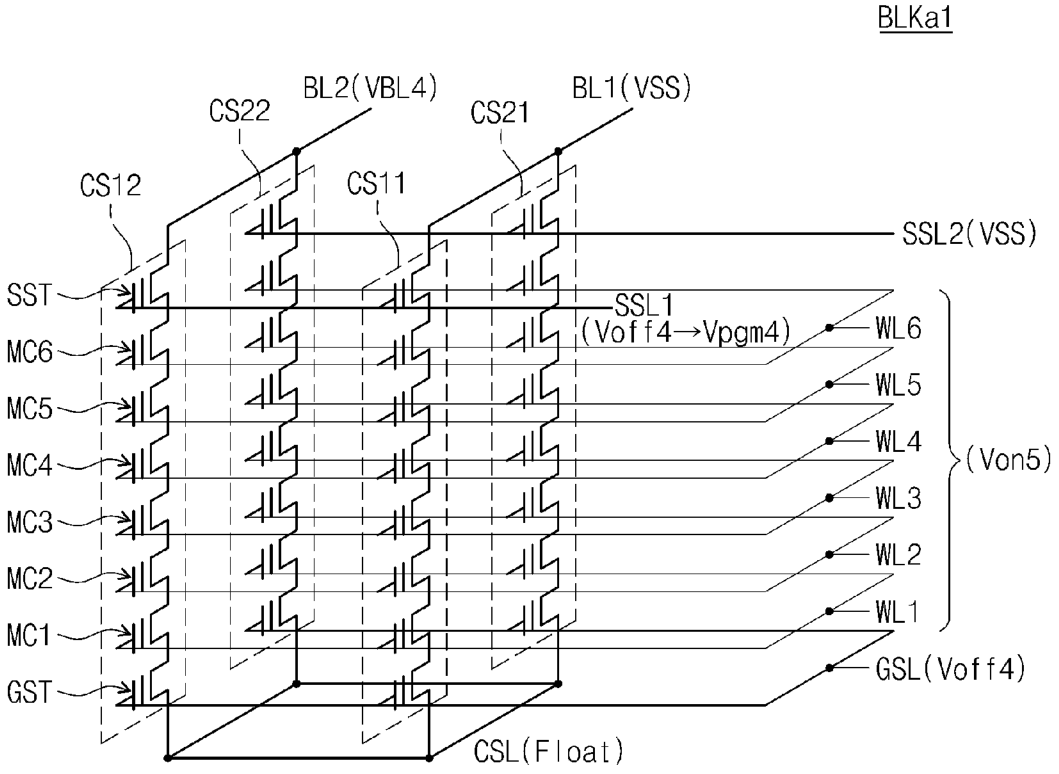
FIG. 22 is a circuit diagram illustrating an equivalent circuit to which the voltage conditions in FIG. 21 are applied.
FIG. 23 is a table illustrating programming conditions for string selection transistors of the equivalent circuit in FIG. 22.

FIG. 21 is a table illustrating voltage conditions for programming of string selection transistors according to an exemplary embodiment of the inventive concept. FIG. 22 is a circuit diagram illustrating an equivalent circuit to which the voltage conditions in FIG. 21 are applied. FIG. 23 is a table illustrating programming conditions of string selection transistors of the equivalent circuit in FIG. 22.

Referring to FIGS. 21 to 23, a ground voltage VSS may be supplied to a selected bit line (e.g., a first bit line BL1). A fourth bit line voltage VBL4 may be supplied to an unselected bit line (e.g., a second bit line BL2). After a fourth turn-off voltage Voff4 is supplied to a selected string selection line (e.g., a first string selection line SSL1), a fourth program voltage Vpgm4 may be supplied to the selected string selection line SSL1. The fourth turn-off voltage Voff4 may be a voltage sufficient to turn off selected string selection transistors. The fourth turn-off voltage Voff4 may be the ground voltage VSS. The fourth program voltage Vpgm4 may be a high voltage. The ground voltage VSS may be supplied to an unselected string selection line (e.g., a second string selection line SSL2).

A fifth turn-on voltage Von5 may be supplied to word lines WL1 to WL6. The fifth turn-on voltage Von5 may be a voltage sufficient to turn on memory cells MC1 to MC6. The fifth turn-on voltage Von5 may be a power supply voltage VCC, a non-selection read voltage Vread, or a pass voltage Vpass.

A fifth turn-off voltage Voff5 may be supplied to a ground selection line GSL. The fifth turn-off voltage Voff5 may be a voltage sufficient to turn off ground selection transistors GST. The fifth turn-off voltage Voff5 may be the ground voltage VSS.

A common source line CSL may be floated.

According to an embodiment, when voltages are supplied to the bit lines BL1 and BL2, the ground selection line GSL, and the word lines WL1 to WL6, the fourth turn-off voltage Voff4 may be supplied to the selected string selection line SSL1. After voltages supplied to the bit lines BL1 and BL2, the ground selection line GSL, and the word lines WL1 to WL6 reach their target values, the fourth program voltage Vpgm4 may be supplied to the selected string selection line SSL1.

When the fifth turn-on voltage Von5 is supplied to the word lines WL1 to WL6, the memory cells MC1 to MC6 may be turned on. Channels of the memory cells MC1 to MC6 may be formed. Voltages of the channels of the memory cells MC1 to MC6 may be boosted by the coupling with the word lines WL1 to WL6. For example, voltages of the channels of the memory cells MC1 to MC6 may be boosted to a third floating voltage VF3.

For a cell string CS11 connected with the selected bit line BL1 and the selected string selection line SSL1, the ground voltage VSS may be supplied to the bit line BL1. The ground voltage VSS may be applied to an end of a string selection transistor of the cell string CS11, and the third floating voltage VF3 may be applied to another end of the string selection transistor of the cell string CS11. A voltage difference between the third floating voltage VF3 and the ground voltage VSS may generate an electric field at the string selection transistor of the cell string CS11 in a vertical direction. Hot carriers may be generated by the electric field generated in the vertical direction. When the fourth program voltage Vpgm4 is supplied to the selected string selection line SSL1, the hot carriers may be injected to a charge storage layer of the string selection transistor. In the cell string CS11 connected with the selected bit line BL1 and the selected string selection line SSL1, the string selection transistor may be programmed by the hot carrier injection mechanism.

In the cell string CS12 connected with the unselected bit line BL2 and the selected string selection line SSL1, the fourth bit line voltage VBL4 may be supplied to the bit line BL1. The fourth bit line voltage VBL4 may be applied to an end of a string selection transistor of the cell string CS12, and the third floating voltage VF3 may be applied to another end of the string selection transistor of the cell string CS12. According to an embodiment, the fourth bit line voltage VBL4 may have a level sufficient to inhibit generation of hot carriers together with the third floating voltage VF3. Although the fourth program voltage Vpgm4 is supplied to the selected string selection line SSL1, the hot carrier injection may not occur. In the cell string CS12 connected with the unselected bit line BL2 and the selected string selection line SSL1, the string selection transistor may be inhibited from being programmed.

The ground voltage VSS may be supplied to the unselected string selection line SSL2. Accordingly, string selection transistors of cell strings CS21 and CS22 connected with the unselected string selection line SSL2 may be inhibited from being programmed.

According to an embodiment, the fourth program voltage Vpgm4 may be about 9V, the fourth bit line voltage VBL4 may be about 6V, and the fifth turn-on voltage Von5 may be about 13V.

According to an embodiment, a voltage different in level from the ground voltage VSS may be supplied to the selected bit line BL1. A positive or negative voltage may be supplied to the selected bit line BL1. A voltage supplied to the selected bit line BL1 may have a level sufficient to generate hot carriers together with the third floating voltage VF3.

According to an embodiment, a voltage different in level from the ground voltage VSS may be supplied to the unselected string selection line SSL2. A positive or negative voltage may be supplied to the unselected string selection line SSL2. A voltage supplied to the unselected string selection line SSL2 may have a level sufficient to prevent hot carriers from be injected in the cell strings CS21 and CS22 connected with the unselected string selection line SSL2.

According to an embodiment, a voltage different in level from the fifth turn-on voltage Von5 may be supplied to the word lines WL1 to WL6. A turn-off voltage may be supplied to at least one of the word lines WL1 to WL6. When a turn-off voltage may be supplied to at least one of the word lines WL1 to WL6, a turn-on voltage may be supplied to the ground selection line GSL.

According to an embodiment, a common source line CSL may not be floated. A predetermined voltage may be supplied to the common source line CSL.

Figure 25:
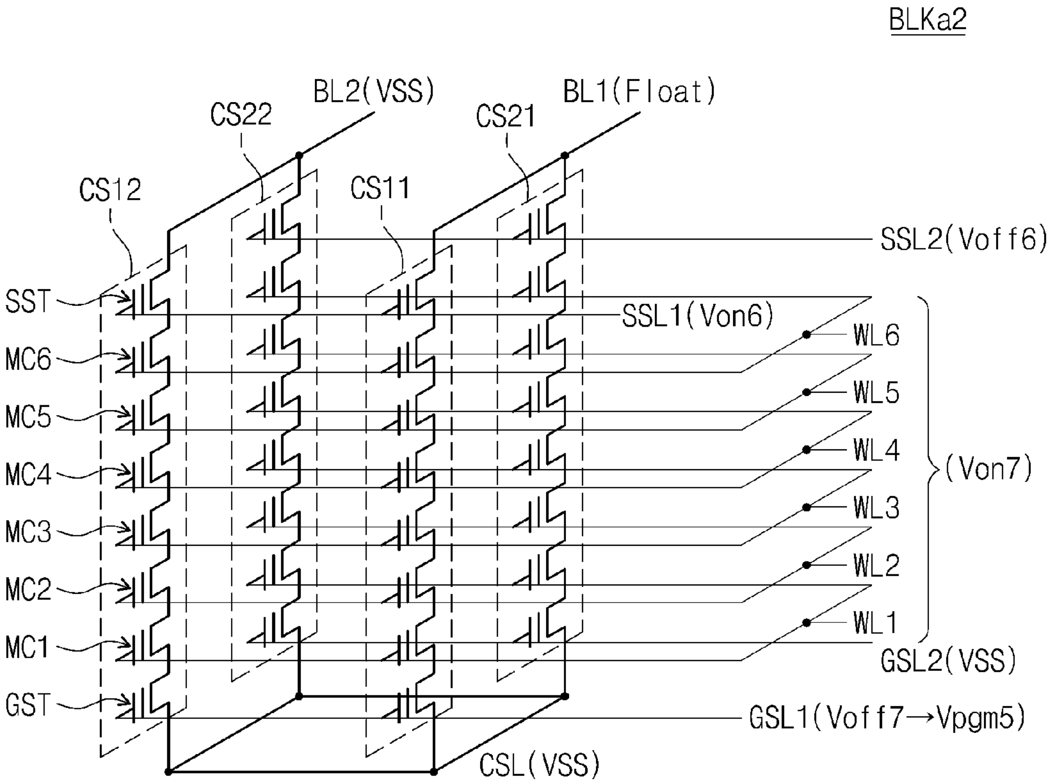
FIG. 25 is a circuit diagram illustrating an equivalent circuit to which the voltage conditions in FIG. 24 are applied.

FIG. 24 is a table illustrating voltage conditions for programming of ground selection transistors according to an exemplary embodiment of the inventive concept. FIG. 25 is a circuit diagram illustrating an equivalent circuit to which the voltage conditions in FIG. 24 are applied. FIG. 26 is a table illustrating programming conditions of ground selection transistors of the equivalent circuit in FIG. 25.

Referring to FIGS. 24 to 26, a selected bit line (e.g., a first bit line BL1) may be floated. A ground voltage VSS may be supplied to an unselected bit line (e.g., a second bit line BL2).

A sixth turn-on voltage Von6 may be supplied to a selected string selection line (e.g., a first string selection line SSL1). The sixth turn-on voltage Von6 may be a voltage sufficient to turn on selected string selection transistors. The sixth turn-on voltage Von6 may be a power supply voltage VCC, a non-selection read ground voltage Vread, or a pass voltage Vpass. A sixth turn-off voltage Voff6 may be supplied to an unselected string selection line (e.g., a second string selection line SSL2). The sixth turn-off voltage Voff6 may have a level sufficient to turn off unselected string selection transistors. The sixth turn-off voltage Voff6 may be the ground voltage VSS.

A seventh turn-on voltage Von7 may be supplied to word lines WL1 to WL6. The seventh turn-on voltage Von7 may be a voltage sufficient to turn on memory cells MC1 to MC6. The seventh turn-on voltage Von7 may be the power supply voltage VCC, the non-selection read voltage Vread, or the pass voltage Vpass.

After a seventh turn-off voltage Voff7 is supplied to a selected ground selection line (e.g., a first ground selection line GSL1), a fifth program voltage Vpgm5 may be supplied to the first ground selection line GSL1. The seventh turn-off voltage Voff7 may be a voltage sufficient to turn off selected ground selection transistors GST. The seventh turn-off voltage Voff7 may be the ground voltage VSS. The fifth program voltage Vpgm5 may be a high voltage. The ground voltage VSS may be supplied to an unselected ground selection line (e.g., a second ground selection line GSL2).

The ground voltage VSS may be supplied to a common source line CSL.

According to an embodiment, when voltages are supplied to the bit lines BL1 and BL2, the string selection lines SSL1 and SSL2, the common source line CSL, and the word lines WL1 to WL6, the seventh turn-off voltage Voff7 may be supplied to the selected ground selection line GSL1. After voltages supplied to the bit lines BL1 and BL2, the string selection lines SSL1 and SSL2, the common source line CSL, and the word lines WL1 to WL6 reach their target values, the fifth program voltage Vpgm5 may be supplied to the selected ground selection line GSL1.

Since selected string selection transistors are turned on, cell strings CS11 and CS12 connected with the selected string selection line SSL1 may be electrically connected with the bit lines BL1 and BL2. Since unselected string selection transistors are turned on, cell strings CS21 and CS22 connected with the unselected string selection line SSL2 may be electrically isolated from the bit lines BL1 and BL2.

When the seventh turn-on voltage Von7 is supplied to the word line WL1 to WL6, the memory cells MC1 to MC6 may be turned on. Since the selected bit line BL1 is floated, in the cell string CS11 connected with the selected bit line BL1 and the selected ground selection line GSL1, channel voltages of memory cells may be boosted by the coupling with the word line WL1 to WL6. According to an embodiment, channel voltages of the memory cells MC1 to MC6 may be boosted to a fourth floating voltage VF4. The fourth floating voltage VF4 may be applied to an end of a ground selection transistor of the cell string CS11, and the ground voltage VSS may be applied to another end of the ground selection transistor of the cell string CS11. A voltage difference between the fourth floating voltage VF4 and the ground voltage VSS may generate hot carriers at the ground selection transistor of the cell string CS11. When the fifth program voltage Vpgm5 is supplied to the selected ground selection line GSL1, the hot carriers may be injected to the ground selection transistor of the cell string CS11. In the cell string CS11 connected with the selected bit line BL1 and the selected ground selection line GSL1, the ground selection transistor may be programmed.

Since the ground voltage VSS is supplied to the unselected bit line BL2, in a cell string CS12 connected with the unselected bit line BL2 and the selected ground string selection line SSL1, channel voltages of memory cells may be maintained as the ground voltage VSS. Accordingly, in the cell string CS12 connected with the unselected bit line BL2 and the selected ground selection line GSL1, the ground selection transistor may be inhibited from being programmed.

Unselected ground selection transistors may be turned off. Accordingly, when the seventh turn-on voltage Von7 is supplied to the word lines WL1 to WL6, channel voltages of memory cells of the cell strings CS21 and CS22 connected with the unselected ground selection line GSL2 may be boosted to the fifth floating voltage VF5. The ground voltage VSS may be supplied to the unselected ground selection line GSL2. Accordingly, ground selection transistors of cell strings CS21 and CS22 connected with the unselected ground selection line GSL2 may be inhibited from being programmed.

According to an embodiment, a voltage different in level from the ground voltage VSS may be supplied to the unselected bit line BL2. A positive or negative voltage may be supplied to the unselected bit line BL2. A voltage supplied to the unselected bit line BL2 may have a level sufficient to inhibit generation of hot carriers at a ground selection transistor connected with the selected ground selection line GSL1 and the unselected bit line BL2.

A voltage different in level from the sixth turn-off voltage Voff6 may be supplied to the unselected string selection line SSL2. A turn-on voltage may be supplied to the unselected string selection line SSL2.

According to an embodiment, a voltage different in level from the ground voltage VSS may be supplied to the unselected ground selection line GSL2. A positive or negative voltage may be supplied to the unselected ground selection line GSL2. A voltage supplied to the unselected ground selection line GSL2 may have a level sufficient to inhibit generation of hot carriers at unselected ground selection transistors.

A voltage different in level from the ground voltage VSS may be supplied to the common source line CSL. A positive or negative voltage may be supplied to the common source line CSL. A voltage supplied to the common source line CSL may have a level sufficient to generate hot carriers at a ground selection transistor connected with the selected ground selection line GSL1 and the selected bit line BL1.

According to an embodiment, the fifth program voltage Vpgm5 may be about 9V, and the seventh turn-on voltage Von7 may be about 13V.

Figure 28:
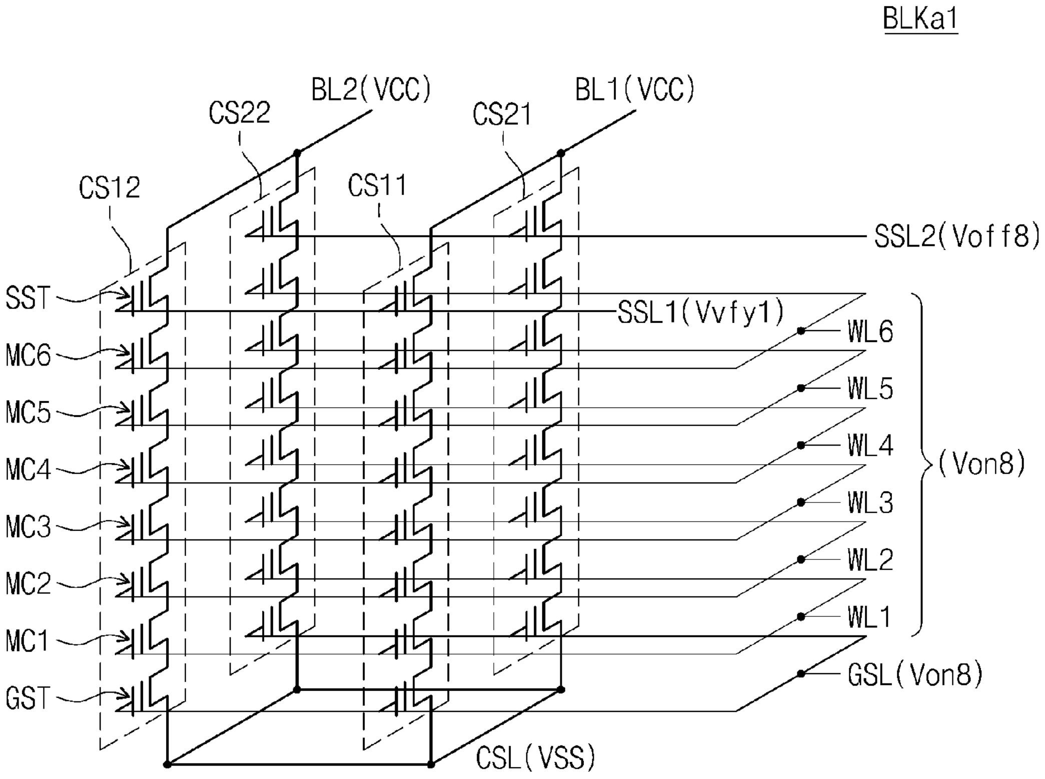
FIG. 28 is a circuit diagram illustrating an equivalent circuit to which the voltage conditions in FIG. 27 are applied.

FIG. 27 is a table illustrating voltage conditions for a verification operation of string selection transistors. FIG. 28 is a circuit diagram illustrating an equivalent circuit to which the voltage conditions in FIG. 27 are applied.

Referring to FIGS. 27 and 28, a power supply voltage VCC may be supplied to bit lines BL1 and BL2. A first verification voltage Vvfy1 may be supplied to a selected string selection line (e.g., a first string selection line SSL1). The first verification voltage Vvfy1 may be a lower limit of a target distribution of threshold voltages of selected string selection transistors. The first verification voltage Vvfy1 may be a ground voltage VSS or a positive voltage. An eighth turn-off voltage Voff8 may be supplied to an unselected ground selection line (e.g., a second string selection line SSL2). The eighth turn-off voltage Voff8 may have a level sufficient to turn off unselected string selection transistors. The eighth turn-off voltage Voff8 may be the ground voltage VSS.

An eighth turn-on voltage Von8 may be supplied to word lines WL1 to WL6 and a ground selection line GSL. The eighth turn-on voltage Von8 may have a level sufficient to turn on memory cells MC1 to MC6 and ground selection transistors GST. The eighth turn-on voltage Von8 may be the power supply voltage VCC, a non-selection read voltage Vread, or a pass voltage Vpass. The ground voltage VSS may be supplied to a common source line CSL.

Since an eighth turn-off voltage Voff8 is supplied to the unselected string selection line SSL2, cell strings CS21 and CS22 connected with the unselected string selection line SSL2 may be electrically isolated from bit lines BL1 and BL2.

Among selected string selection transistors, a string selection transistor having a threshold voltage higher than the first verification voltage Vvfy1 may be turned off, and a string selection transistor having a threshold voltage lower than the first verification voltage Vvfy1 may be turned on. When a string selection transistor of a cell string CS11 or CS12 connected with the selected string selection line SSL1 is turned on, a current path may be formed between a bit line BL1 or BL2 and a common source line CSL. Accordingly, a current of the bit line BL1 or BL2 may be discharged, so that a voltage of the bit line BL1 or BL2 is varied.

When a string selection transistor of a cell string CS11 or CS12 connected with the selected string selection line SSL1 is turned off, no current path may be formed between the bit line BL1 or BL2 and the common source line CSL. Accordingly, a current of the bit line BL1 or BL2 may not be discharged, so that a voltage of the bit line BL1 or BL2 is not varied. Program-completed string selection transistors of the selected string selection transistors may be discriminated by detecting a variation of a current or voltage of the bit lines BL1 and BL2.

When a plurality of ground selection lines GSL1 and GSL2 are provided like an equivalent circuit BLKa2 illustrated in FIG. 15, a turn-on voltage may be supplied in common to the ground selection lines GSL1 and GSL2. According to an embodiment, a turn-on voltage may be supplied to a selected ground selection line (e.g., a first ground selection line GSL1), and a turn-off voltage may be supplied to an unselected ground selection line (e.g., a second ground selection line GSL2).

Figure 30:
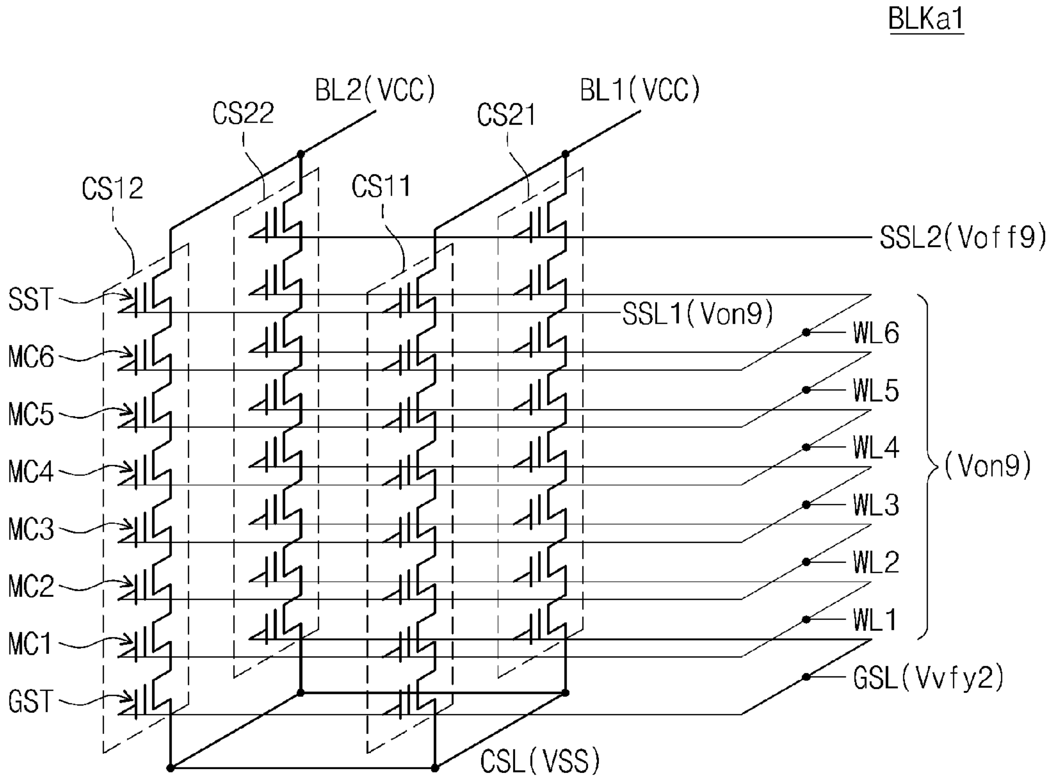
FIG. 30 is a circuit diagram illustrating an equivalent circuit to which the voltage conditions in FIG. 29 are applied.

FIG. 29 is a table illustrating voltage conditions for a verification operation of ground selection transistors. FIG. 30 is a circuit diagram illustrating an equivalent circuit to which the voltage conditions in FIG. 29 are applied.

Referring to FIGS. 29 and 30, a power supply voltage VCC may be supplied to bit lines BL1 and BL2.

A ninth turn-on voltage Von9 may be supplied to word lines WL1 to WL6 and a selected string selection line (e.g., a first string selection line SSL1). The ninth turn-on voltage Von9 may have a level sufficient to turn on memory cells MC1 to MC6 and selected string selection transistors. The ninth turn-on voltage Von9 may be a power supply voltage VCC, a non-selection read voltage Vread, or a pass voltage Vpass. The ground voltage VSS may be supplied to a common source line CSL. A ninth turn-off voltage Voff9 may be supplied to an unselected ground selection line (e.g., a second ground selection line GSL2). The ninth turn-off voltage Voff9 may have a level sufficient to turn off unselected string selection transistors.

A second verification voltage Vvfy2 may be supplied to a ground selection line GSL. The second verification voltage Vvfy2 may have a lower limit of a target distribution of threshold voltages of ground selection transistors. The second verification voltage Vvfy2 may be a ground voltage VSS or a positive voltage.

Since the ninth turn-off voltage Voff9 is supplied to the unselected string selection line SSL2, cell strings CS21 and CS22 connected with the unselected string selection line SSL2 may be electrically isolated from bit lines BL1 and BL2. Since the ninth turn-on voltage Von9 is supplied to the selected string selection line SSL1, cell strings CS11 and CS12 connected with the selected string selection line SSL1 may be electrically connected electrically with the bit lines BL1 and BL2.

Among ground selection transistors, a ground selection transistor having a threshold voltage higher than the second verification voltage Vvfy2 may be turned off, and a ground selection transistor having a threshold voltage lower than the second verification voltage Vvfy2 may be turned on. When a ground selection transistor of a cell string CS11 or CS12 connected with the selected string selection line SSL1 is turned on, a current path may be formed between a bit line BL1 or BL2 and a common source line CSL. Accordingly, a current of the bit line BL1 or BL2 may be discharged, so that a voltage of the bit line BL1 or BL2 is varied.

When a ground selection transistor of the cell string CS11 or CS12 connected with the selected string selection line SSL1 is turned off, the bit line BL1 or BL2 may be electrically isolated from the common source line CSL. Accordingly, no current may be discharged from the bit line BL1 or BL2. For example, a voltage of the bit line BL1 or BL2 is not varied. Program-completed ground selection transistors of the ground selection transistors may be discriminated by detecting a variation of a current or voltage of the bit lines BL1 and BL2.

When a plurality of ground selection lines GSL1 and GSL2 are provided like an equivalent circuit BLKa2 illustrated in FIG. 15, the second verification voltage Vvfy2 may be supplied in common to the ground selection lines GSL1 and GSL2. According to an embodiment, the second verification voltage Vvfy2 may be supplied to a selected ground selection line (e.g., a first ground selection line GSL1), and any voltage may be supplied to an unselected ground selection line (e.g., a second ground selection line GSL2).

Figure 31:
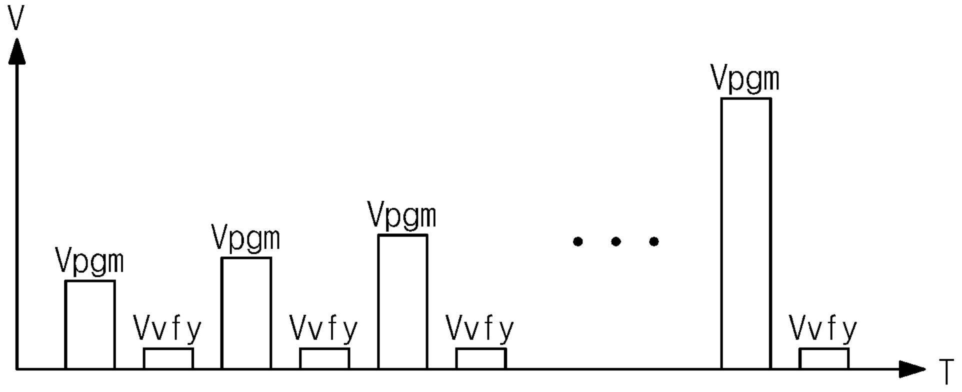
FIG. 31 is a graph illustrating programming and verification procedures.

FIG. 31 is a graph illustrating programming and verification procedures. In FIG. 31, a horizontal axis may indicate a time T, and a vertical axis may indicate a voltage V. Referring to FIG. 31, a program voltage Vpgm and a verification voltage Vvfy may be alternately supplied. After one program operation is executed, one verification operation may be performed. One program operation and one verification operation may constitute a program loop.

When a program loop is iterated, the program voltage Vpgm may gradually increase. For example, an incremental step pulse programming may be performed. The program loop may be iterated until selected string selection transistors or selected ground selection transistors are all programmed.

Figure 32:
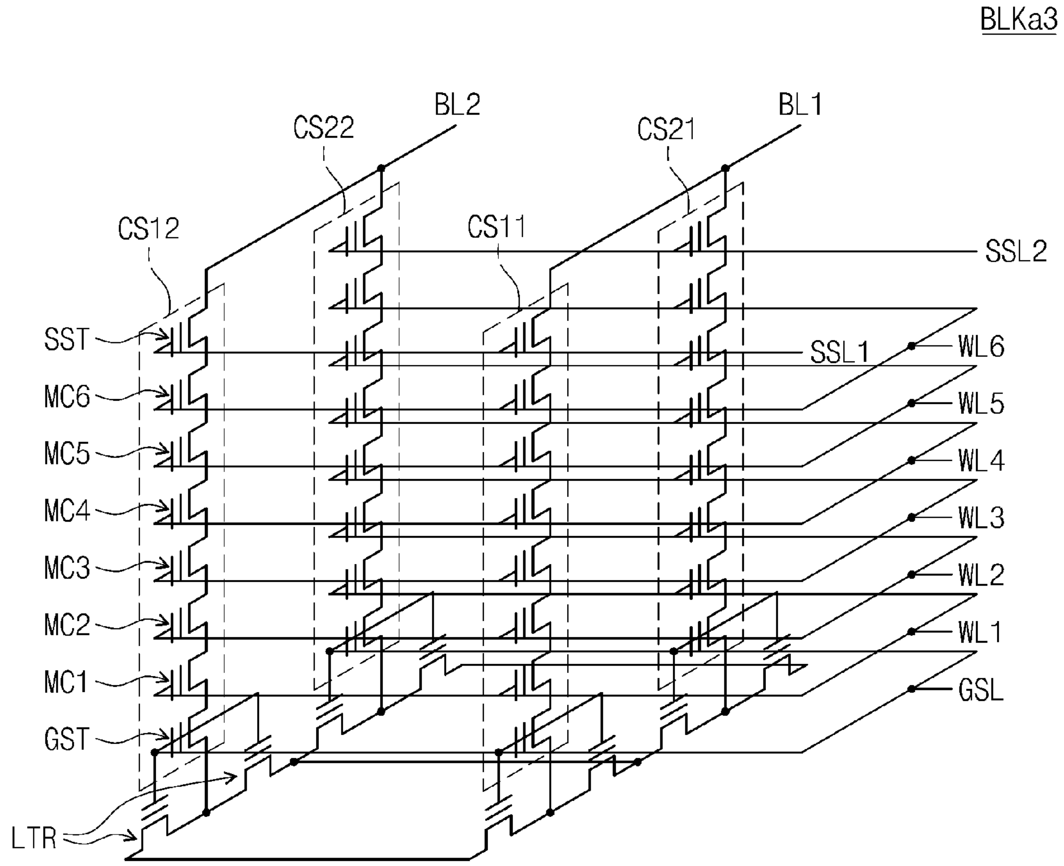
FIG. 32 is a circuit diagram illustrating an equivalent circuit of the part EC of FIG. 3 according to an exemplary embodiment of the inventive concept.

FIG. 32 is a circuit diagram illustrating an equivalent circuit of the part EC of FIG. 3 according to an exemplary embodiment of the inventive concept. An equivalent circuit BLKa3 in FIG. 32 may be different from the equivalent circuit BLKa1 in FIG. 7 in that lateral transistors LTR are added in each cell string.

Referring to FIGS. 3 to 6 and 32, lateral transistors LTR in each cell string may be connected between a ground selection transistor GST and a common source line CSL. Gates of the lateral transistors LTR in each cell string may be connected to a ground selection line GSL together with a gate (or, a control gate) of a ground selection transistor GST in the cell string.

Channel films 114 may operate as vertical bodies of the first conductive materials CM1. The first conductive materials CM1 may constitute vertical transistors together with the channel films 114. The first conductive materials CM1 and the channel films 14 may constitute ground selection transistors GST perpendicular to a substrate 111.

Information storage films 116 may be provided between the substrate 111 and the first conductive materials CM1. The substrate 111 may act as a horizontal body of the first conductive materials CM1. The first conductive materials CM1 may form the vertical transistors LTR together with the substrate 111.

When a voltage is applied to the first conductive materials CM1, an electric field may be generated between the first conductive materials CM1 and the channel films 114. The electric field may form channels at the channel films 114. When a voltage is applied to the first conductive materials CM1, an electric field may be generated between the first conductive materials CM1 and the substrate 111. The electric field may form channels at the substrate 111. Channels formed at the substrate 111 may be coupled with common source regions CSR and the channel films 114. When a voltage is applied to the ground selection line GSL, the ground selection transistors GST and the lateral transistors LTR may be turned on, which enables cell strings CS11, CS12, CS21, and CS22 to be connected with a common source line CSL.

According to an exemplary embodiment, like the equivalent circuit BLKa2 described in FIG. 15, the first conductive materials CM1 may constitute a plurality of ground selection lines (not shown).

Figure 33:
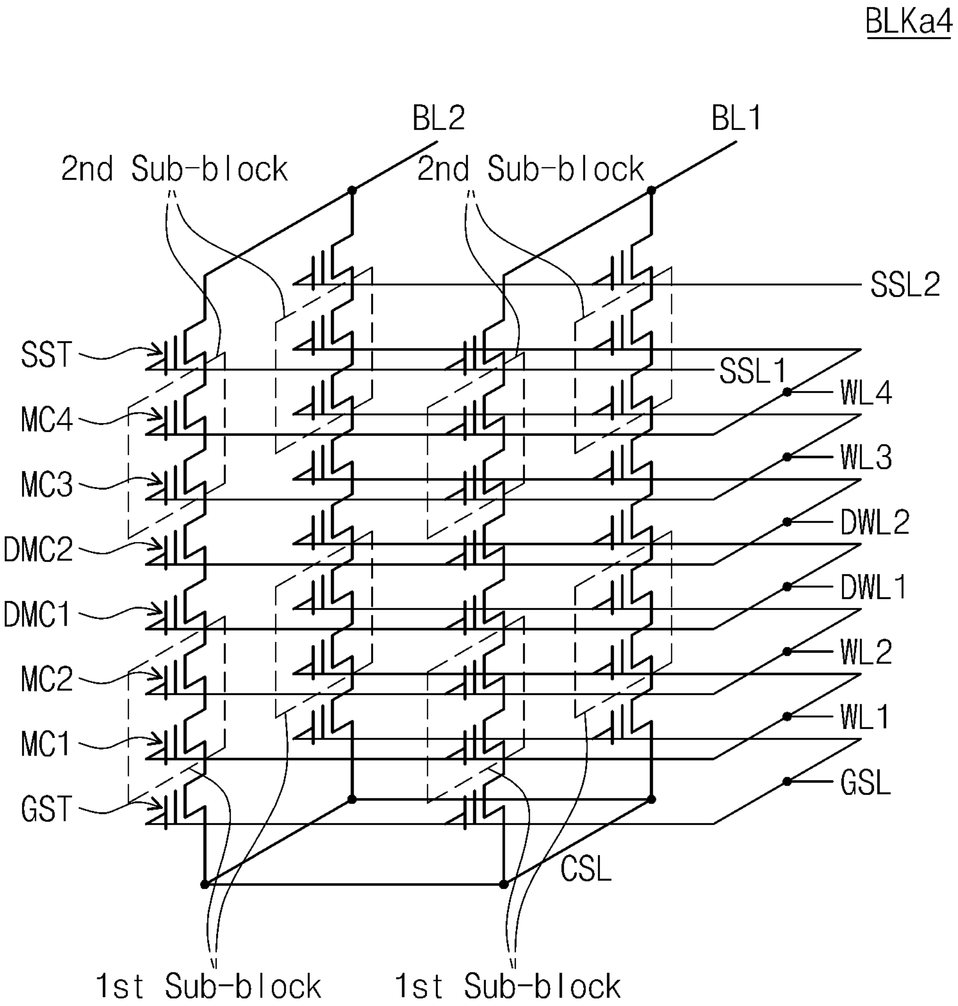
FIG. 33 is a circuit diagram illustrating an equivalent circuit of the part EC of FIG. 3 according to an exemplary embodiment of the inventive concept.

FIG. 33 is a circuit diagram illustrating an equivalent circuit of the part EC of FIG. 3 according to an exemplary embodiment of the inventive concept. Referring to FIGS. 3 to 6 and 33, a plurality of sub blocks may be provided. According to an embodiment, the second and third conductive materials CM2 and CM3 may constitute the first and second memory cells MC1 and MC2, which are used as a first sub block. The sixth and seventh conductive materials CM6 and CM7 may constitute the third and fourth memory cells MC3 and MC4, which are used as a second sub block. The fourth and fifth conductive materials CM4 and CM5 may constitute the first and second dummy memory cells DMC1 and DMC2 between the first and second sub blocks. The first and second sub blocks may be programmed, read, and erased independently from each other.

According to an exemplary embodiment, like the equivalent circuit BLKa2 described in FIG. 15, the first conductive materials CM1 may constitute a plurality of ground selection lines (not shown). Like the equivalent circuit BLKa3 described in FIG. 32, horizontal transistors (not shown) may be provided.

String selection transistors SST may be programmed in accordance with the method described with reference to FIGS. 9 to 11. When the string selection transistors SST are programmed, the same voltage may be supplied to word lines WL1 to WL4 and dummy word lines DWL1 and DWL2. The first turn-on voltage Voff1 may be supplied to the dummy word lines DWL1 and DWL2.

String selection transistors SST may be programmed in accordance with the method described with reference to FIGS. 21 to 23. When the string selection transistors SST are programmed, the same voltage may be supplied to the word lines WL1 to WL4 and the dummy word lines DWL1 and DWL2. The fifth turn-on voltage Voff5 may be supplied to the dummy word lines DWL1 and DWL2.

Ground selection transistors GST may be programmed in accordance with the method described with reference to FIGS. 12 to 14. When the ground selection transistors GST are programmed, the same voltage may be supplied to the word lines WL1 to WL4 and the dummy word lines DWL1 and DWL2. The second turn-on voltage Voff1 may be supplied to the dummy word lines DWL1 and DWL2.

Ground selection transistors GST may be programmed in accordance with the method described with reference to FIGS. 16 to 18. When the ground selection transistors GST are programmed, the same voltage may be supplied to the word lines WL1 to WL4 and the dummy word lines DWL1 and DWL2. The fourth turn-on voltage Voff4 may be supplied to the dummy word lines DWL1 and DWL2.

Ground selection transistors GST may be programmed in accordance with the method described with reference to FIGS. 24 to 26. When the ground selection transistors GST are programmed, the same voltage may be supplied to the word lines WL1 to WL4 and the dummy word lines DWL1 and DWL2. The seventh turn-on voltage Voff7 may be supplied to the dummy word lines DWL1 and DWL2.

Figure 34:
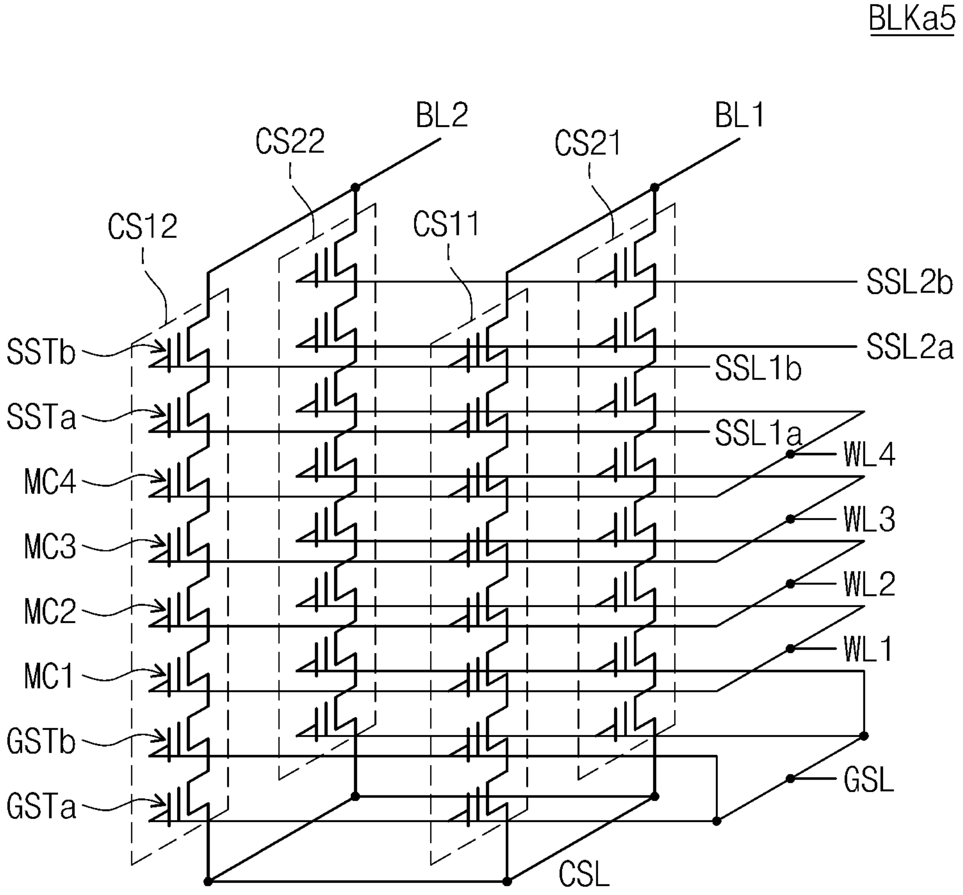
FIG. 34 is a circuit diagram illustrating an equivalent circuit of the part EC of FIG. 3 according to an exemplary embodiment of the inventive concept.

FIG. 34 is a circuit diagram illustrating an equivalent circuit of the part EC of FIG. 3 according to an exemplary embodiment of the inventive concept. Referring to FIGS. 3 to 6, and 34, the first and second conductive materials CM1 and CM2 may constitute ground selection transistors GSTa and GSTb each having the first and second heights. The seventh and eighth conductive materials CM7 and CM8 may constitute string selection transistors SSTa and SSTb respectively having seventh and eighth heights. The third to sixth conductive materials CM3 to CM6 may constitute the first to fourth memory cells MC1 to MC4.

The first and second conductive materials CM1 and CM2 may be connected in common to form a ground selection line GSL. The first conductive material CM1 may be connected in common to form a ground selection line (not shown) having the first height. The second conductive material CM2 may be connected in common to form a ground selection line (not shown) having the second height.

Like the equivalent circuit BLKa2 described with reference to FIG. 15, cell strings CS11 and CS12 may be connected with one ground selection line (not shown), and cell strings CS21 and CS22 may be connected with the other ground selection line (not shown). The cell strings CS11 and CS12 may be connected with two ground selection lines (not shown) which have the first and second heights, respectively, and are formed by the first and second conductive materials CM1 and CM2. The cell strings CS21 and CS22 may be connected with two ground selection lines (not shown) which have the first and second heights, respectively, and are formed by the first and second conductive materials CM1 and CM2. Conductive materials corresponding to at least three heights can form ground selection transistors.

According to an exemplary embodiment, like the equivalent circuit BLKa3 described with reference to FIG. 32, horizontal transistors (not shown) may be provided. Like the equivalent circuit BLKa4 described with reference to FIG. 33, memory cells MC1 to MC4 may constitute a plurality of sub blocks.

String selection transistors SSTa and SSTb may be programmed in accordance with the method described with reference to FIGS. 9 to 11. When the string selection transistors SSTa having the seventh height are programmed, a turn-on voltage may be supplied to string selection lines SSL1*b* and SSL2*b* having the eighth height. When the string selection transistors SSTb having the eighth height are programmed, a turn-off voltage may be supplied to string selection lines SSL1*a* and SSL2*a* having the seventh height.

String selection transistors SST may be programmed in accordance with the method described with reference to FIGS. 21 to 23. When the string selection transistors SSTa having the seventh height are programmed, a turn-on voltage may be supplied to string selection lines SSL1*b* and SSL2*b* having the eighth height. When the string selection transistors SSTb having the eighth height are programmed, a turn-off voltage may be supplied to string selection lines SSL1*a* and SSL2*a* having the seventh height.

Ground selection transistors GSTa and GSTb may be programmed in accordance with the method described with reference to FIGS. 12 to 14, 16 to 18, and 24 to 26. When the ground selection transistors GSTa and GSTb share one ground selection line GSL, they may be programmed at a time.

Figure 35:
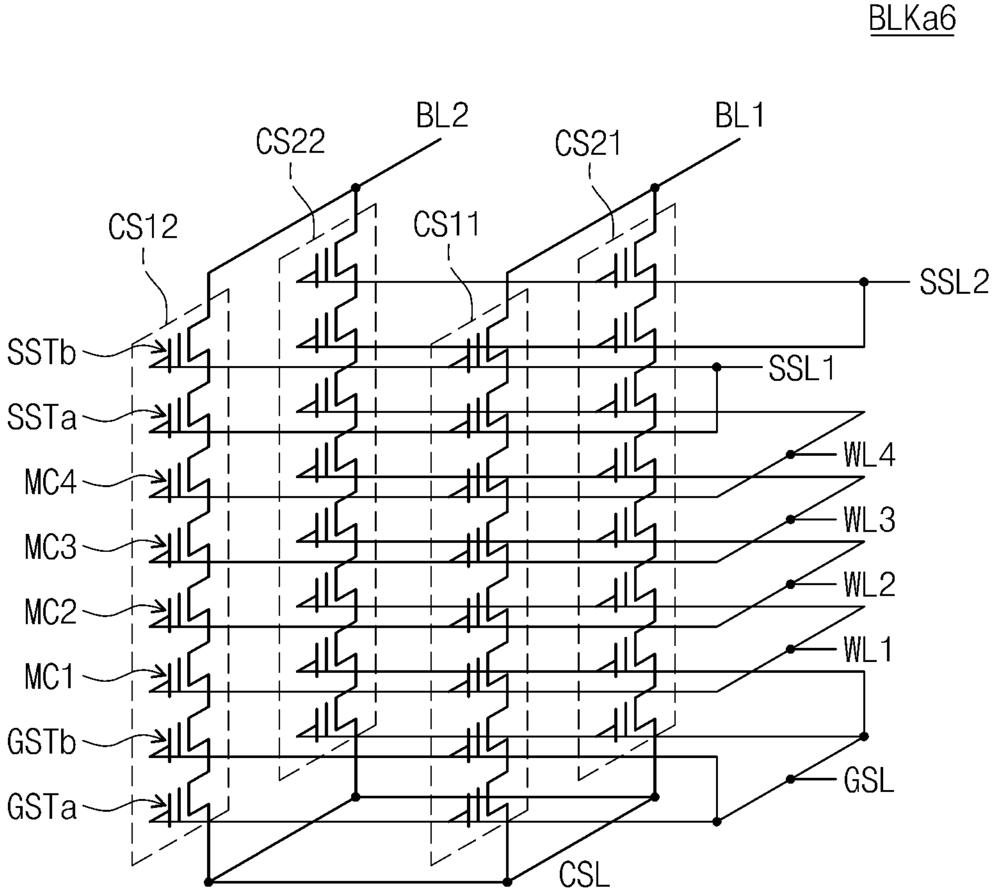
FIG. 35 is a circuit diagram illustrating an equivalent circuit of the part EC of FIG. 3 according to an exemplary embodiment of the inventive concept.

FIG. 35 is a circuit diagram illustrating an equivalent circuit of the part EC of FIG. 3 according to an exemplary embodiment of the inventive concept. An equivalent circuit BLKa6 in FIG. 35 may be different from that BLKa5 in FIG. 34 in that string selection transistors SSTa and SSTb share a string selection line. String selection transistors SSTa and SSTb in cell strings CS11 and CS12 may be connected in common to the first string selection line SSL1, and string selection transistors SSTa and SSTb in cell strings CS21 and CS22 may be connected in common to the second string selection line SSL2.

According to an exemplary embodiment, like the equivalent circuit BLKa2 described in FIG. 15, a plurality of ground selection lines (not shown) may be provided. Like the equivalent circuit BLKa3 described with reference to FIG. 32, horizontal transistors (not shown) may be provided. Like the equivalent circuit BLKa4 described with reference to FIG. 33, memory cells MC1 to MC4 may constitute a plurality of sub blocks.

String selection transistors SSTa and SSTb may be programmed in accordance with the methods described with reference to FIGS. 9 to 11 and 21 to 23. Ground selection transistors GSTa and GSTb may be programmed in accordance with the methods described with reference to FIGS. 12 to 14, 16 to 18, and 24 to 26.

Figure 36:
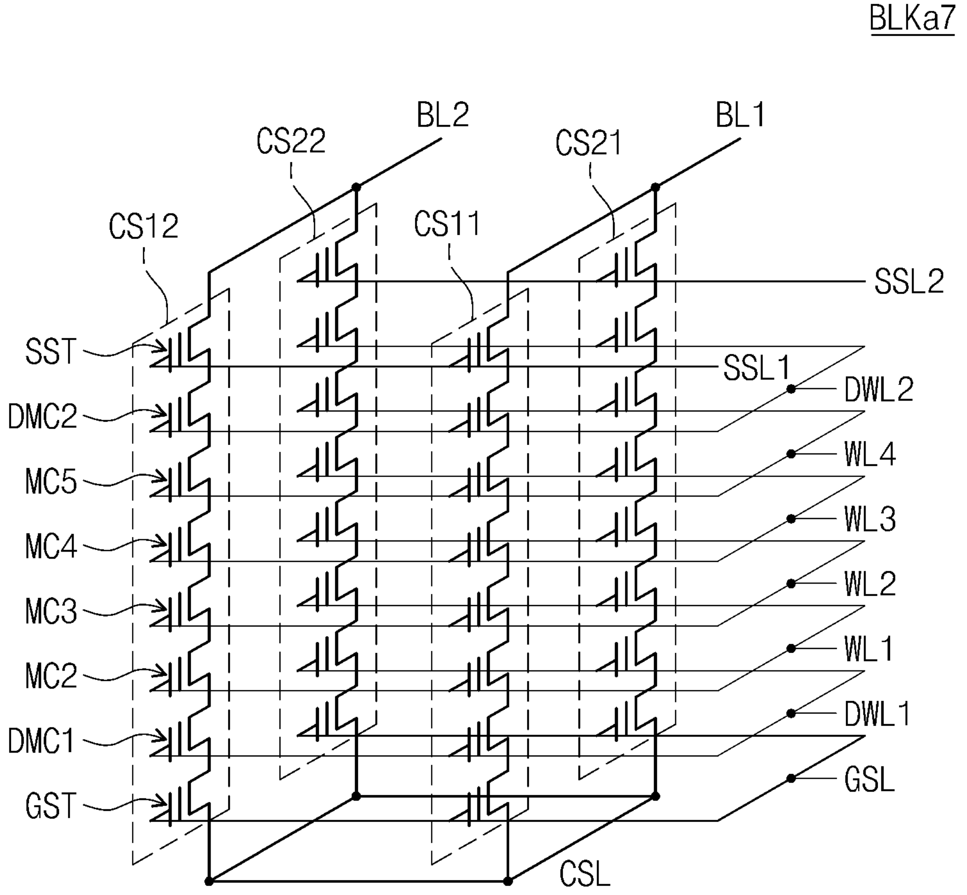
FIG. 36 is a circuit diagram illustrating an equivalent circuit of the part EC of FIG. 3 according to an exemplary embodiment of the inventive concept.

FIG. 36 is a circuit diagram illustrating an equivalent circuit of the part EC of FIG. 3 according to still another exemplary embodiment of the inventive concept. Referring to FIGS. 3 to 6 and 36, the second conductive materials CM2 may constitute the first dummy memory cells DMC1, and the seventh conductive materials CM7 may constitute the second dummy memory cells DMC2.

According to an exemplary embodiment, conductive materials corresponding to two or more heights may constitute dummy memory cells (not shown) between memory cells and a ground selection transistor GST. Conductive materials corresponding to two or more heights may constitute dummy memory cells (not shown) between memory cells and a string selection transistor SST. Dummy memory cells (not shown) can be adjacent to any one of the ground and string selection transistors GST and SST.

According to an exemplary embodiment, like the equivalent circuit BLKa2 described in FIG. 15, a plurality of ground selection lines (not shown) may be provided. Like the equivalent circuit BLKa3 described with reference to FIG. 32, horizontal transistors (not shown) may be provided. Like the equivalent circuit BLKa4 described with reference to FIG. 33, memory cells MC1 to MC4 may constitute a plurality of sub blocks. Like equivalent circuits BLKa5 and BLKa6 described with reference to FIGS. 34 and 35, each cell string may include a plurality of string selection transistors (not shown) and a plurality of ground selection transistors (not shown).

String selection transistors SST may be programmed in accordance with the methods described with reference to FIGS. 9 to 11 and 21 to 23. Ground selection transistors GST may be programmed in accordance with the methods described with reference to FIGS. 12 to 14, 16 to 18, and 24 to 26. When the string or ground selection transistors SST or GST are programmed, dummy word lines DWL1 and DWL2 may be supplied with the same voltage as supplied to word lines WL1 to WL4.

Figure 37:
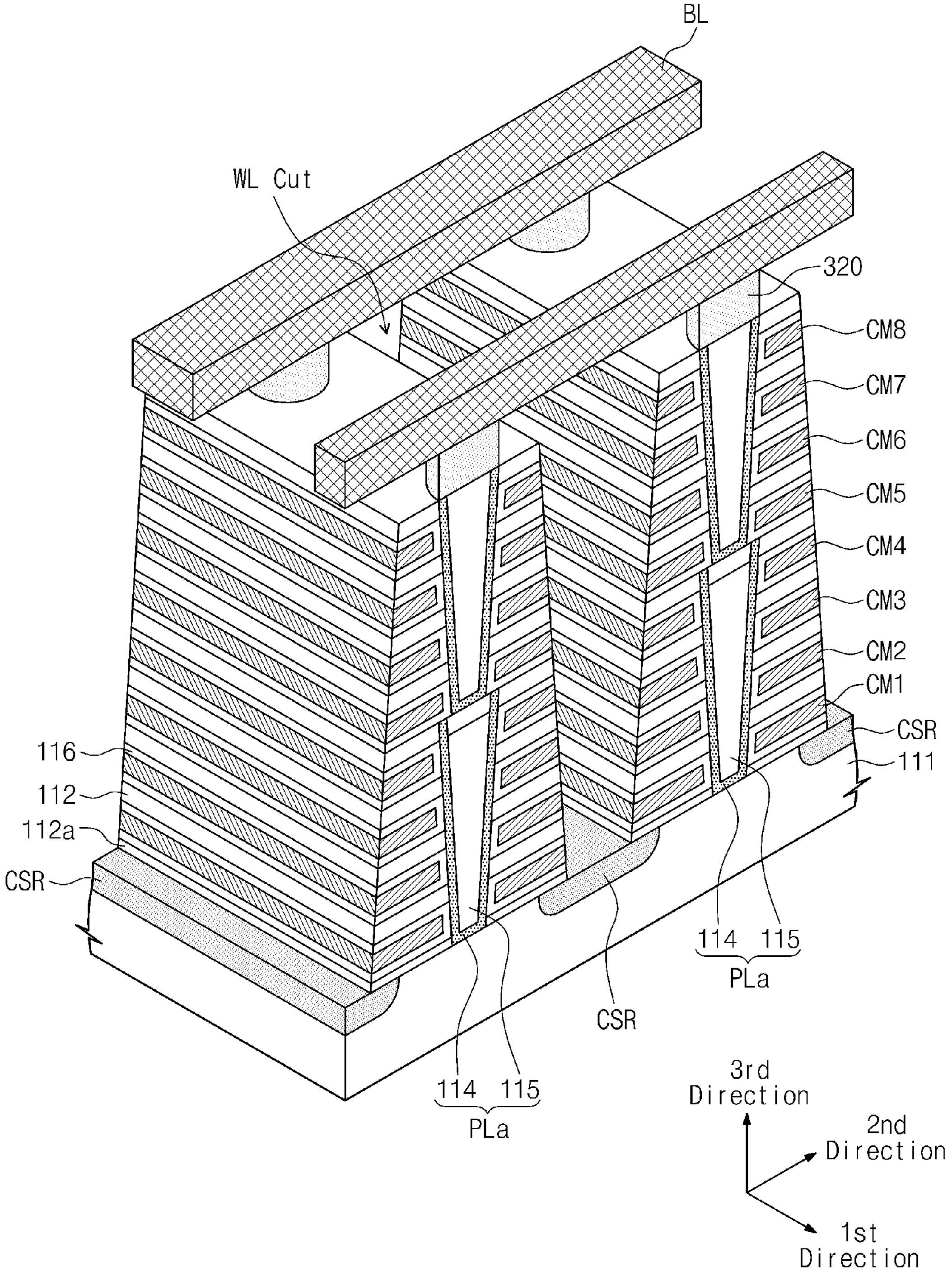
FIG. 37 is a perspective view taken along the line IV-IV' in FIG. 3 according to an exemplary embodiment of the inventive concept.
Figure 38:
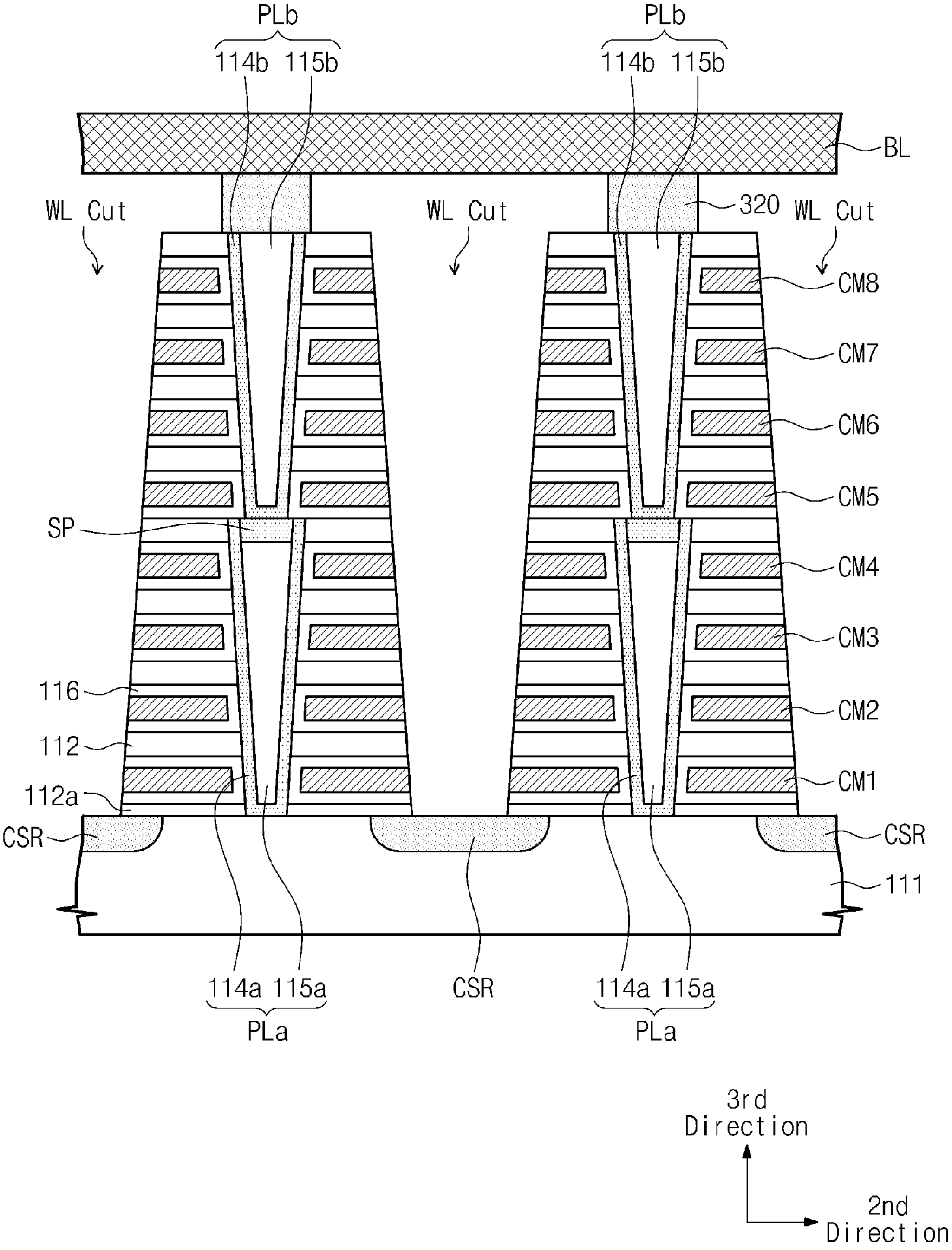
FIG. 38 is a cross-sectional view taken along the line IV-IV' in FIG. 3 according to an exemplary embodiment of the inventive concept.

FIG. 37 is a perspective view taken along the line IV-IV' in FIG. 3 according to an exemplary embodiment of the inventive concept. FIG. 38 is a cross-sectional view taken along the line IV-IV' in FIG. 3 according to an exemplary embodiment of the inventive concept. Referring to FIGS. 3, 37, and 38, lower pillars PLa and upper pillars PLb may be stacked in a direction perpendicular to a substrate 111.

The lower pillars PLa may penetrate insulation films 112 and 112*a* along the third direction and may contact the substrate 111. Each of the lower pillars PLa may include a lower channel film 114*a* and a lower inner material 115*a*. The lower channel films 114*a* may include a semiconductor material having the same conductivity type as the substrate 111 or an intrinsic semiconductor. The lower channel films 114*a* may act as vertical bodies of the first to fourth conductive materials CM1 and CM4, respectively. The lower inner materials 115*a* may include an insulation material.

The upper pillars PLb may be provided on the lower pillars PLa, respectively. The upper pillars PLb may penetrate the insulation films 112 along the third direction and may contact upper surfaces of the lower pillars PLa. Each of the upper pillars PLb may include an upper channel film 114*b* and an upper inner material 115*b*. The upper channel films 114*b* may include a semiconductor material having the same conductivity type as the lower channel films 114*a* or an intrinsic semiconductor. The upper channel films 114*b* may act as vertical bodies of the fifth to eighth conductive materials CM5 and CM8, respectively. The upper inner materials 115*b* may include an insulation material.

The lower channel films 114*a* and the upper channel films 114*b* may be connected to each other and act as vertical bodies. For example, semiconductor pads SP may be provided at the lower pillars PLa, respectively. The semiconductor pads SP may include a semiconductor material having the same conductivity type as the lower channel films 114*a* or an intrinsic semiconductor. The lower channel films 114*a* and the upper channel films 114*b* may be interconnected via the semiconductor pads SP.

According to an embodiment, among the first to eighth conductive materials CM1 to CM8, conductive materials adjacent to the semiconductor pads SP may constitute dummy word lines and dummy memory cells. For example, the fourth conductive material CM4, the fifth conductive material CM5, or the fourth and fifth conductive materials CM4 and CM5 may constitute dummy word lines and dummy memory cells.

Figure 39:
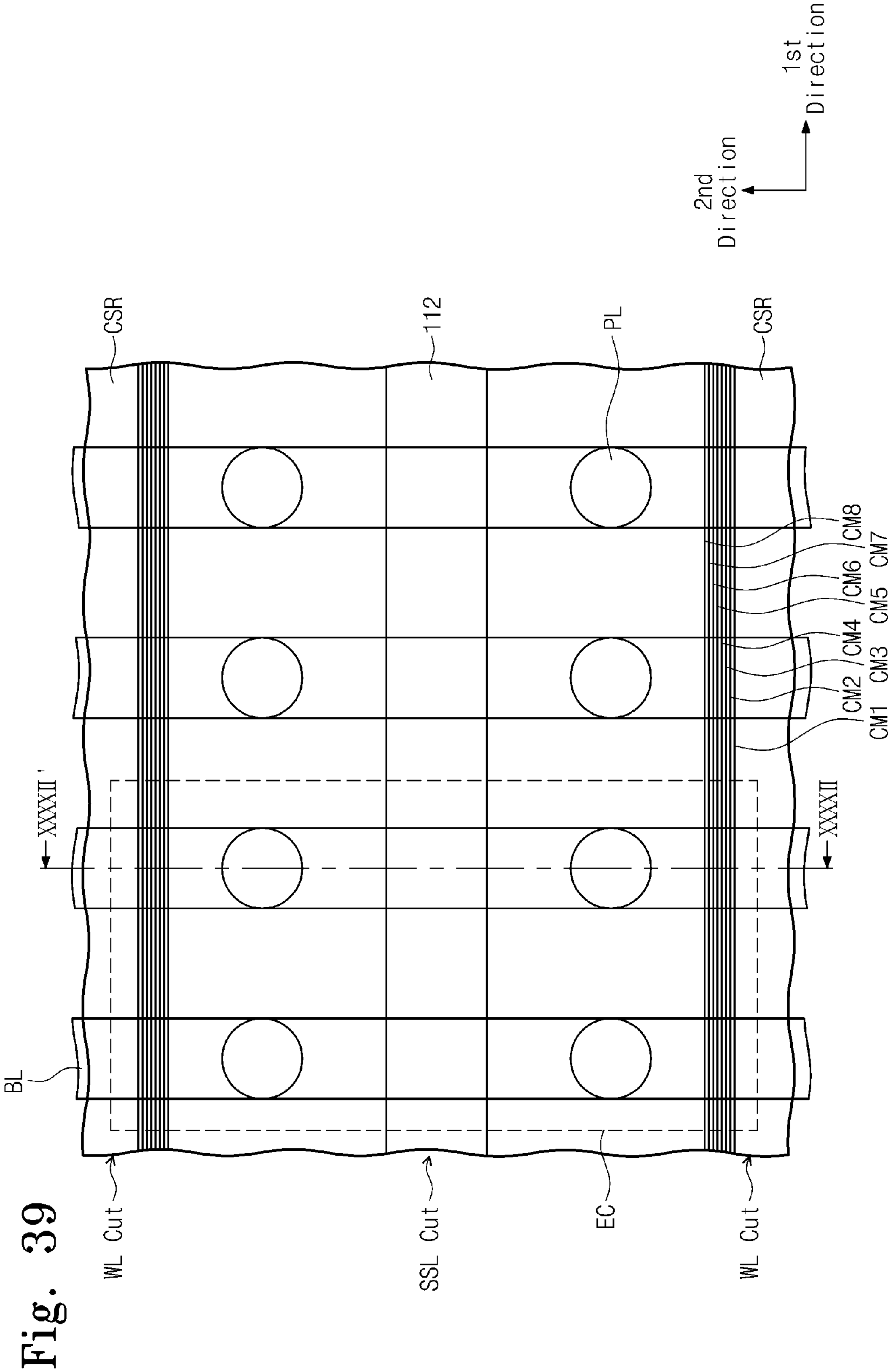
FIG. 39 is a plan view illustrating one of the memory blocks in FIG. 2 according to an exemplary embodiment of the inventive concept.
Figure 40:
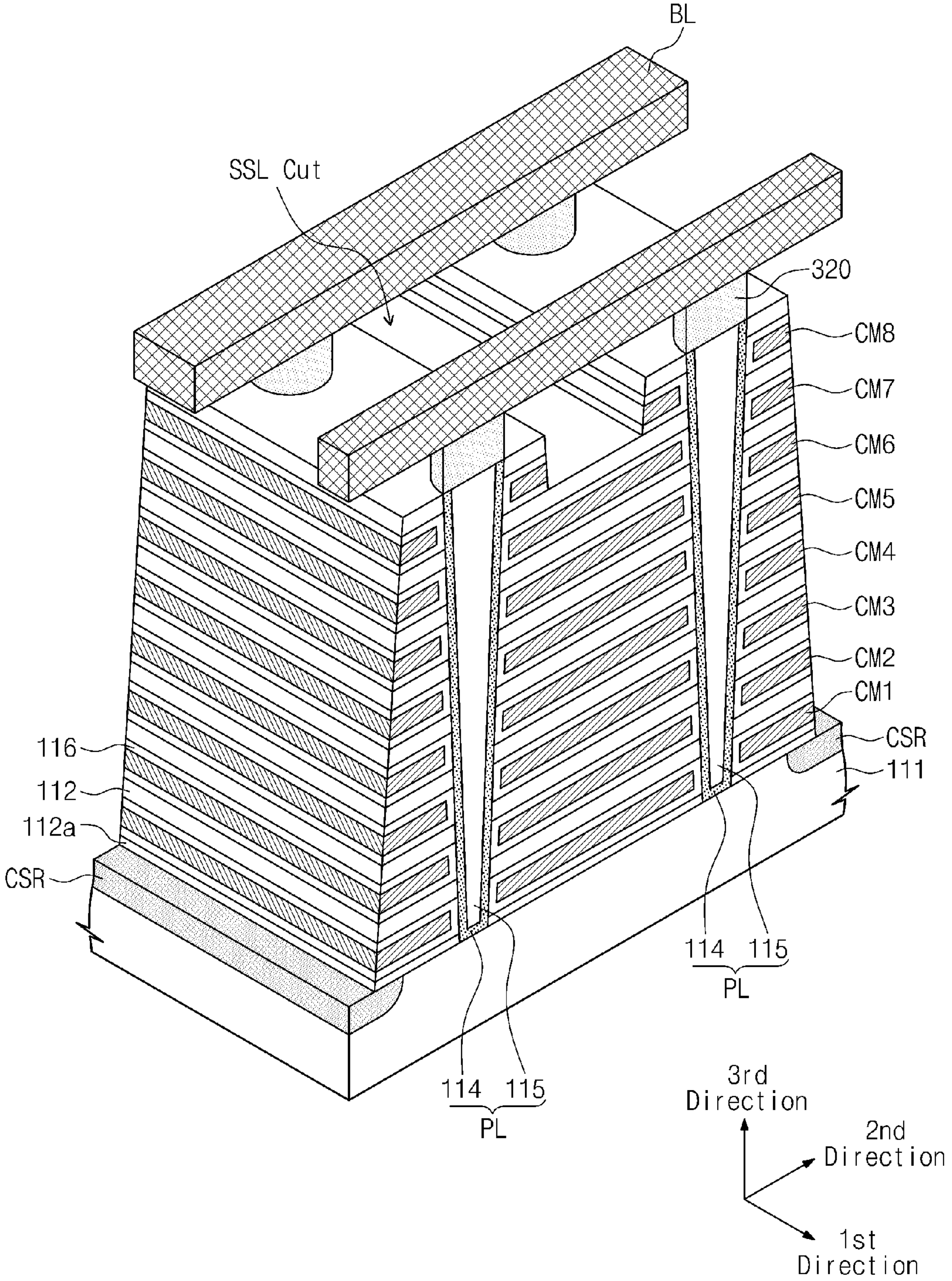
FIG. 40 is a perspective view taken along a line XXXXII-XXXXII' in FIG. 39.
Figure 41:
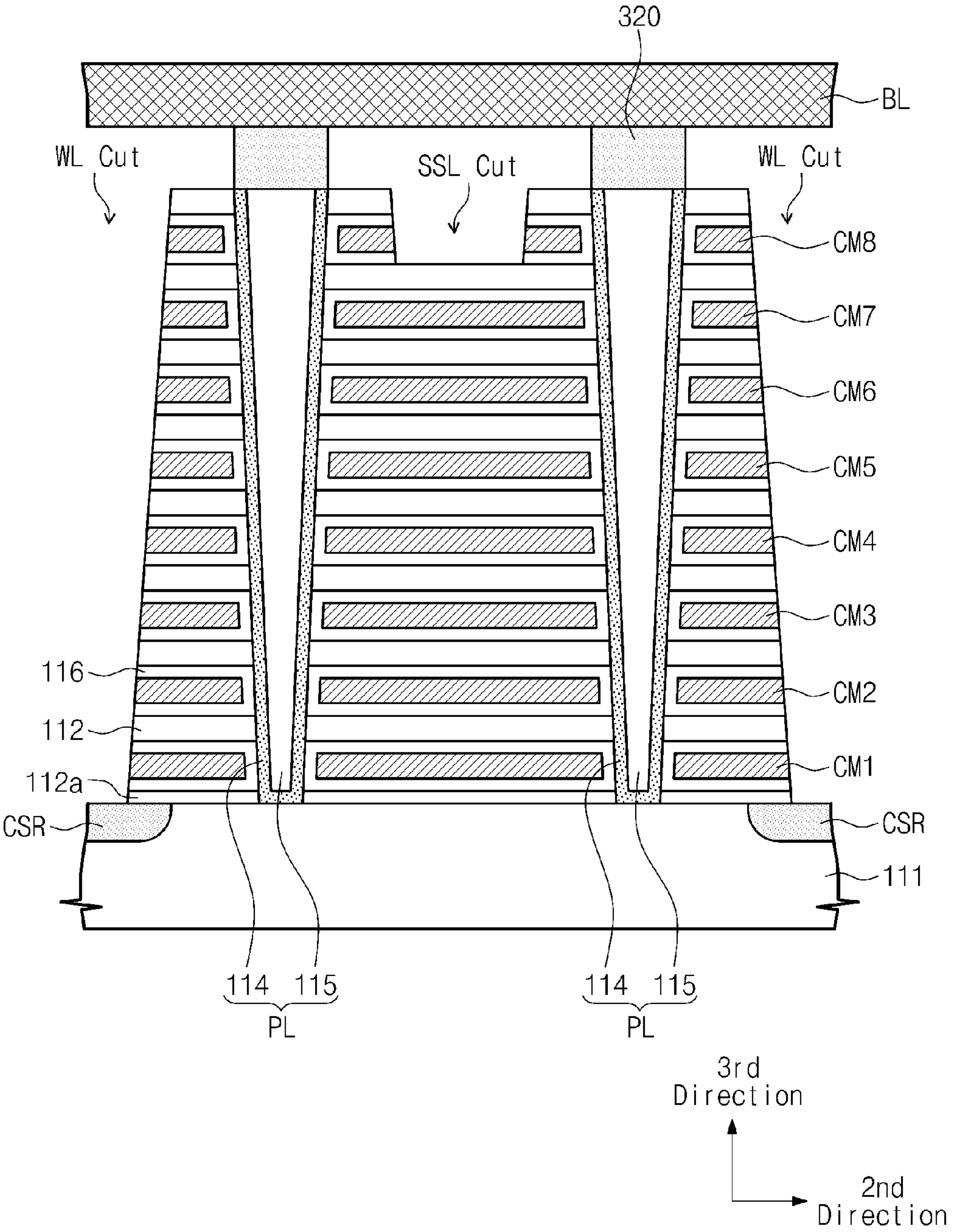
FIG. 41 is a cross-sectional view taken along the line XXXXII-XXXXII' in FIG. 39.

FIG. 39 is a plan view illustrating one of the memory blocks in FIG. 2 according to an exemplary embodiment of the inventive concept. FIG. 40 is a perspective view taken along a line XXXXII-XXXXII' in FIG. 39. FIG. 41 is a cross-sectional view taken along the line XXXXII-XXXXII' in FIG. 39.

As compared with the memory block BLKa described with reference to FIGS. 3 to 6, a string selection line cut SSL Cut and a word line cut WL Cut extending along the first direction may be alternately provided in the second direction. Common source regions CSR may be provided at a substrate 111 exposed by the word line cuts WL Cut.

Pillars PL may be formed in two lines along the first direction between two adjacent common source regions CSR, for example, two adjacent word line cuts WL Cut. The string selection line cut SSL Cut may be formed between two lines of pillars PL. The string selection line cut SSL Cut may separate the eighth conductive lines CM8 constituting string selection transistors SST. When conductive lines of two or more heights constitute string selection transistors SST, the string selection line cut SSL Cut may separate conductive materials of two or more heights.

According to an embodiment, pillars PL can include lower pillars and upper pillars as described in FIGS. 37 and 38.

A part EC of FIG. 39 may correspond to one of the equivalent circuits BLKa1 to BLKa7 in accordance with embodiments of the inventive concept. In a memory block BLKb, string selection transistors SST may be programmed in accordance with the methods described with reference to FIGS. 9 to 11 and 21 to 23. Ground selection transistors GST may be programmed in accordance with the methods described with reference to FIGS. 12 to 14, 16 to 18, and 24 to 26.

Figure 42:
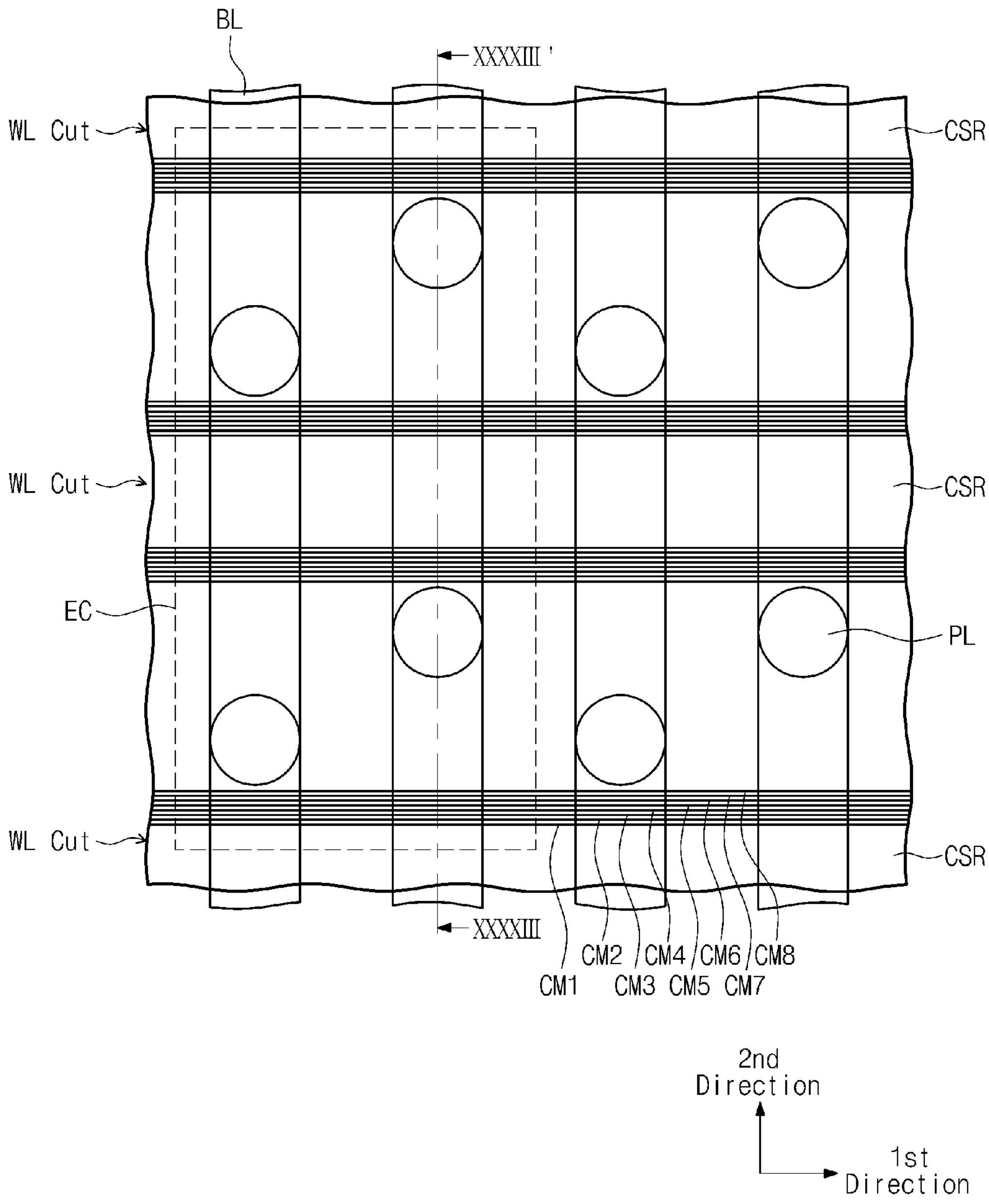
FIG. 42 is a plan view illustrating one of the memory blocks in FIG. 2 according to an exemplary embodiment of the inventive concept.
Figure 43:
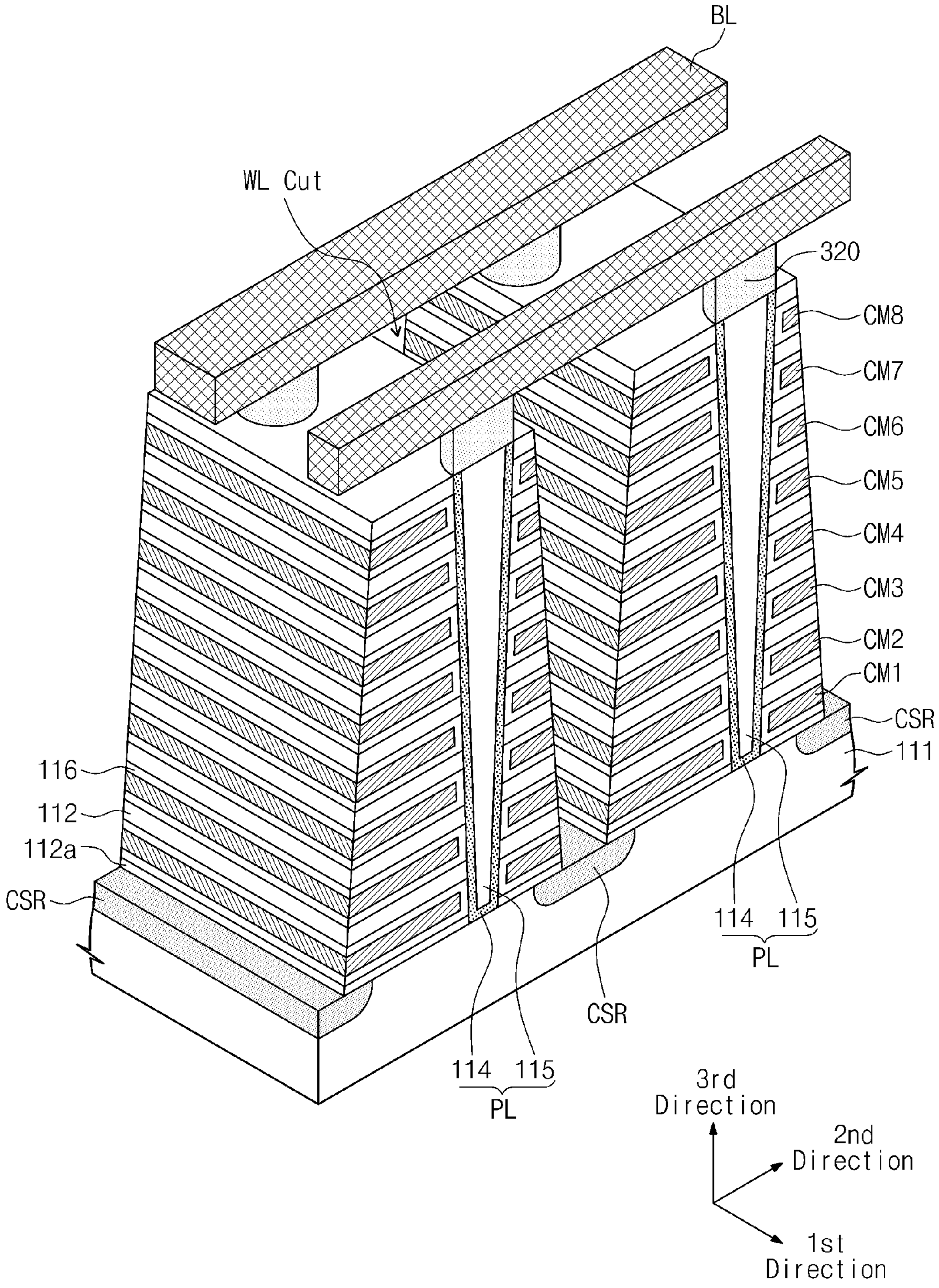
FIG. 43 is a perspective view taken along a line XXXXIII-XXXXIII' in FIG. 42.
Figure 44:
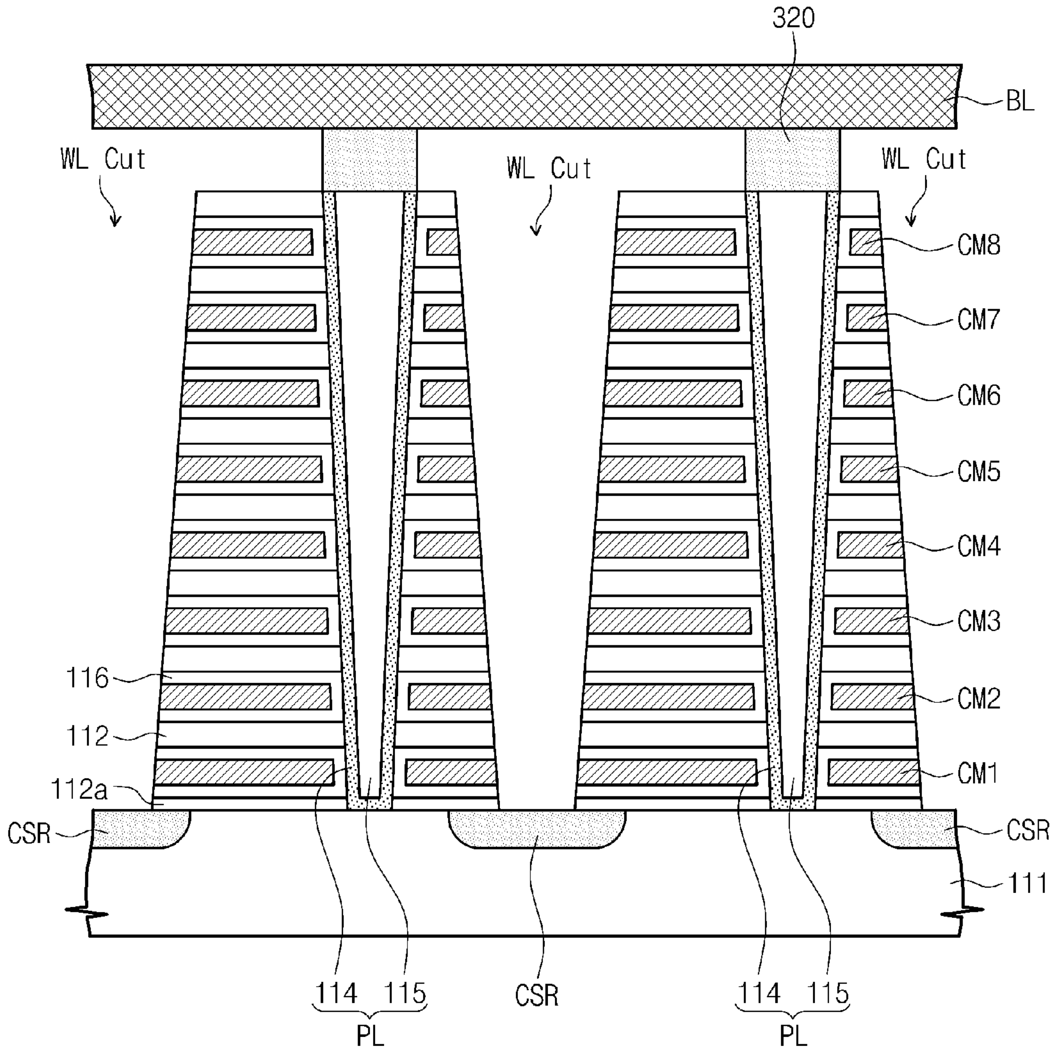
FIG. 44 is a cross-sectional view taken along the line XXXXIII-XXXXIII' in FIG. 42.

FIG. 42 is a plan view illustrating one of the memory blocks in FIG. 2 according to an exemplary embodiment of the inventive concept. FIG. 43 is a perspective view taken along a line XXXXIII-XXXXIII' in FIG. 42. FIG. 44 is a cross-sectional view taken along the line XXXXIII-XXXXIII' in FIG. 42.

As compared with the memory block BLKa described in FIGS. 3 to 6, pillars provided between adjacent common source regions may be disposed in a zigzag shape along the first direction.

According to an embodiment, pillars PL can include lower pillars and upper pillars as described in FIGS. 37 and 38. As described with reference to FIGS. 39 to 41, string selection line cuts SSL Cut may be provided. A line of pillars arranged in a zigzag shape may be provided between a word line cut WL Cut and a string selection line cut SSL Cut which are adjacent to each other.

A part EC of FIG. 42 may correspond to one of the equivalent circuits BLKa1 to BLKa7 in accordance with embodiments of the inventive concept. In a memory block BLKc, string selection transistors SST may be programmed in accordance with the methods described with reference to FIGS. 9 to 11 and 21 to 23. Ground selection transistors GST may be programmed in accordance with the methods described with reference to FIGS. 12 to 14, 16 to 18, and 24 to 26.

Figure 45:
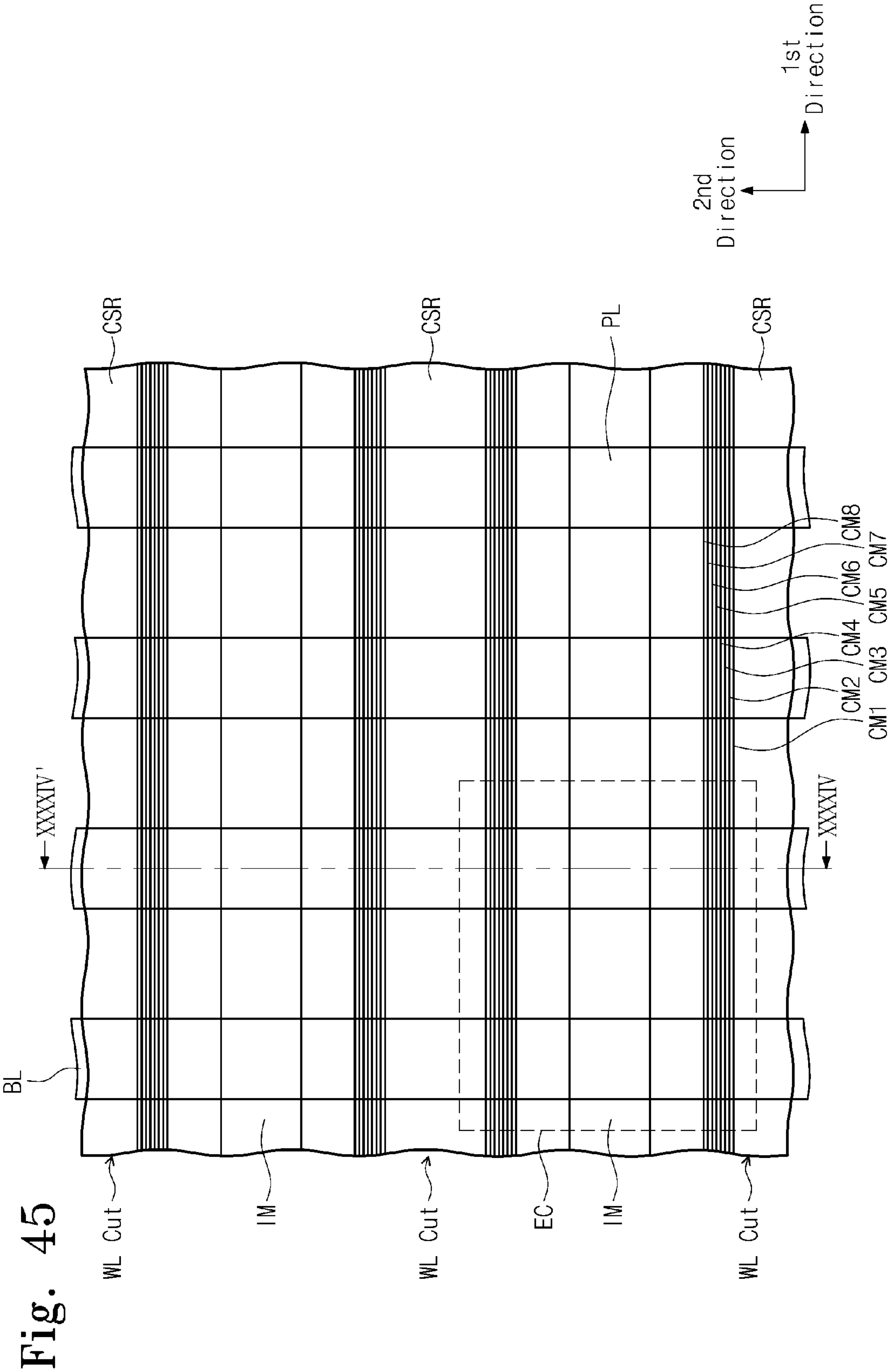
FIG. 45 is a plan view illustrating one of the memory blocks in FIG. 2 according to an exemplary embodiment of the inventive concept.
Figure 46:
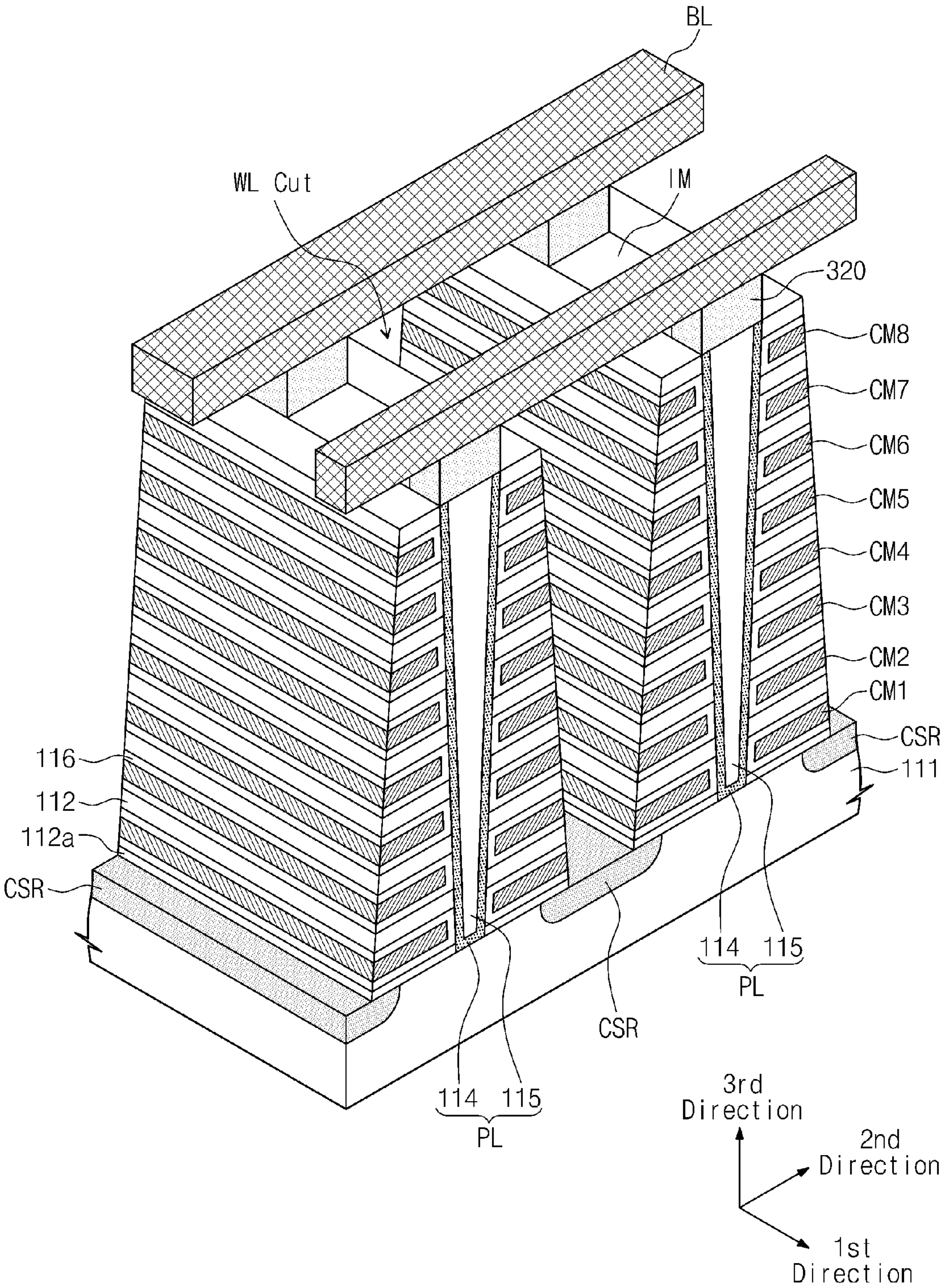
FIG. 46 is a perspective view taken along a line XXXXIV-XXXX IV' in FIG. 45.

FIG. 45 is a plan view illustrating one of the memory blocks in FIG. 2 according to an exemplary embodiment of the inventive concept. FIG. 46 is a perspective view taken along a line XXXXIV-XXXXIV' in FIG. 45. A cross-sectional view taken along the line XXXXIV-XXXXIV' in FIG. 45 may be to the same or substantially the same as FIG. 5.

As compared with the memory block BLKa described in FIGS. 3 to 6, a memory block BLKd may include square pillars PL. Insulation materials IM may be provided between pillars PL. The pillars PL may be disposed in line along the first direction between adjacent common source regions CSR. The insulation materials IM may extend along the third direction and may contact a substrate 111.

Each of the pillars PL may include a channel film 114 and an inner material 115. According to an embodiment, the channel film 114 may be provided on two sides adjacent to conductive materials CM1 to CM8 among four sides of a corresponding pillar, not surrounding the corresponding pillar.

A channel film on one side of each pillar may constitute a cell string together with conductive materials CM1 to CM8 and information storage films 116, and a channel film on another side of the pillar may constitute another cell string together with conductive materials CM1 to CM8 and information storage films 116. For example, one pillar may be used to form two cell strings.

According to an embodiment, pillars PL can include lower pillars and upper pillars as illustrated in FIGS. 37 and 38. As described with reference to FIGS. 39 to 41, string selection line cuts SSL Cut may be provided. As described with reference to FIGS. 42 to 44, pillars may be disposed in a zigzag shape along the first direction.

A part EC of FIG. 45 may correspond to one of the equivalent circuits BLKa1 to BLKa7 in accordance with embodiments of the inventive concept. In a memory block BLKd, string selection transistors SST may be programmed in accordance with the methods described with reference to FIGS. 9 to 11 and 21 to 23. Ground selection transistors GST may be programmed in accordance with the methods described with reference to FIGS. 12 to 14, 16 to 18, and 24 to 26.

Figure 47:
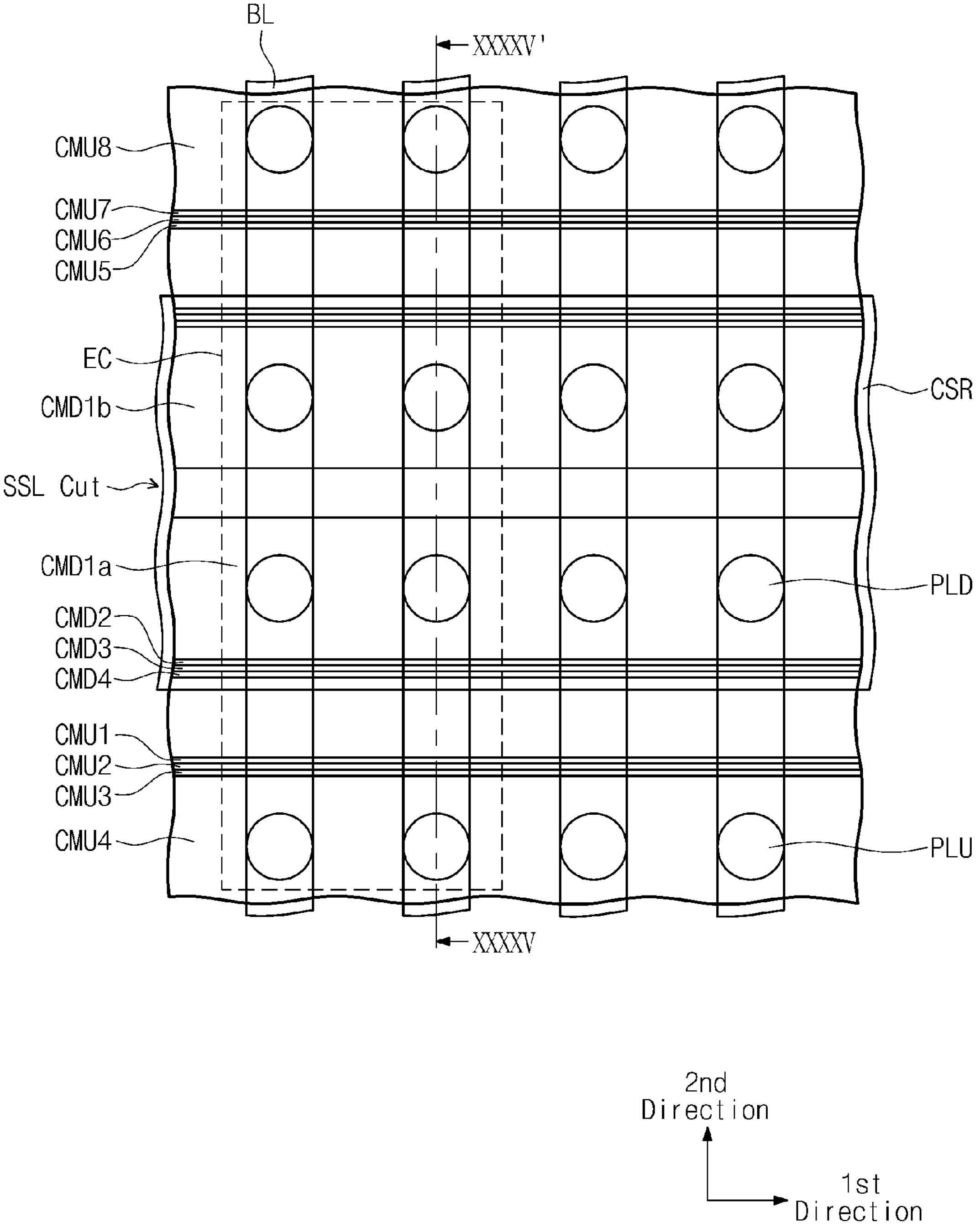
FIG. 47 is a plan view illustrating one of the memory blocks in FIG. 2 according to an exemplary embodiment of the inventive concept.
Figure 48:
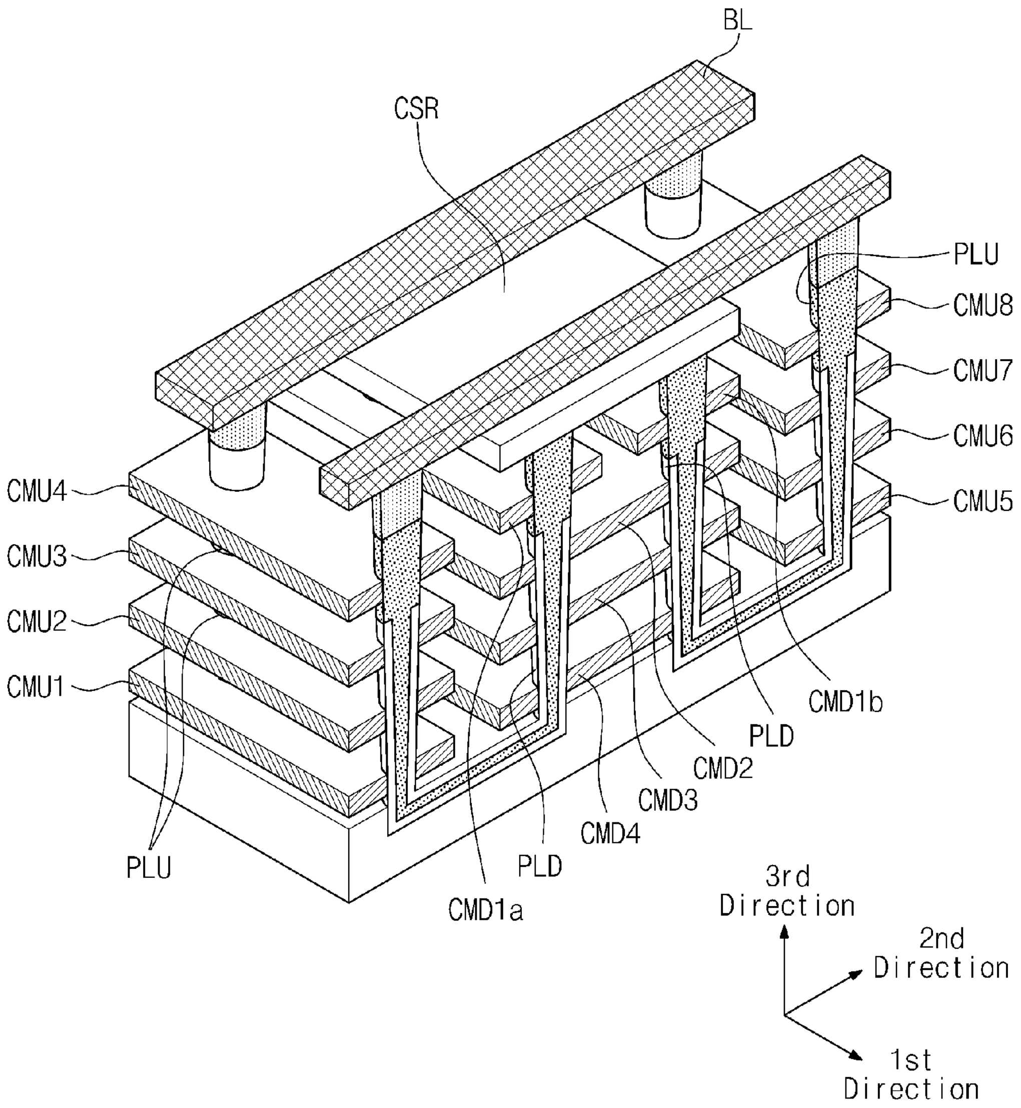
FIG. 48 is a perspective view taken along a line XXXXV-XXXXV' in FIG. 47.
Figure 49:
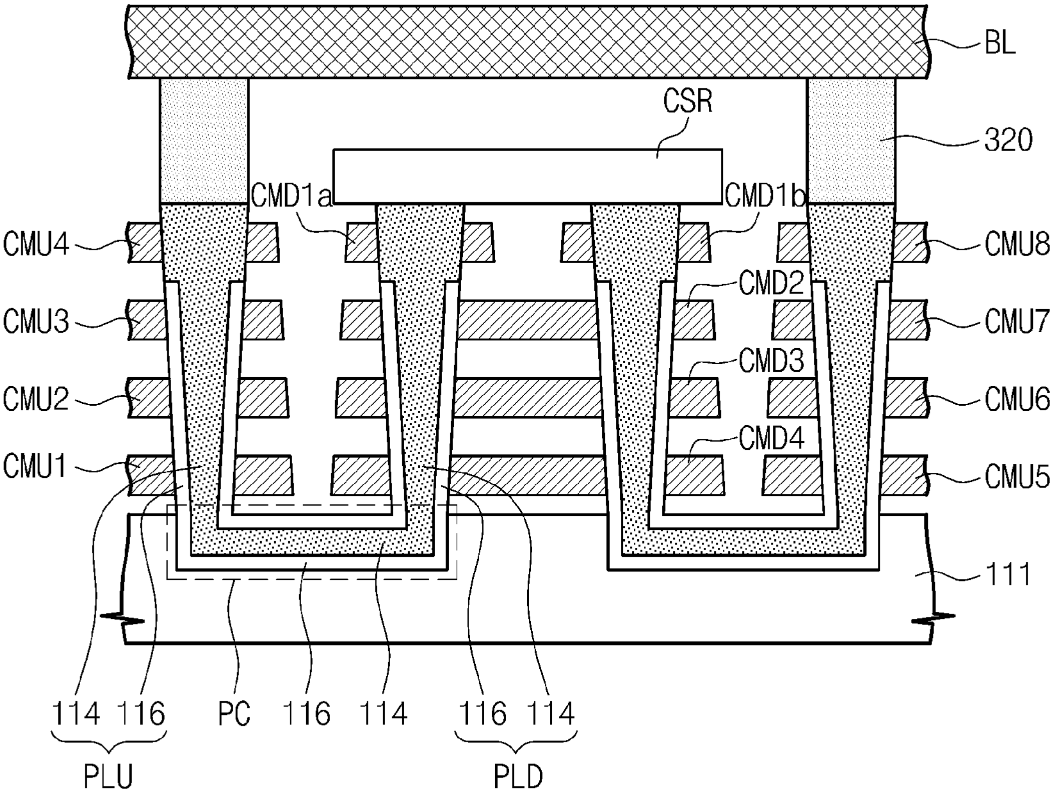
FIG. 49 is a cross-sectional view taken along the line XXXXV-XXXXV' in FIG. 47.

FIG. 47 is a plan view illustrating one of the memory blocks in FIG. 2 according to an exemplary embodiment of the inventive concept. FIG. 48 is a perspective view taken along a line XXXXV-XXXXV' in FIG. 47. FIG. 49 is a cross-sectional view taken along the line XXXXV-XXXXV' in FIG. 47.

Referring to FIGS. 47 to 49, the first to eight upper conductive materials CMU1 to CMU8 extending along the first direction may be provided on a substrate 111. The first to fourth upper conductive materials CMU1 to CMU4 may be stacked in a direction perpendicular to the substrate 111 and spaced apart from one another in a direction perpendicular to the substrate 111. The fifth to eighth upper conductive materials CMU5 to CMU8 may be stacked in a direction perpendicular to the substrate 111 and spaced apart from one another in a direction perpendicular to the substrate 111. A group of the first to fourth upper conductive materials CMU1 to CMU4 may be spaced apart from a group of the fifth to eighth upper conductive materials CMU5 to CMU8 along the second direction.

Lower conductive materials CMD1*a*, CMD1*b*, and CMD2 to CMD4 extending along the first direction may be provided between the first to fourth upper conductive materials CMU1 to CMU4 and the fifth to eighth upper conductive materials CMU5 to CMU8. The lower conductive materials CMD2 to CMD4 may be stacked in a direction perpendicular to the substrate 111 and spaced apart from one another in a direction perpendicular to the substrate 111. The lower conductive materials CMD1*a* and CMD may be provided on the lower conductive material CMD2. The lower conductive materials CM1*a* and CMD1*b* may be spaced apart from each other along the second direction.

A plurality of upper pillars PLU may be configured to penetrate the first to fourth upper conductive materials CMU1 to CMU4 or the fifth to eighth upper conductive materials CMU5 to CMU8 in a direction perpendicular to the substrate 111. The upper pillars PLU may contact the substrate 111. In the first upper conductive materials CMU1, upper pillars may be disposed in a line along the first direction and spaced apart from each other along the first direction. In the eighth upper conductive materials CMU8, upper pillars may be disposed in a line along the first direction and spaced apart from each other along the first direction.

Each of the upper pillars PLU may include an information storage film 116 and a channel film 114. The information storage film 116 may store information by trapping or discharging electric charges. The information storage film 116 may include a tunneling insulation film, a charge trap film, and a blocking insulation film.

The channel films 114 may act as vertical bodies of the upper pillars PLU. The channel films 114 each may include an intrinsic semiconductor. The channel films 114 may include a semiconductor having the same conductivity type (e.g., p-type) as the substrate 111.

A plurality of lower pillars PLD may be formed. The plurality of lower pillars PLD may penetrate the lower conductive materials CMD2 to CMD4 and the lower conductive material CMD1*a* or CMD1*b* in a direction perpendicular to the substrate 111 and may contact the substrate 111. In the lower conductive materials CMD1*a*, lower pillars may be disposed in a line along the first direction and spaced apart from each other along the first direction. In the lower conductive materials CMD1*b*, lower pillars may be disposed in a line along the first direction and spaced apart from each other along the first direction.

Each of the lower pillars PLD may include an information storage film 116 and a channel film 114. The information storage film 116 may store information by trapping or discharging electric charges. The information storage film 116 may include a tunneling insulation film, a charge trap film, and a blocking insulation film.

The channel films 114 may act as vertical bodies of the lower pillars PLD. The channel films 114 each may include an intrinsic semiconductor. The channel films 114 may include a semiconductor having the same conductivity type (e.g., p-type) as the substrate 111.

A plurality of pipeline contacts PC may be provided at the substrate 111. The pipeline contacts PC may extend in a bit line direction and may connect lower surfaces of upper pillars PLU formed at the first upper conductive material CMU1 with lower surfaces of lower pillars PLD formed at the lower conductive material CMD1*a*. The pipeline contacts PC may extend in a bit line direction and may connect lower surfaces of upper pillars PLU formed at the eighth upper conductive material CMU8 with lower surfaces of lower pillars PLD formed at the lower conductive material CMD1*b*.

According to an embodiment, each of the pipeline contacts PC may include a channel film 114 and an information storage film 116. The channel films 114 of the pipeline contacts PC may interconnect the channel films 114 of the upper pillars PLU and channel films of the lower pillars PLD. The information storage films 116 of the pipeline contacts PC may interconnect the information storage films 116 of the upper pillars PLU and the information storage films 116 of the lower pillars PLD.

A common source region CSR extending along the first direction may be provided on the lower pillars PLD. The common source region CSR may extend along the first direction and may be connected with the plurality of lower pillars PLD. The common source region CSR may form a common source line CSL. The common source region CSR may include a metallic material. The common source region CSR may have a conductivity type different from the substrate 111.

Drains 320 may be provided on the upper pillars PLU. The drains 320 may include a semiconductor material having a conductivity type (e.g., n-type) different from the substrate 111. Bit lines BL may be formed on the drains 320. The bit lines BL may be spaced apart from each other along the first direction. The bit lines BL may extend along the second direction and may be connected with the drains 320.

According to an embodiment, the bit lines BL and the drains 320 can be connected to each other via contact plugs, and the common source region CSR and the lower pillars PLD can be connected to each other via contact plugs.

One cell string may include a lower pillar and an upper pillar connected to each other via one pipeline contact.

According to an exemplary embodiment, as illustrated in FIGS. 42 to 44, the upper pillars PLU and the lower pillars PLD can be disposed in a zigzag shape along the first direction.

A part EC of FIG. 47 may correspond to one of the equivalent circuits BLKa1 to BLKa7 in accordance with embodiments of the inventive concept. In a memory block BLKe, string selection transistors SST may be programmed in accordance with the methods described with reference to FIGS. 9 to 11 and 21 to 23. Ground selection transistors GST may be programmed in accordance with the methods described with reference to FIGS. 12 to 14, 16 to 18, and 24 to 26.

Figure 50:
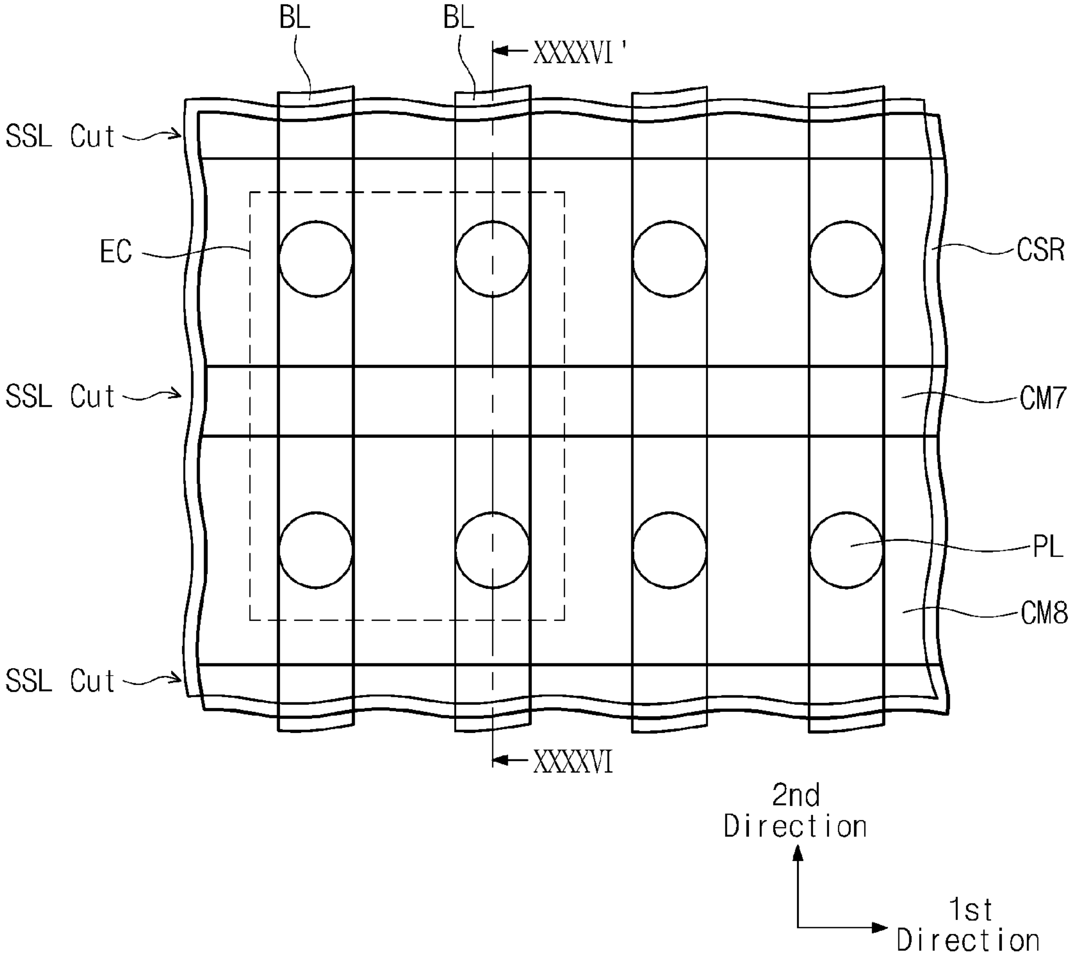
FIG. 50 is a plan view illustrating one of the memory blocks in FIG. 2 according to an exemplary embodiment of the inventive concept.
Figure 51:
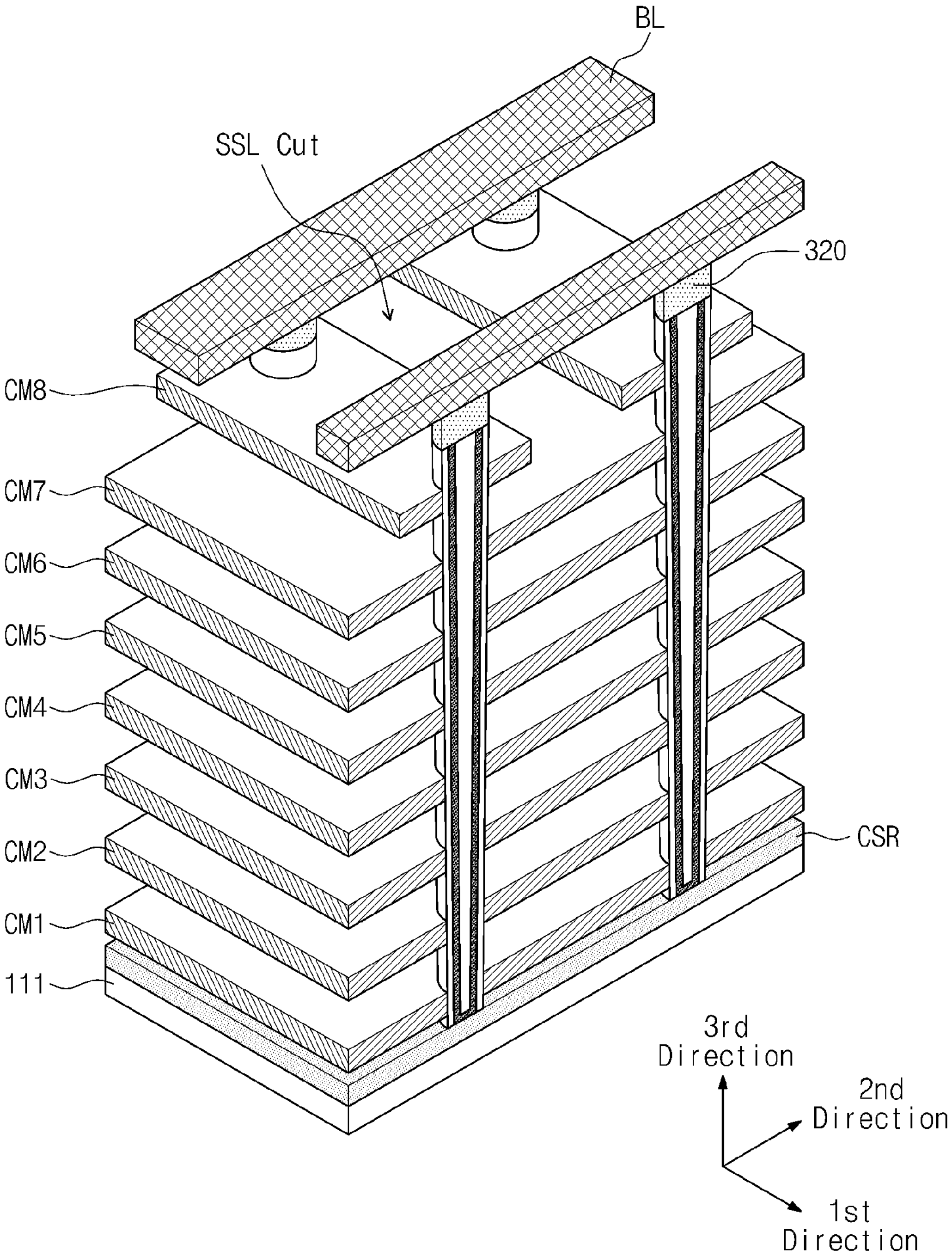
FIG. 51 is a perspective view taken along a line XXXXVI-XXXXVI' in FIG. 50.
Figure 52:
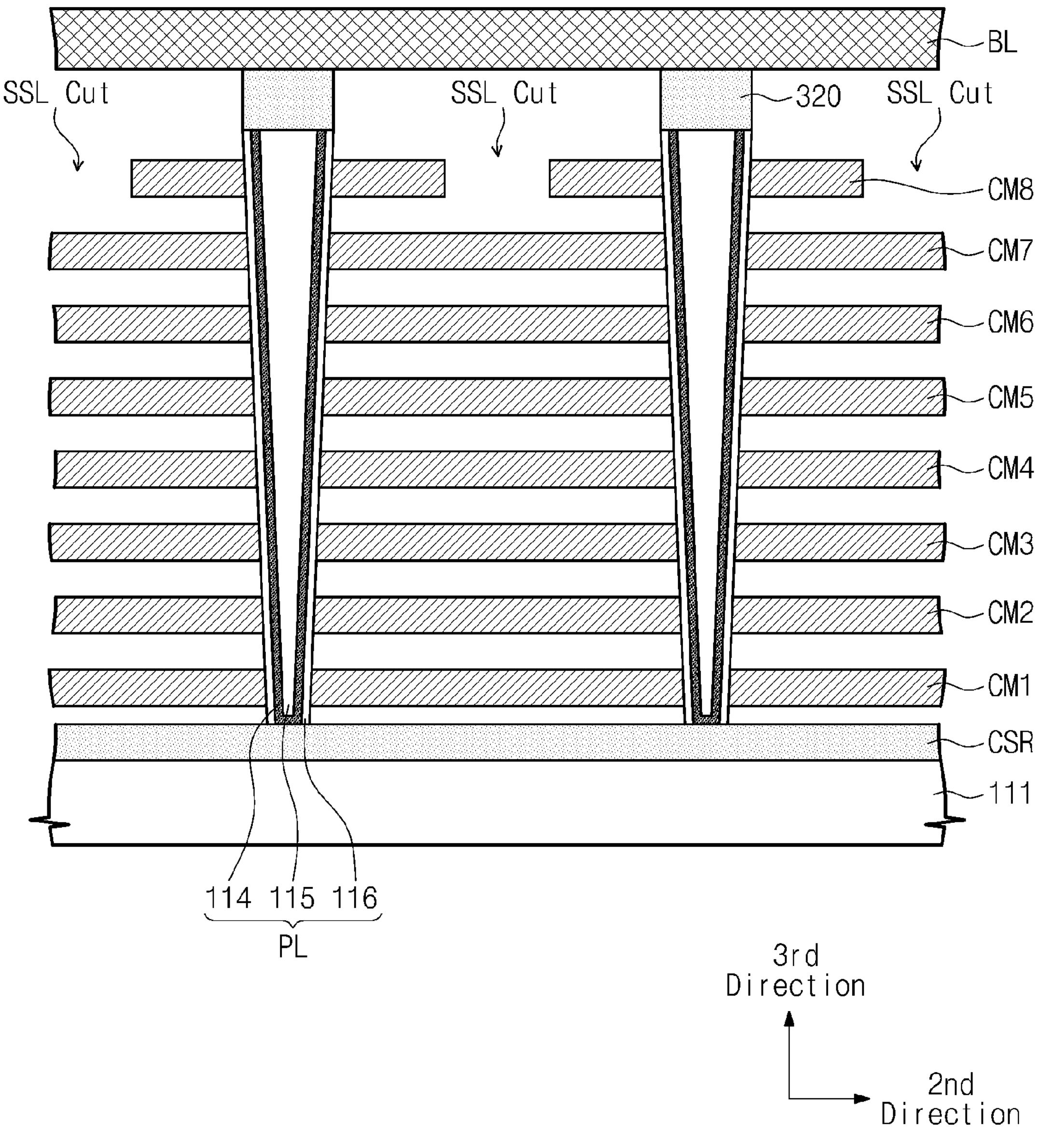
FIG. 52 is a cross-sectional view taken along the line XXXXVI-XXXXVI' in FIG. 50.

FIG. 50 is a plan view illustrating one of the memory blocks in FIG. 2 according to an exemplary embodiment of the inventive concept. FIG. 51 is a perspective view taken along a line XXXXVI-XXXXVI' in FIG. 50. FIG. 52 is a cross-sectional view taken along the line XXXXVI-XXXXVI' in FIG. 50.

Referring to FIGS. 50 to 52, a common source region CSR may be formed at a substrate 111. For example, the common source region CSR may be formed of one doping region. The common source region CSR may constitute a common source line CSL.

The first to eighth conductive materials CM1 to CM8 may be formed on the common source region CSR. The first to eighth conductive materials CM1 to CM8 may be stacked in a direction perpendicular to the substrate 111 and spaced apart from each other in a direction perpendicular to the substrate 111. Among the first to eighth conductive materials CM1 to CM8, conductive materials constituting string selection transistors SST may be separated by string selection line cuts SSL Cut. The string selection line cuts SSL Cut may extend along the first direction and spaced apart from each other along the second direction. The remaining conductive materials (not used for the string selection transistors) may be formed on the common source region CSR and may have a plate shape extending along the first and second directions.

For example, the first to seventh conductive lines CM1 to CM7 may have a plate shape, and the eighth conductive materials CM8 may be separated by the string selection line cuts SSL Cut. The eighth conductive materials CM8 may extend along the first direction and may be spaced apart from each other along the second direction.

A plurality of pillars PL may be provided to penetrate the first to eighth conductive materials CM1 to CM8 in a direction perpendicular to the substrate 111 and to contact the substrate 111. In one of the eighth conductive materials CM8, pillars PL may be provided in a line along the first direction. Each of the pillars PL may include an information storage film 116, a channel film 114, and an inner material 115.

The information storage films 116 may store information by trapping or discharging electric charges. The information storage films 116 may include a tunneling insulation film, a charge trap film, and a blocking insulation film. The channel films 114 may act as vertical bodies of the pillars PL. The channel films 114 may include an intrinsic semiconductor. The channel films 114 may include a semiconductor material having the same type (e.g., p-type) as the substrate 111. The inner materials 115 may include an insulation material or air gap.

According to an embodiment, as described with reference to FIGS. 37 and 38, pillars PL may be formed of lower pillars and upper pillars. As described with reference to FIGS. 42 to 44, pillars PL may be disposed in a zigzag shape along the first direction.

Figure 53:
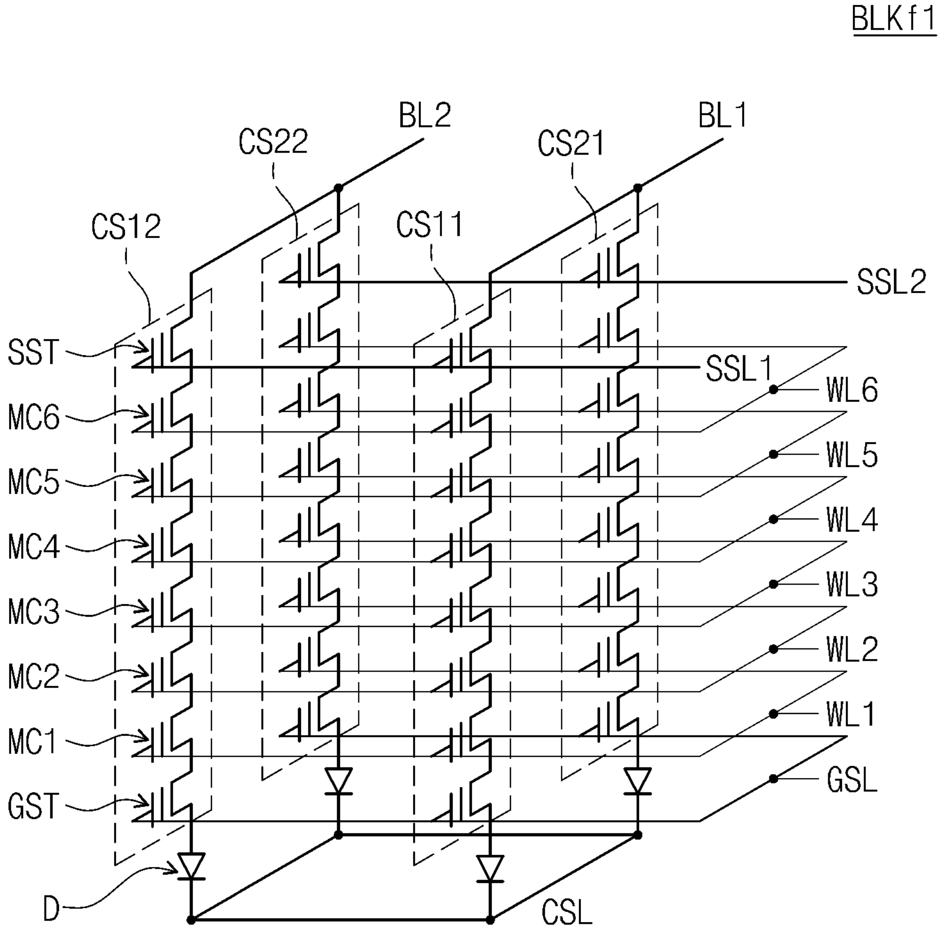
FIG. 53 is a circuit diagram illustrating an equivalent circuit of a part EC of FIG. 50 according to an exemplary embodiment of the inventive concept.

FIG. 53 is a circuit diagram illustrating an equivalent circuit of a part EC of FIG. 50 according to an exemplary embodiment of the inventive concept. Referring to FIGS. 50 to 53, a common source region CSR may be formed between pillars PL and a substrate 111.

Channels films 114 may include a p-type substance, and the common source region CSR may have an n-type substance. A portion corresponding to ground selection transistors GST among the channel films 114 may include a p-type substance, and the common source region CSR may include an n-type substance. For example, the channel film 114 and the common source region CSR may form a PN junction. Accordingly, diodes D may be formed between cell strings CS11, CS12, CS21, and CS22 formed of pillars PL and a common source line formed of the common source region CSR. An equivalent circuit BLKf1 in FIG. 53 may be identical to the equivalent circuit BLKa1 in FIG. 7 except that the diodes D are provided in the circuit BLKf1.

The equivalent circuit BLKf1 may be applicable to the equivalent circuits BLKa2 to BLKa7 according to embodiments of the inventive concept. String selection transistors SST may be programmed in accordance with the methods described with reference to FIGS. 9 to 11 and 21 to 23. Ground selection transistors GST may be programmed in accordance with the methods described with reference to FIGS. 12 to 14, 16 to 18, and 24 to 26.

Figure 54:
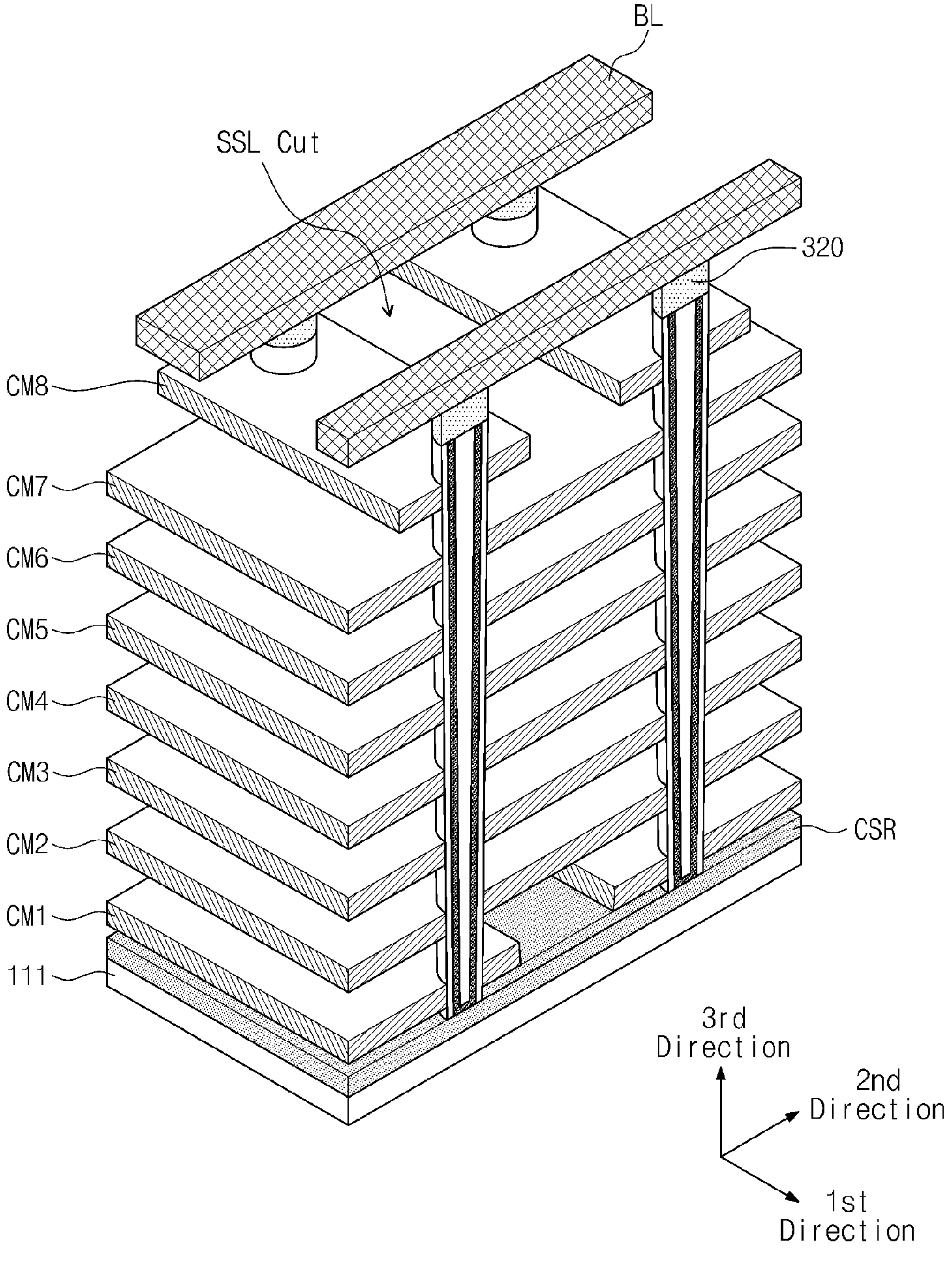
FIG. 54 is a perspective view taken along the line XXXXVI-XXXXVI' in FIG. 50.
Figure 55:
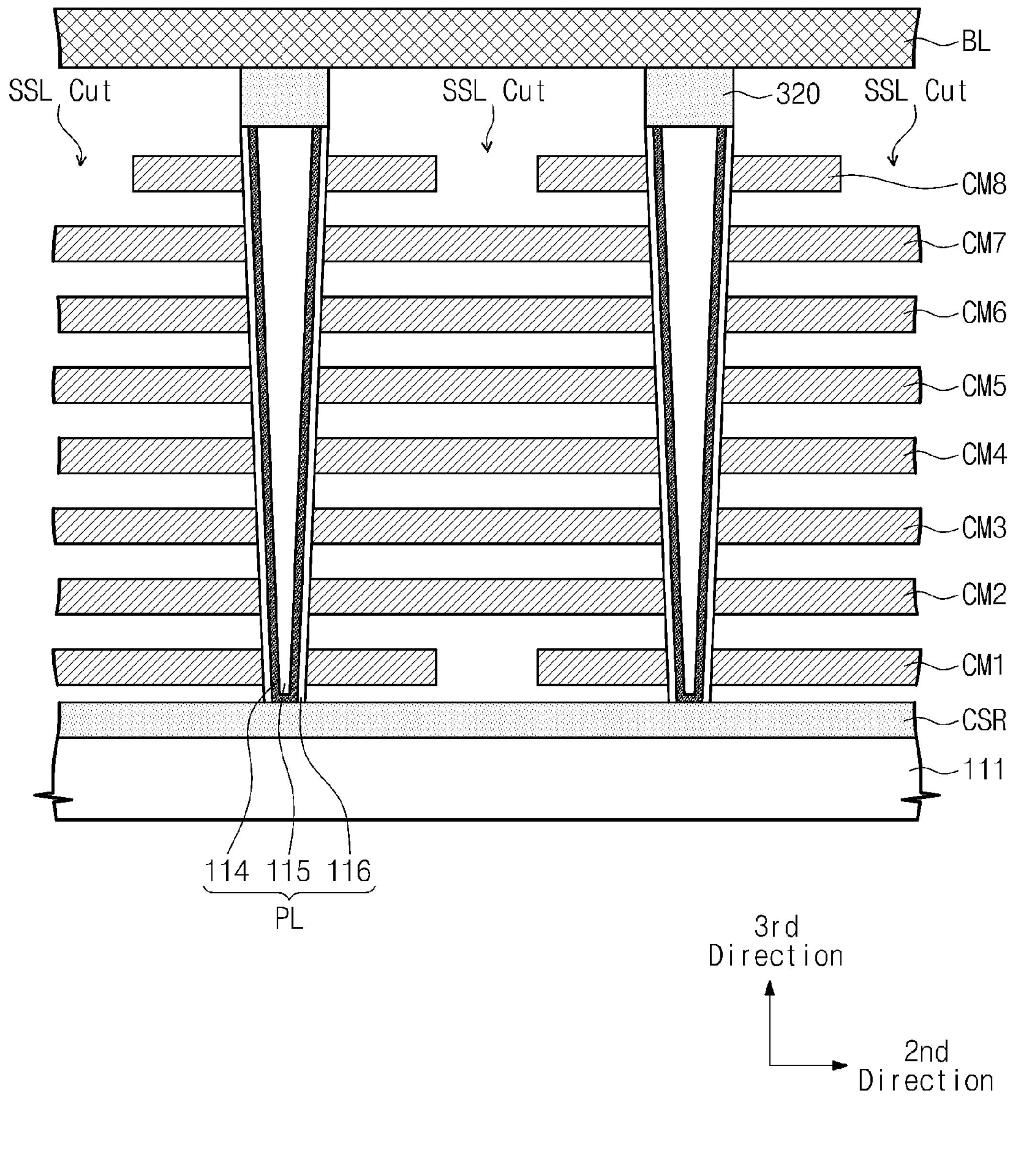
FIG. 55 is a cross-sectional view taken along the line XXXXVI-XXXXVI' in FIG. 50.

FIG. 54 is a perspective view taken along the line XXXXVI-XXXXVI' in FIG. 50. FIG. 55 is a cross-sectional view taken along the line XXXXVI-XXXXVI' in FIG. 50.

Referring to FIGS. 50, 54, and 55, among the first to eighth conductive materials CM1 to CM8, conductive materials constituting ground selection transistors GST may extend along the first direction and may be spaced apart from each other along the second direction. The conductive materials constituting ground selection transistors GST may have the same structure as conductive materials constituting string selection transistors SST. For example, the first conductive materials CM1 may have the same structure as the eighth conductive materials CM8.

Figure 56:
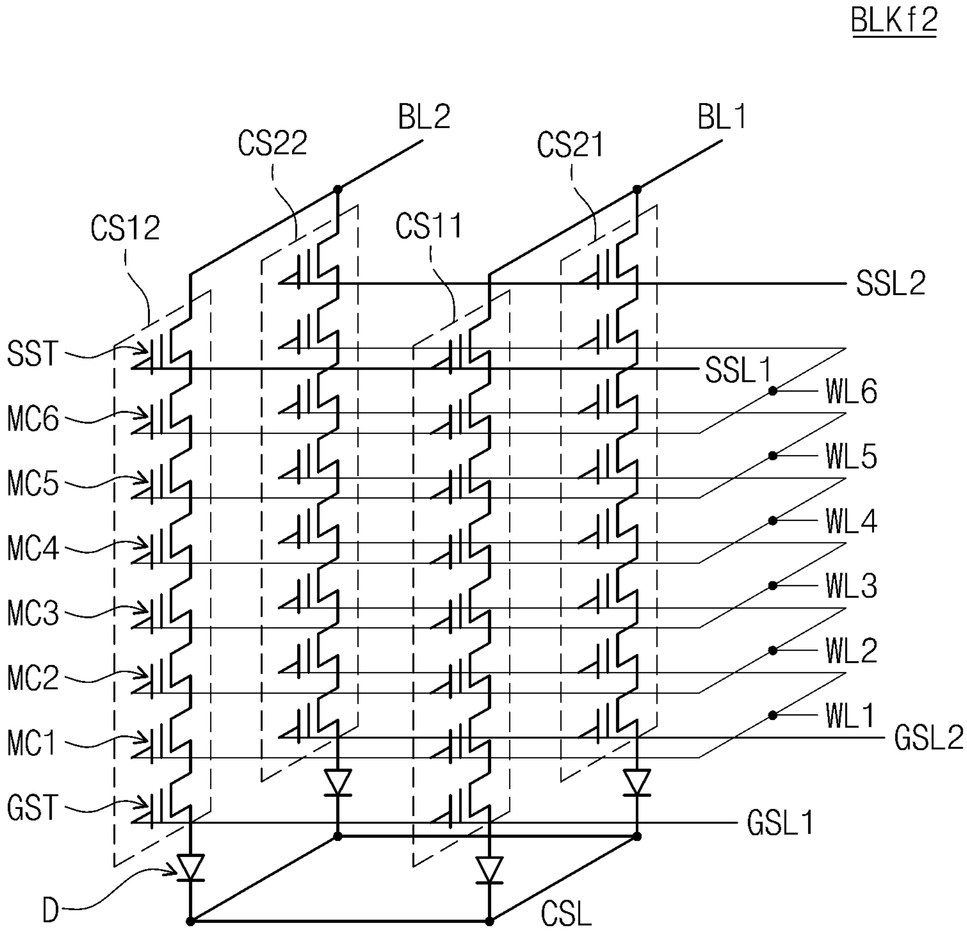
FIG. 56 is a circuit diagram illustrating an equivalent circuit of the part EC of FIG. 50 according to an exemplary embodiment of the inventive concept.

FIG. 56 is a circuit diagram illustrating an equivalent circuit of the part EC of FIG. 50 according to an exemplary embodiment of the inventive concept. Referring to FIGS. 50 and 54 to 56, diodes D may be formed between cell strings CS11, CS12, CS21, and CS22 and a common source line CSL. Ground selection transistors GST may be connected with a plurality of ground selection lines GSL1 and GSL2. For example, ground selection transistors of the cell strings CS11 and CS12 may be connected with a first ground selection line GSL1, and ground selection transistors of the cell strings CS21 and CS22 may be connected with a second ground selection line GSL2.

The equivalent circuit BLKf2 may be applicable to the equivalent circuits BLKa2 to BLKa7 according to embodiments of the inventive concept. String selection transistors SST may be programmed in accordance with the methods described with reference to FIGS. 9 to 11 and 21 to 23. Ground selection transistors GST may be programmed in accordance with the methods described with reference to FIGS. 12 to 14, 16 to 18, and 24 to 26.

Figure 57:
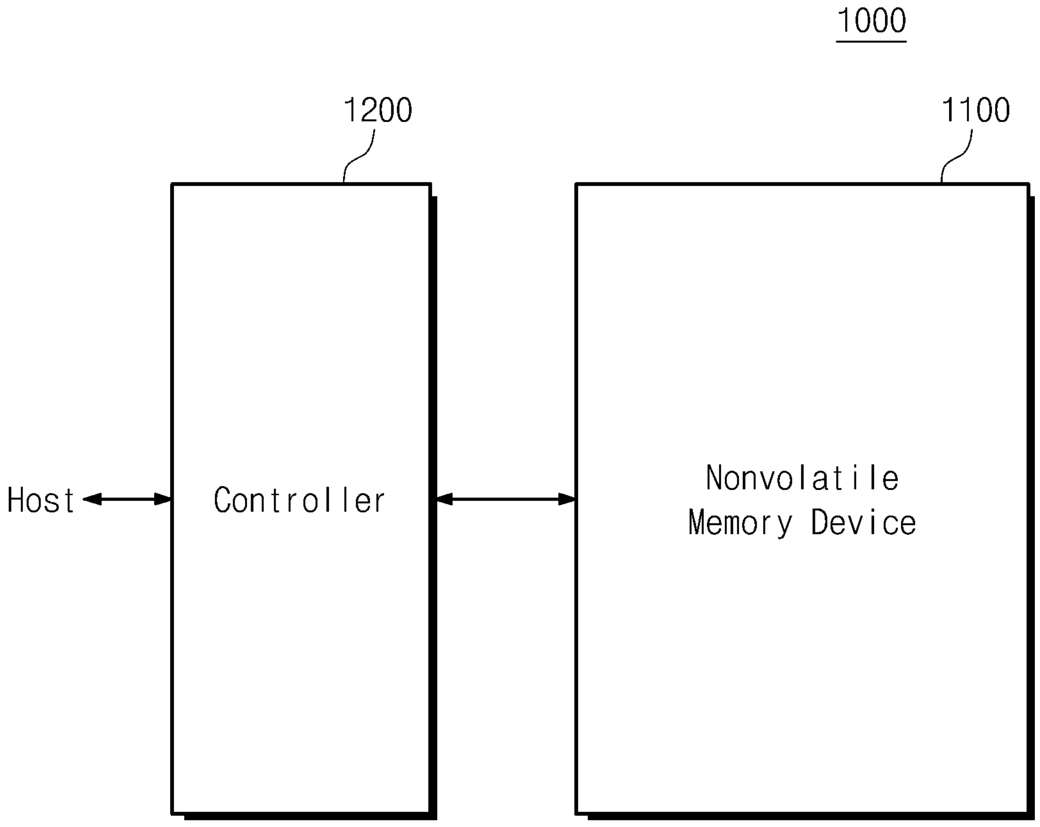
FIG. 57 is a block diagram illustrating a memory system according to an exemplary embodiment of the inventive concept.

FIG. 57 is a block diagram illustrating a memory system according to an exemplary embodiment of the inventive concept. Referring to FIG. 57, a memory system 1000 may include a nonvolatile memory device 1100 and a controller 1200.

The nonvolatile memory device 1100 may be substantially identical to a nonvolatile memory device 100 according to an embodiment of the inventive concept. For example, the nonvolatile memory device 1100 may include a plurality of cell strings CS11, CS12, CS21, and CS22 provided on a substrate 111, and each of the cell strings CS11, CS12, CS21, and CS22 may include a plurality of cell transistors CT stacked in a direction perpendicular to the substrate 111. String and ground selection transistors SST and GST may be programmed by the F-N tunneling or the Hot Carrier Injection.

The controller 1200 may be connected with a host and the nonvolatile memory device 1100. In response to a request from the host, the controller 1200 may be configured to access the nonvolatile memory device 1100. For example, the controller 1200 may be configured to control read, write, erase, pre-read, and background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 may be configured to provide the nonvolatile memory device 1100 with a control signal CTRL, a command CMD, and an address ADDR. In response to the control signal CTRL, the command CMD, and the address ADDR provided from the controller 1200, the nonvolatile memory device may perform read, write, pre-read, and erase operations.

According to an exemplary embodiment, the controller 1200 may further include a RAM, a processing unit, a host interface, or a memory interface. The RAM may be used as at least one of a working memory of the processing unit, a cache memory between the nonvolatile memory portion 1100 and the host, or a buffer memory between the nonvolatile memory portion 1100 and the host. The processing unit may control an overall operation of the controller 1200.

The host interface may include a protocol for executing data exchange between the host and the controller 1200. According to an embodiment, the controller 1200 may communicate with an external device (e.g., the host) via at least one of various protocols, such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol. The memory interface may interface with the nonvolatile memory device 1100. The memory interface may include a NAND interface or a NOR interface.

The memory system 1000 may further include an ECC (Error Correction Code) block. The ECC block may be configured to detect and correct an error of data read from the nonvolatile memory device 1100 using an ECC (Error Correction Code). The ECC block may be provided as an element of the controller 1200 or as an element of the nonvolatile memory device 1100.

The controller 1200 and the nonvolatile memory device 1100 may be integrated in a single semiconductor device. The controller 1200 and the nonvolatile memory device 1100 may be integrated in a single semiconductor device and may form a memory card. For example, the controller 1200 and the nonvolatile memory device 1100 may be integrated in a single semiconductor device and may form a memory card, such as a PC (PCMCIA) card, a CF card, an SM (or, SMC) card, a memory stick, a multimedia card (MMC, RS-MMC, MMC-micro), a security card (SD, miniSD, microSD, SDHC), or a universal flash storage (UFS) device.

The controller 1200 and the nonvolatile memory device 1100 may be integrated in a single semiconductor device and may form a solid state drive (SSD). The SSD may include a storage device configured to store data in a semiconductor memory. When the memory system 1000 is used as the SSD, it is possible to remarkably improve an operating speed of a host coupled with the memory system 1000.

According to an exemplary embodiment, the memory system 10 may be used as a computer, a portable computer, an ultra mobile PC (UMPC), a workstation, a net-book, a PDA, a web tablet, a wireless phone, a mobile phone, a smart phone, an e-book, a PMP (portable multimedia player), a digital camera, a digital audio recorder/player, a digital picture/video recorder/player, a portable game machine, a navigation system, a black box, a 3-dimensional television, a device capable of transmitting and receiving information in a wireless circumstance, one of various electronic devices constituting home network, one of various electronic devices constituting computer network, one of various electronic devices constituting telematics network, RFID, or one of various electronic devices constituting a computing system.

According to an exemplary embodiment, a nonvolatile memory device 1100 or a memory system 1000 may be packed in various types of packages, such as PoP (Package on Package), ball grid arrays (BGAs), chip scale packages (CSPs), plastic leaded chip carrier (PLCC), plastic dual in-line package (PDI2P), die in waffle pack, die in wafer form, chip on board (COB), ceramic dual in-line package (CERDIP), plastic metric quad flat pack (MQFP), thin quad flatpack (TQFP), small outline (SOIC), shrink small outline package (S SOP), thin small outline (TSOP), thin quad flatpack (TQFP), system in package (SIP), multi chip package (MCP), wafer-level fabricated package (WFP), or wafer-level processed stack package (WSP).

Figure 58:
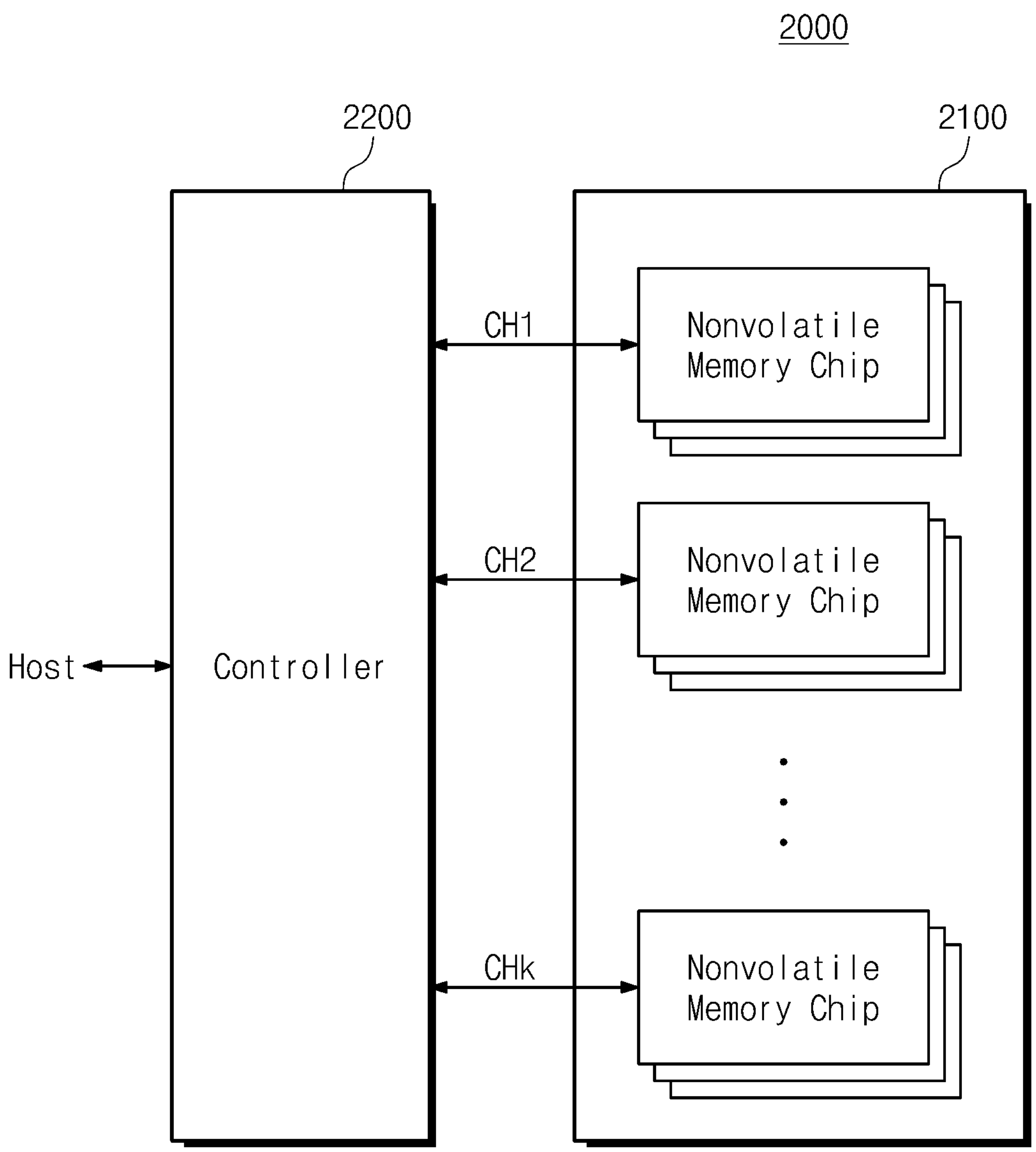
FIG. 58 is a block diagram illustrating an application of a memory system in FIG. 57.

FIG. 58 is a block diagram illustrating an application of the memory system in FIG. 57. Referring to FIG. 58, a memory system 2000 may include a nonvolatile memory device 2100 and a controller 2200. The nonvolatile memory device 2100 may include a plurality of nonvolatile memory chips, which are classified into a plurality of groups. Nonvolatile memory chips in each group may communicate with the controller 2200 via a common channel. For purposes of illustration, a plurality of memory chips communicates with the controller 2200 via a plurality of channels CH1 to CHk.

Each of the nonvolatile memory chips may be the same as or substantially identical to a nonvolatile memory device 100 according to an embodiment of the inventive concept. For example, each nonvolatile memory chip may include a plurality of cell strings CS11, CS12, CS21, and CS22 provided on a substrate 111, and each of the cell strings CS11, CS12, CS21, and CS22 may include a plurality of cell transistors CT stacked in a direction perpendicular to the substrate 111. String and ground selection transistors SST and GST may be programmed by the F-N tunneling or the Hot Carrier Injection.

As illustrated in FIG. 58, one channel may be connected with a plurality of nonvolatile memory chips. However, alternatively, the memory system 2000 may be modified such that one channel is connected with one nonvolatile memory chip.

Figure 59:
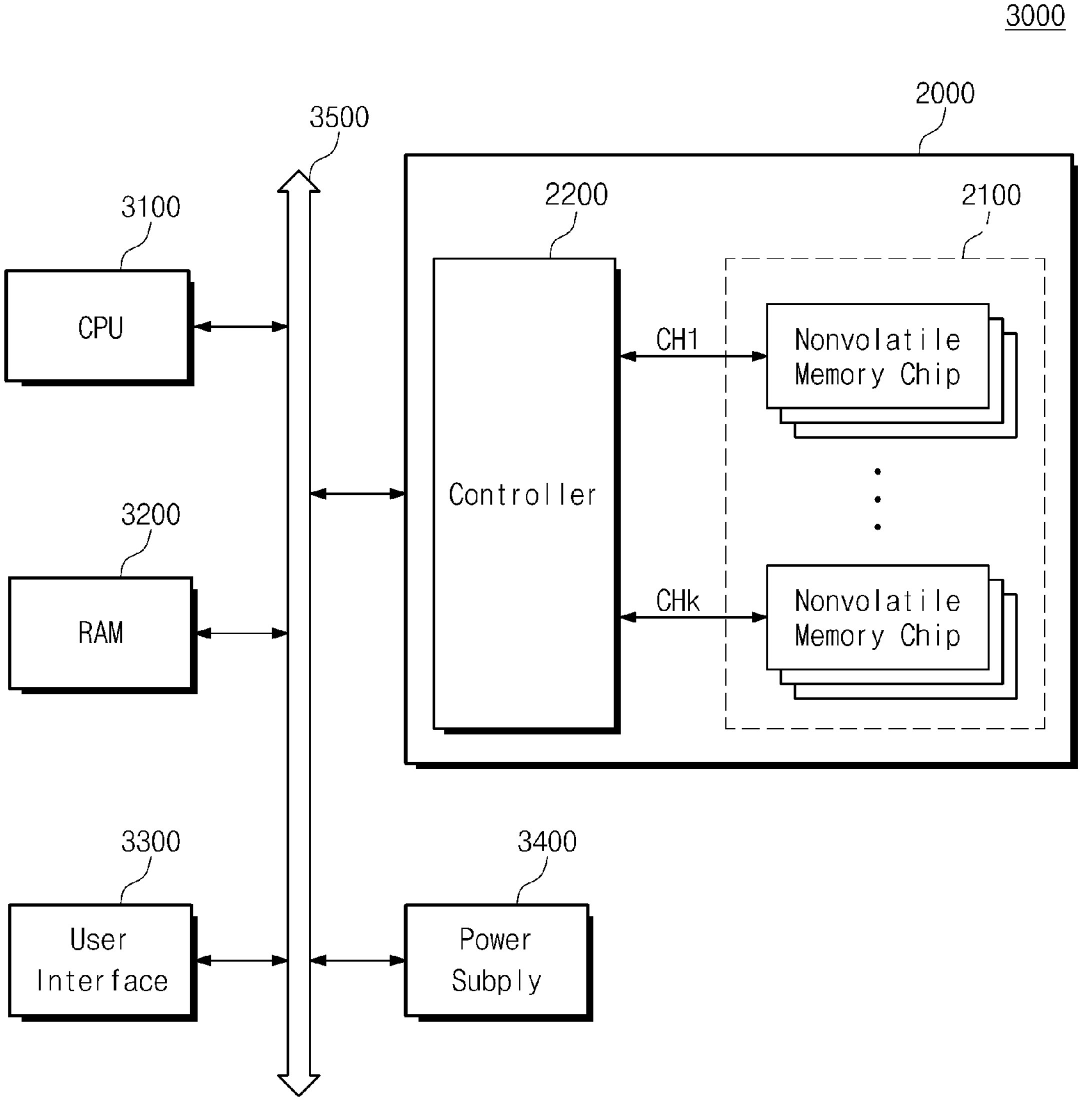
FIG. 59 is a block diagram illustrating a computing system including the memory system illustrated in FIG. 58.

FIG. 59 is a block diagram illustrating a computing system including the memory system described in FIG. 58. Referring to FIG. 59, a computing system 3000 may include a CPU 3100, a RAM 3200, a user interface 3300, a power supply 3400, and a memory system 2000.

The memory system 2000 may be electrically connected with the CPU 3100, the RAM 3200, the user interface 3300, and the power supply 3400. Data provided via the user interface 3300 or processed by the CPU 3100 may be stored in the memory system 2000.

As illustrated in FIG. 59, a nonvolatile memory device 2100 may be connected with a system bus 3500 via a controller 2200. However, the nonvolatile memory device 2100 can be connected directly with the system bus 3500.

The memory system 2000 in FIG. 59 may be the memory system described in FIG. 58. However, the memory system 2000 can be replaced with a memory system 1000 described with reference to FIG. 57. According to an exemplary embodiment, the computing system may be configured to include all of the memory systems 1000 and 2000 described with reference to FIGS. 57 and 58.

The above-disclosed embodiments are to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An operating method of a nonvolatile memory device which includes a plurality of cell strings, each cell string including a first selection transistor, a plurality of memory cells, and a second selection transistor stacked in a direction perpendicular to a substrate, the operating method comprising:

programming the first selection transistors of the plurality of cell strings; and programming the plurality of memory cells of the plurality of cell strings, wherein programming the first selection transistors comprises:

supplying a first voltage to a first bit line connected with a first selection transistor to be programmed and a second voltage to a second bit line connected to a different first selection transistor to be program inhibited;

turning on the second selection transistors of the plurality of cell strings; and supplying a first program voltage to a selected first selection line among a plurality of first selection lines connected with the first selection transistors and a third voltage to an unselected first selection line among the plurality of first selection lines.

2. The operating method of claim 1, wherein the first and third voltages each are a ground voltage and the first program voltage is a high voltage.

3. The operating method of claim 1, wherein the second voltage is a power supply voltage or a variable voltage lower than about 5V.

4. The operating method of claim 1, wherein the first program voltage is higher than the second voltage, and a difference between the first program voltage and the second voltage is below about 12V.

5. The operating method of claim 1, wherein at least one of the first selection transistors causes Fowler-Nordheim tunneling according to the first program voltage and the first voltage.

6. The operating method of claim 1, wherein programming the first selection transistors further comprises turning off the plurality of memory cells of the plurality of cell strings.

7. The operating method of claim 1, wherein programming the second selection transistors is performed before the programming the plurality of memory cells of the plurality of cell strings, and wherein programming the second selection transistors comprises:

supplying a fourth voltage to a first bit line connected with a second selection transistor to be programmed and a fifth voltage to a second bit line connected with a different second selection transistor to be program inhibited;

supplying a turn-on voltage to a selected first selection line among the plurality of first selection lines and a turn-off voltage to an unselected first selection line among the plurality of first selection lines;

turning on the plurality of memory cells of the plurality of cell strings; and supplying a second program voltage to a second selection line connected in common with the second selection transistors.

8. The operating method of claim 7, wherein the fourth voltage is a ground voltage, the fifth voltage is a power supply voltage, and the second program voltage is a high voltage.

9. The operating method of claim 7, wherein at least one of the second selection transistors causes Fowler-Nordheim tunneling according to the second program voltage and the fourth voltage.

10. The operating method of claim 1, wherein programming the second selection transistors is performed before programming the plurality of memory cells of the plurality of cell strings, and wherein programming the second selection transistors comprises:

supplying a sixth voltage to a first bit line connected with a second selection transistor to be programmed and a seventh voltage to a second bit line connected with a different second selection transistor to be program inhibited;

supplying a turn-on voltage to the plurality of first selection lines;

turning on the plurality of memory cells of the plurality of cell strings; and supplying a third program voltage to a selected second selection line among a plurality of second selection lines connected with the second selection transistors and an eighth voltage to an unselected second selection line among the second selection lines.

11. The operating method of claim 10, wherein the sixth and eighth voltages each are a ground voltage, the seventh voltage is a power supply voltage, and the third program voltage is a high voltage.

12. The operating method of claim 1, wherein programming the second selection transistors is performed before programming the plurality of memory cells of the plurality of cell strings, and wherein programming the second selection transistors comprises:

floating a first bit line connected with a second selection transistor to be programmed and a ninth voltage to a second bit line connected with a different second selection transistor to be program inhibited;

supplying a turn-on voltage to a selected first selection line among the plurality of first selection lines and a turn-off voltage to an unselected first selection line among the plurality of first selection lines;

supplying a turn-on voltage to a plurality of word lines connected with the plurality of memory cells of the plurality of cell strings;

supplying a tenth voltage to a common source line connected with the plurality of cell strings via the second selection transistors; and supplying a fourth program voltage to a selected second selection line among the second selection lines connected with the second selection transistors and an eleventh voltage to an unselected second selection line among the second selection lines.

13. The operating method of claim 12, wherein the ninth, tenth, and eleventh voltages each are a ground voltage, and the fourth program voltage is a high voltage.

14. The operating method of claim 12, wherein a second selection transistor, which corresponds to the selected second selection line and the selected bit line, is programmed by hot carrier injection.

15. The operating method of claim 12, wherein the fourth program voltage is supplied to the selected second selection line when voltages of the plurality of word lines and the plurality of bit lines reach respective target voltages.

16. A method of programming a nonvolatile memory device which includes a plurality of cell strings, each cell string including a first selection transistor, a plurality of memory cells, and a second selection transistor, the method comprising:

programming the first selection transistors of the plurality of cell strings;

programming the second selection transistors of the plurality of cell strings; and programming the plurality of memory cells of the plurality of cell strings, wherein the operating method is performed in an order of programming the first selection transistors, programming the second selection transistors, and programming the plurality of memory cells, wherein programming the first selection transistors comprises:

supplying a first voltage to a first bit line connected with a first selection transistor to be programmed and a second voltage to a second bit line connected to a different first selection transistor to be program inhibited;

supplying a turn-off voltage to the second selection transistors of the plurality of cell strings; and supplying a turn-on voltage to a plurality of word lines connected with the plurality of memory cells of the plurality of cell strings;

sequentially supplying a turn-off voltage and a program voltage to a selected first selection line among a plurality of first selection lines connected with the first selection transistors; and supplying a third voltage to an unselected first selection line among the plurality of first selection lines.

17. The method of claim 16, wherein the first voltage is a voltage that causes Fowler-Nordheim tunneling when in combination with the program voltage.

18. The method of claim 16, wherein the third voltage is a voltage that does not cause Fowler-Nordheim when in combination with the second voltage.

19. The method of claim 16, wherein programming the second selection transistors comprises:

supplying a fourth voltage to a first bit line connected with a second selection transistor to be programmed and a fifth voltage to a second bit line connected with a different second selection transistor to be program inhibited;

supplying a turn-on voltage to a selected first selection line among the plurality of first selection lines and a turn-off voltage to an unselected first selection line among the plurality of first selection lines;

turning on the plurality of memory cells of the plurality of cell strings; and supplying a second program voltage to a second selection line connected in common with the second selection transistors.

20. The method of claim 16, wherein programming the second selection transistors comprises:

supplying a sixth voltage to a first bit line connected with a second selection transistor to be programmed and a seventh voltage to a second bit line connected with a different second selection transistor to be program inhibited;

supplying a turn-on voltage to the plurality of first selection lines;

turning on the plurality of memory cells of the plurality of cell strings; and supplying a third program voltage to a selected second selection line among a plurality of second selection lines connected with the second selection transistors and an eighth voltage to an unselected second selection line among the second selection lines.

* * * * *